(12) United States Patent
Hori et al.

(10) Patent No.: US 6,603,163 B2
(45) Date of Patent: Aug. 5, 2003

(54) SEMICONDUCTOR DEVICE WITH CAPACITOR AND METHOD OF MANUFACTURING THEREOF

(75) Inventors: Katsunobu Hori, Hyogo (JP); Takeshi Matsunuma, Hyogo (JP); Kenichiro Shiozawa, Hyogo (JP); Moriaki Akazawa, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/858,455

(22) Filed: May 17, 2001

(65) Prior Publication Data

US 2002/0076894 A1 Jun. 20, 2002

(30) Foreign Application Priority Data

Dec. 15, 2000 (JP) ........................................ 2000-382285

(51) Int. Cl.⁷ ............................................. H01L 27/108
(52) U.S. Cl. .................... 257/296; 257/310; 257/528
(58) Field of Search ............................ 438/250, 393, 438/3, 239, 240; 257/296, 310, 306, 528

(56) References Cited

U.S. PATENT DOCUMENTS

| 5,926,359 | A |   | 7/1999 | Greco et al. |         |
|-----------|---|---|--------|--------------|---------|
| 6,200,846 | B1| * | 3/2001 | Watanabe     | 438/239 |
| 6,204,105 | B1| * | 3/2001 | Jung         | 438/238 |
| 6,242,315 | B1| * | 6/2001 | Lin et al.   | 438/253 |
| 6,291,307 | B1| * | 9/2001 | Chu et al.   | 438/393 |

FOREIGN PATENT DOCUMENTS

| JP | 11-163265   | 6/1999  |
| JP | 11-317500   | 11/1999 |
| JP | 2000-133708 | 5/2000  |
| TW | 396605      | 7/2000  |

OTHER PUBLICATIONS

"Low Temperature (<500°C) $SrTiO_3$ Capacitor Process Technology for Embedded DRAM", J. Nakahira et al., 2000 Symposium on VLSI Technology Digest of Technical Papers, Jun. 13–15, pp. 104–105.

"A Scalable Single–transistor / single–capacitor Memory Cell Structure Characterized by an Angled–capacitor Layout for Megabit FeRAMs", T. Kachi et al., 1998 Symposium on VLSI Technology Digest of Technical Papers, p. 126.

* cited by examiner

*Primary Examiner*—Tuan H. Nguyen
(74) *Attorney, Agent, or Firm*—McDermott, Will & Emery

(57) ABSTRACT

A semiconductor device having a capacitor and a method of manufacturing thereof are provided, securing a certain capacitance while allowing the size to be reduced. The semiconductor device includes a capacitor lower electrode having an upper surface and including a metal film, a dielectric film deposited on the upper surface of the capacitor lower electrode and having its thickness smaller than that of the capacitor lower electrode, and a capacitor upper electrode deposited on the dielectric film, having its width smaller than that of the capacitor lower electrode and including a metal film.

4 Claims, 43 Drawing Sheets

SEMICONDUCTOR DEVICE WITH CAPACITOR AND METHOD OF MANUFACTURING THEREOF

BACKGROUND OF THE INVENTION

1. Field of the Invention

The present invention relates to semiconductor devices and methods of manufacturing thereof. In particular, the invention relates to a semiconductor device having a capacitor and a method of manufacturing the semiconductor device.

2. Description of the Background Art

An analog or analog•digital LSI (Large Scale Integration) such as analog/digital converter (A/D converter) and digital/analog converter (D/A converter) conventionally contains a capacitor (capacitive element) as a component of a filter circuit or an integrating circuit. FIG. 89 is a schematic cross section of a semiconductor device, conventional analog•digital LSI and the like for example, showing a capacitor portion where a capacitor is formed and an interconnection portion where an interconnection is formed. FIG. 90 is a schematic cross section along line XC—XC in FIG. 89. A conventional semiconductor device is described below in conjunction with FIGS. 89 and 90.

Referring to FIGS. 89 and 90, an insulating film 102 is formed on a semiconductor substrate 101. A capacitor portion 120 includes one electrode 103a formed of a metal film that is deposited on insulating film 102. The other electrode 103b is formed to surround one electrode 103a with a space therebetween. An interlayer insulating film 108 is formed on one electrode 103a and the other electrode 103b. An interlayer insulating film part 108a is provided as a capacitor dielectric film between one electrode 103a and the other electrode 103b. The one electrode 103a, interlayer insulating film part 108a and the other electrode 103b constitute a capacitor.

A contact hole 110a formed in interlayer insulating film 108 is located in a region on one electrode 103a. A tungsten plug 111a fills the inside of contact hole 110a. An upper-level interconnection 112a is formed on tungsten plug 111a. Upper-level interconnection 112a is electrically connected to one electrode 103a via tungsten plug 111a.

An interconnection portion 121 includes a first-level interconnection 103c formed on insulating film 102. The first-level interconnection 103c is constituted of a layer of the same level as that of one electrode 103a and the other electrode 103b. Interlayer insulating film 108 is deposited on the first-level interconnection 103c. A contact hole 110b is formed in interlayer insulating film 108 in a region on the first-level interconnection 103c. A tungsten plug 111b fills the inside of contact hole 110b. An upper-level interconnection 112b is formed on tungsten plug 111b. The upper-level interconnection 112b is electrically connected to the first-level interconnection 103c via tungsten plug 111b.

The conventional semiconductor device as described above has a problem as discussed below. There is an increasing demand for scaling down and enhanced integration of semiconductor devices. The capacitor as shown in FIGS. 89 and 90 must secure a certain capacitance. In order to reduce the area occupied by the capacitor shown in FIGS. 89 and 90 while maintain a required capacitance, the thickness in the direction of height of one electrode 103a and the other electrode 103b can be increased to extend the surface area of sidewalls of one electrode 103a and the other electrode 103b serving as electrodes, or the distance between one electrode 103a and the other electrode 103b can be reduced.

However, when the thickness in the height direction of the one and the other electrodes 103a and 103b is increased, etching for fabricating the one and the other electrodes 103a and 103b is difficult. Therefore, this is not a realistic approach. On the other hand, when the distance between the one electrode 103a and the other electrode 103b is decreased, it would be difficult to reduce the distance smaller than the minimum process dimension of photolithography employed in a manufacturing process of the semiconductor device. Reduction of the area occupied by the capacitor is accordingly restricted.

It has been difficult for the conventional semiconductor device to secure a certain capacitance while reduce the area occupied by the capacitor as explained above.

SUMMARY OF THE INVENTION

One object of the present invention is to provide a semiconductor device having a capacitor enabling a certain capacitance to be secured and simultaneously allowing the size to be reduced, and to provide a method of manufacturing such a semiconductor device.

According to one aspect of the invention, a semiconductor device includes a capacitor lower electrode having an upper surface and including a metal film, a dielectric film deposited on the capacitor lower electrode and having its thickness smaller than that of the capacitor lower electrode, and a capacitor upper electrode deposited on the dielectric film, having its width smaller than that of the capacitor lower electrode and including a metal film.

The capacitor lower electrode, the dielectric film and the capacitor upper electrode are stacked in the vertical direction and accordingly a capacitor can be produced in the vertical direction. It is possible to control the thickness of the dielectric film such that the thickness is significantly smaller than the minimum process dimension of photolithography employed in fabrication of the semiconductor device. Then, with a certain capacitance secured, the thickness of the dielectric film can be made smaller than the conventional one to decrease the surface area of the capacitor upper and lower electrodes. As a result, the capacitor can be reduced in size compared with the conventional capacitor.

The width of the capacitor upper electrode is defined smaller than that of the capacitor lower electrode. It is then possible to obtain an increased alignment margin for photolithography by which the capacitor upper electrode is formed. Occurrence of defect can be avoided, such as short-circuit between the sidewall for example of the capacitor lower electrode and the capacitor upper electrode due to misalignment of the capacitor upper and lower electrodes.

As the capacitor upper and lower electrodes include metal films, a capacitor (capacitive element) can be implemented having a higher precision and less voltage-dependency, compared with a semiconductor device employing semiconductor like polysilicon as a capacitor electrode. A capacitor necessary for a high-precision filter circuit or the like can readily be achieved in this way.

For the semiconductor device according to the one aspect, the capacitor upper electrode may have a sidewall, and the semiconductor device may include a sidewall insulating film formed on the upper surface of the capacitor lower electrode and on the sidewall of the capacitor upper electrode.

The sidewall insulating film provided between the sidewall of the capacitor upper electrode and the upper surface of the capacitor lower electrode can surely prevent short-circuit between the capacitor upper electrode and the capacitor lower electrode.

Further, as discussed later regarding a manufacturing process, the capacitor upper electrode and the sidewall insulating film can be utilized as a mask in etching for fabricating the capacitor lower electrode. Accordingly, the capacitor lower electrode located under the capacitor upper electrode and having its width greater than that of the capacitor upper electrode can surely be formed.

For the semiconductor device according to the one aspect, the sidewall insulating film preferably includes a silicon oxynitride film.

The silicon oxynitride film functions as an ARC (Anti Reflection Coat). A separate ARC is thus made unnecessary by forming the silicon oxynitride film constituting the sidewall insulating film from a region on the capacitor upper electrode to another region and forming on this silicon oxynitride film a photoresist film employed in etching for forming an interconnection or the like on that another region. The manufacturing process can thus be simplified.

For the semiconductor device according to the one aspect, the capacitor lower electrode may include aluminum and the capacitor upper electrode may include tungsten.

When the capacitor lower electrode and the capacitor upper electrode are formed of respective materials different from each other, the capacitor upper electrode can surely be used as a mask in etching for producing the capacitor lower electrode. Misalignment between the capacitor upper and lower electrodes can thus be prevented.

The semiconductor device according to the one aspect may further include a lower interconnection portion constituted of a layer at the same level as that of the capacitor lower electrode, another dielectric film deposited on the lower interconnection portion, an upper interconnection portion deposited on that another dielectric film, having its width smaller than that of the lower interconnection portion and constituted of a layer at the same level as that of the capacitor upper electrode, and an interlayer insulating film formed on the upper interconnection portion. In the interlayer insulating film, a connection hole may be formed that exposes a surface of the upper interconnection portion and reaches the upper surface of the lower interconnection portion. The semiconductor device according to the one aspect may further include a conductive film provided inside the connection hole to electrically connect the upper and lower interconnection portions.

In the process of fabricating the capacitor formed of the capacitor lower electrode, the dielectric film and the capacitor upper electrode, an interconnection can simultaneously be fabricated that is formed of the upper and lower interconnection portions. The upper and lower interconnection portions can serve as one interconnection if the conductive film is used to electrically connect these interconnection portions.

According to another aspect of the invention, a semiconductor device includes a capacitor lower electrode having an upper surface and a sidewall surface and including a metal film, a dielectric film deposited on the capacitor lower electrode to extend from the upper surface to the sidewall surface and having its thickness smaller than that of the capacitor lower electrode, and a capacitor upper electrode deposited on the dielectric film and including a metal film.

The capacitor lower electrode, the dielectric film and the capacitor upper electrode are stacked in the vertical direction and accordingly a capacitor can be produced in the vertical direction. It is possible to control the thickness of the dielectric film such that the thickness is significantly smaller than the minimum process dimension of photolithography employed in fabrication of the semiconductor device. Then, even if the thickness of the dielectric film is made smaller than a conventional one in order to reduce the surface area of the capacitor upper and lower electrodes, a certain capacitance can be secured. The capacitor can thus be reduced in size compared with the conventional capacitor.

The dielectric film is deposited on the capacitor lower electrode to extend from the upper surface to the sidewall surface of the lower electrode. Therefore, even if the position of the capacitor upper electrode shifts and accordingly the capacitor upper electrode extends onto the sidewall surface of the capacitor lower electrode, the dielectric film is present between the capacitor upper and lower electrodes. Prevention is surely possible of short-circuit between the capacitor upper and lower electrodes in this way.

As the capacitor upper and lower electrodes include metal films, a capacitor (capacitive element) can be implemented having a higher precision and less voltage-dependency, compared with a semiconductor device employing semiconductor like polysilicon as a capacitor electrode. A capacitor necessary for a high-precision filter circuit or the like can readily be achieved in this way.

For the semiconductor device according to that another aspect, the capacitor upper electrode may have its width smaller than that of the capacitor lower electrode.

It is then possible to obtain an increased alignment margin for photolithography by which the capacitor upper electrode is formed. Occurrence of defect can be avoided, such as short-circuit between the sidewall for example of the capacitor lower electrode and the capacitor upper electrode due to misalignment of the capacitor upper and lower electrodes.

For the semiconductor device according to that another aspect, the capacitor upper electrode may have its width greater than that of the capacitor lower electrode.

In this case, the capacitor upper electrode is located on the sidewall of the capacitor lower electrode with the dielectric film therebetween. Consequently, the sidewall of the capacitor lower electrode can be utilized as a capacitor electrode, which can increase the capacitance of the capacitor.

According to still another aspect of the invention, a semiconductor device includes an interlayer insulating film having a trench, a capacitor lower electrode filling the inside of the trench and including a metal film, a dielectric film deposited on the capacitor lower electrode and having its thickness smaller than that of the interlayer insulating film, and a capacitor upper electrode deposited on the dielectric film and including a metal film.

The capacitor lower electrode, the dielectric film and the capacitor upper electrode are stacked in the vertical direction and accordingly a capacitor can be produced in the vertical direction. It is possible to control the thickness of the dielectric film such that the thickness is significantly smaller than the minimum process dimension of photolithography employed in fabrication of the semiconductor device. Then, with a certain capacitance secured, the thickness of the dielectric film can be made smaller than the conventional one to decrease the surface area of the capacitor upper and lower electrodes. As a result, the capacitor can be reduced in size compared with the conventional capacitor.

The capacitor lower electrode has a so-called damascene structure that fills the inside of the trench of the interlayer insulating film. When a semiconductor device employs a damascene interconnection as one interconnection, this interconnection can partially be used as a capacitor lower electrode. Then, a capacitor of vertical type can readily be implemented in the semiconductor device having such a damascene interconnection.

As the capacitor upper and lower electrodes include metal films, a capacitor (capacitive element) can be implemented having a higher precision and less voltage-dependency, compared with a semiconductor device employing semiconductor like polysilicon as a capacitor electrode. A capacitor necessary for a high-precision filter circuit or the like can readily be achieved in this way.

According to a further aspect of the invention, a semiconductor device includes one capacitor electrode including a first extension and a second extension horizontally spaced apart from the first extension, and the other capacitor electrode including a third extension located between the first extension and the second extension, opposed to the first extension with a dielectric film therebetween and opposed to the second extension with a dielectric film therebetween and including a fourth extension opposed to the second extension with a dielectric film therebetween that is different from the dielectric film between the second and third extensions, the third and fourth extensions located on different sides of the second extension.

When the first and second extensions and the third and fourth extensions are alternately arranged in this way, the one and the other capacitor electrodes accordingly have the first to fourth extensions with their sidewall surfaces opposing each other that can be utilized as an electrode surface of the capacitor. Specifically, almost all the sidewall surfaces of the second and third extensions can be used as a capacitor electrode surface. In the case of the conventional capacitor shown in FIGS. 89 and 90, the other electrode is arranged to surround the one electrode so that the outer sidewall surface that is not opposite to the one electrode does not function as a capacitor electrode surface. On the other hand, the capacitor of the present invention has the first extension of the one electrode formed so as to enable the outer sidewall surface of the other electrode (the sidewall surface of the third extension opposing the first extension) to be utilized as a capacitor electrode. The volume of a region occupied by the capacitor is then smaller than occupied by a plurality of such conventional capacitors one of which as shown in FIGS. 89 and 90 provided for securing a certain capacitance. Further, the capacitance of the capacitor can readily be changed since the area of the capacitor electrode surface can easily be varied.

According to a still further aspect of the invention, a semiconductor device includes an interlayer insulating film having a plurality of holes, a plurality of capacitor lower electrodes provided inside the holes of the interlayer insulating film and including a metal film, a dielectric film deposited on the capacitor lower electrodes, and a capacitor upper electrode deposited on the dielectric film and including a metal film.

The capacitor lower electrode, the dielectric film and the capacitor upper electrode are stacked in the vertical direction and accordingly a capacitor can be produced in the vertical direction. It is possible to control the thickness of the dielectric film such that the thickness is significantly smaller than the minimum process dimension of photolithography employed in fabrication of the semiconductor device. Then, with a certain capacitance secured, the thickness of the dielectric film can be made smaller than the conventional one to decrease the surface area of the capacitor upper and lower electrodes. As a result, the capacitor can be reduced in size compared with the conventional capacitor.

The number as well as the cross sectional area of the holes formed in the interlayer insulating film can be changed to facilitate change of the area of the region of the capacitor lower electrodes that is opposite to the dielectric film. As a result, the capacitance of the capacitor can easily be changed.

As the capacitor upper and lower electrodes include metal films, a capacitor (capacitive element) can be implemented having a higher precision and less voltage-dependency, compared with a semiconductor device employing semiconductor like polysilicon as a capacitor electrode. A capacitor necessary for a high-precision filter circuit or the like can readily be achieved in this way.

According to a still further aspect of the invention, a semiconductor device includes a capacitor lower electrode including a metal film, a dielectric film deposited on the capacitor lower electrode and having its thickness smaller than that of the capacitor lower electrode, an interlayer insulating film deposited on the dielectric film and having an opening that exposes the dielectric film, and a capacitor upper electrode provided inside the opening and including a metal film.

The capacitor lower electrode, the dielectric film and the capacitor upper electrode are stacked in the vertical direction and accordingly a capacitor can be produced in the vertical direction. It is possible to control the thickness of the dielectric film such that the thickness is significantly smaller than the minimum process dimension of photolithography employed in fabrication of the semiconductor device. Then, with a certain capacitance secured, the thickness of the dielectric film can be made smaller than the conventional one to decrease the surface area of the capacitor upper and lower electrodes. As a result, the capacitor can be reduced in size compared with the conventional capacitor.

Further, as the capacitor upper electrode is placed inside the opening, the conventionally required process of forming a contact hole for connecting the capacitor upper electrode and an upper-level interconnection after formation of the capacitor upper electrode is unnecessary. The manufacturing process of a semiconductor device can thus be simplified.

As the capacitor upper and lower electrodes include metal films, a capacitor (capacitive element) can be implemented having a higher precision and less voltage-dependency, compared with a semiconductor device employing semiconductor like polysilicon as a capacitor electrode. A capacitor necessary for a high-precision filter circuit or the like can readily be achieved in this way.

For the semiconductor device according to the one aspect, another aspect, still another aspect, further aspect or still further aspects of the invention, the capacitor formed of the capacitor upper electrode, the dielectric film and the capacitor lower electrode is preferably employed in an application specific integrated circuit.

The application specific integrated circuit (ASIC) requires a capacitor to be implemented that has a high precision and no voltage-dependency and can easily be reduced in size. The present invention would be remarkably advantageous, if applied to the ASIC, in enhancement of the performance and scaling down of the ASIC.

According to a still further aspect of the invention, a method of manufacturing a semiconductor device includes the steps of forming a capacitor lower electrode having an upper surface, forming a dielectric film on the upper surface of the capacitor lower electrode, the dielectric film having its thickness smaller than that of the capacitor lower electrode, forming a metal film on the dielectric film, forming a resist film on the metal film, the resist film having its width smaller than that of the capacitor lower electrode, and forming a capacitor upper electrode by partially removing the metal film by means of etching using the resist film as a mask, the capacitor upper electrode having its width smaller than that of the capacitor lower electrode.

In this way, a capacitor in the vertical direction can readily be produced that is constituted of the capacitor lower electrode, the dielectric film and the capacitor upper electrode stacked in the vertical direction.

The resist film used for forming the capacitor upper electrode has its width defined smaller than that of the capacitor lower electrode. Then, an increased alignment margin between the resist film and the capacitor lower electrode can be obtained in a photolithography process for forming the resist film. Accordingly, it is possible to prevent occurrence of defect, such as short-circuit between the sidewall surface for example and the capacitor upper electrode due to misalignment of the capacitor upper and lower electrodes.

According to a still further aspect of the invention, a method of manufacturing a semiconductor device includes the steps of forming a capacitor lower electrode having an upper surface and a sidewall surface, forming a dielectric film deposited on the capacitor lower electrode and extending from the upper surface to the sidewall surface, the dielectric film having its thickness smaller than that of the capacitor lower electrode, forming a metal film on the dielectric film, forming a resist film on the metal film, and forming a capacitor upper electrode by partially removing the metal film by means of etching using the resist film as a mask.

In this way, a capacitor in the vertical direction can readily be produced that is constituted of the capacitor lower electrode, the dielectric film and the capacitor upper electrode stacked in the vertical direction.

The dielectric film extends from the upper surface to the sidewall surface of the capacitor lower electrode. Therefore, when the position of the resist film for forming the capacitor upper electrode shifts and accordingly the capacitor upper electrode extends onto the sidewall surface of the capacitor lower electrode, the dielectric film is present between the capacitor upper electrode and the sidewall of the capacitor lower electrode. It is thus possible to surely prevent short-circuit between the upper and lower electrodes.

Regarding the method of manufacturing a semiconductor device according to the still further aspect of the invention, the step of forming a resist film may include the step of forming a resist film having its width smaller than that of the capacitor lower electrode.

An increased alignment margin is thus secured between the resist film and the capacitor lower electrode in a photolithography process for forming the resist film.

Regarding the method of manufacturing a semiconductor device according to the still further aspect of the invention, the step of forming a resist film may include the step of forming a resist film having its width greater than that of the capacitor lower electrode.

Accordingly, the capacitor upper electrode deposited on the capacitor lower electrode extends from the upper surface to the sidewall surface of the capacitor lower electrode with the dielectric film therebetween. The sidewall surface of the capacitor lower electrode can thus be utilized as a capacitor electrode. An increased capacitance of the capacitor can be achieved in this way.

According to a still further aspect of the invention, a method of manufacturing a semiconductor device includes the steps of forming a lower metal film constituting a capacitor lower electrode, forming a dielectric film on the lower metal film, forming a capacitor upper electrode deposited on the dielectric film and including a metal film, and forming the capacitor lower electrode by partially removing the lower metal film through etching using the capacitor upper electrode as a mask.

In this way, a capacitor in the vertical direction can readily be produced that is constituted of the capacitor lower electrode, the dielectric film and the capacitor upper electrode stacked in the vertical direction.

As the capacitor lower electrode is formed by using the capacitor upper electrode as a mask, misalignment of the capacitor upper and lower electrodes can surely be avoided.

Regarding the method of manufacturing a semiconductor device according to the still further aspect of the invention, in the step of forming the dielectric film, the dielectric film may be formed to extend to a region where an interconnection is formed by using the lower metal film. Further, the method of manufacturing a semiconductor device according to the still further aspect of the invention may further include the step, preceding the step of forming the capacitor lower electrode, of forming a resist film on the dielectric film on the region where an interconnection is formed by using the lower metal film, and forming the interconnection by partially removing the lower metal film by using the resist film as a mask.

In this case, when a material functioning as an ARC (anti reflection coat) is employed as the dielectric film, the step of separately forming an ARC for the resist film formed on the dielectric film is unnecessary. A simpler manufacturing process of the semiconductor device can thus be accomplished.

Regarding the method of manufacturing a semiconductor device according to the still further aspect of the invention, preferably the dielectric film includes a silicon oxynitride film.

The silicon oxynitride film functions as an ARC. Then, the silicon oxynitride film can be used as the capacitor dielectric film to allow the capacitor dielectric film to function as an ARC in an easy manner.

The method of manufacturing a semiconductor device according to the still further aspect of the invention may further include the step, preceding the step of forming the capacitor lower electrode, forming a sidewall film on a sidewall surface of the capacitor upper electrode, and, in the step of forming the capacitor lower electrode, the capacitor upper electrode and the sidewall film may be used as a mask.

The capacitor upper electrode and the sidewall film are utilized as a mask in etching for fabricating the capacitor lower electrode. Then, the capacitor lower electrode located under the capacitor upper electrode and having its width greater than the capacitor upper electrode can surely be produced.

The method of manufacturing a semiconductor device according to the still further aspect of the invention may further include the step, preceding the step of forming the capacitor lower electrode, forming an upper interconnection portion deposited on the dielectric film, having a sidewall surface and constituting an interconnection layer, and may further include the steps of forming an interconnection sidewall film on the sidewall surface of the upper interconnection portion, forming a lower interconnection portion by partially removing the lower metal film through etching using the interconnection sidewall film and the upper interconnection portion as a mask, forming an interlayer insulating film on the upper interconnection portion, forming a connection hole in the interlayer insulating film, the connection hole exposing a surface of the upper interconnection portion and reaching an upper surface of the lower interconnection portion, and forming a conductive film in the connection hole that is electrically connected to the upper and lower interconnection portions.

In the step of fabricating a capacitor formed of the capacitor lower electrode, the dielectric film and the capacitor upper electrode, an interconnection constituted of the upper and lower interconnection portions can simultaneously be produced.

According to a still further aspect of the invention, a method of manufacturing a semiconductor device includes the steps of preparing an interlayer insulating film, forming a trench in the interlayer insulating film, forming a capacitor lower electrode filling the trench and including a metal film, forming a dielectric film deposited on the capacitor lower electrode and having its thickness smaller than that of the interlayer insulating film, and forming a capacitor upper electrode deposited on the dielectric film and including a metal film.

In this way, a capacitor in the vertical direction can be produced that is constituted of the capacitor lower electrode, the dielectric film and the capacitor upper electrode stacked in the vertical direction.

The capacitor lower electrode has a so-called damascene structure that fills the inside of the trench of the interlayer insulating film. When a semiconductor device employs a damascene interconnection as one interconnection, a part of this interconnection can easily be used as a capacitor lower electrode.

According to a still further aspect of the invention, a method of manufacturing a semiconductor device includes the steps of forming a metal film, forming a resist film on the metal film, and forming, by partially removing the metal film using the resist film as a mask, one capacitor electrode including a first extension and a second extension horizontally spaced apart from the first extension and the other capacitor electrode including a third extension located between the first extension and the second extension, opposed to the first extension with a dielectric film therebetween and opposed to the second extension with a dielectric film therebetween and including a fourth extension opposed to the second extension with a dielectric film therebetween that is different from the dielectric film between the second and third extensions, the third and fourth extensions located on different sides of the second extension.

In this way, a capacitor can readily be produced including the one and the other capacitor electrodes with the first to fourth extensions having sidewall surfaces opposing each other that can be utilized as a capacitor electrode surface.

According to a still further aspect of the invention, a method of manufacturing a semiconductor device includes the steps of preparing an interlayer insulating film, forming a plurality of holes in the interlayer insulating film, forming a metal film extending from the inside of the holes onto an upper surface of the interlayer insulating film, forming a plurality of capacitor lower electrodes provided in the holes and including a metal film by removing a part of the metal film located on the upper surface of the interlayer insulating film and forming a depression in the upper surface of the interlayer insulating film in a region where the holes are provided, filling the depression with a dielectric film, and forming a capacitor upper electrode including a metal film on the dielectric film.

In this way, a capacitor in the vertical direction can readily be produced that is constituted of the capacitor lower electrode, the dielectric film and the capacitor upper electrode stacked in the vertical direction.

In the step of forming a plurality of holes in the interlayer insulating film, the number and the cross sectional area of the holes can be changed to easily change the area of a region of the capacitor lower electrode, that is opposite to the dielectric film. The capacitance of the capacitor can thus be changed by an easy way.

According to a still further aspect of the invention, a method of manufacturing a semiconductor device includes the steps of forming a capacitor lower electrode including a metal film, forming a dielectric film deposited on the capacitor lower electrode and having its thickness smaller than that of the capacitor lower electrode, forming an interlayer insulating film on the dielectric film, forming an opening in the interlayer insulating film in a region located on the dielectric film so as to expose the dielectric film, and forming a capacitor upper electrode provided in the opening and including a metal film.

In this way, a capacitor in the vertical direction can readily be produced that is constituted of the capacitor lower electrode, the dielectric film and the capacitor upper electrode stacked in the vertical direction.

The capacitor upper electrode is provided in the opening. Therefore, the step of forming a contact hole, after the step of forming the capacitor upper electrode, for connecting the capacitor upper electrode and an upper-level interconnection is unnecessary which has been required for the conventional semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
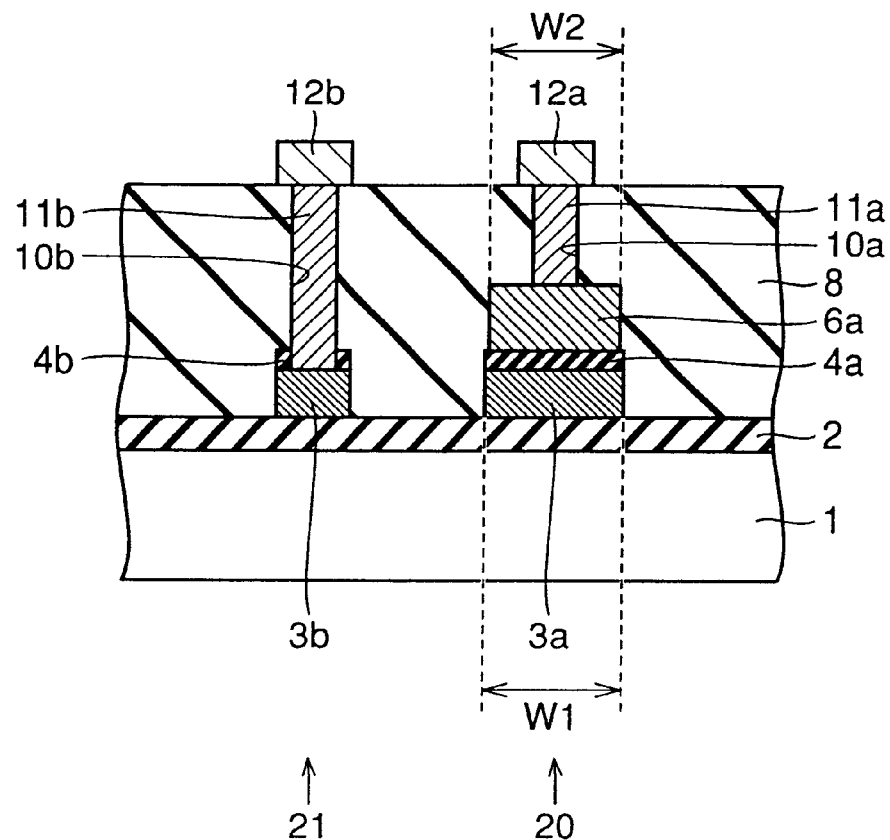
FIG. 1 is a schematic cross section showing a first embodiment of a semiconductor device according to the present invention.

Embodiments of the present invention are hereinafter described in conjunction with the drawings. It is noted that components identical to or corresponding to each other are represented by the same reference character and description thereof is not repeated here.

First Embodiment

A first embodiment of a semiconductor device according to the present invention is described in conjunction with FIG. 1.

Referring to FIG. 1, the semiconductor device is an application-specific integrated circuit (ASIC) that includes a capacitor portion 20 where a capacitor is formed and an interconnection portion 21 where an interconnection is formed. An insulating film 2 is formed on the upper surface of a semiconductor substrate 1. Capacitor portion 20 includes a lower electrode 3a formed of a metal film that is deposited on insulating film 2. A capacitor dielectric film 4a is deposited on the upper surface of lower electrode 3a. An upper electrode 6a formed of a metal film is deposited on capacitor dielectric film 4a. Lower electrode 3a has its width W1 greater than width W2 of upper electrode 6a.

In interconnection portion 21, a first-level interconnection 3b is formed on insulating film 2. A dielectric film 4b is deposited on the upper surface of the first-level interconnection 3b.

An interlayer insulating film 8 is formed on dielectric film 4b and upper electrode 6a. In interlayer insulating film 8, contact holes 10a and 10b are formed respectively in regions located on the first-level interconnection 3b and upper electrode 6a. A barrier metal film (not shown) is formed inside contact holes 10a and 10b. On this barrier metal film, tungsten plugs 11a and 11b are formed respectively to fill contact holes 10a and 10b. On tungsten plugs 11a and 11b, upper-level interconnections 12a and 12b are formed respectively.

In this way, lower electrode 3a as a capacitor lower electrode, capacitor dielectric film 4a and upper electrode 6a as a capacitor upper electrode are deposited in the vertical direction to constitute a capacitor in the vertical direction. The thickness of capacitor dielectric film 4a can be made significantly smaller than the minimum process dimension in a photolithography process employed for fabrication of a semiconductor device. Then, with a certain capacitance secured, the film thickness of capacitor dielectric film 4a can be made smaller than the conventional one and accordingly the surface area of upper electrode 6a and lower electrode 3a can be made smaller. The size of the capacitor can thus be reduced compared with conventional capacitors.

Further, upper electrode 6a has its width W2 defined smaller than width W1 of lower electrode 3a. Then, an alignment margin in the photolithography process for fabricating upper electrode 6a can be increased. As a result, it is possible to prevent any defect from occurring that is short-circuit between a sidewall for example of lower electrode 3a and upper electrode 6a due to shift of respective positions of upper electrode 6a and lower electrode 3a.

In addition, the metal films forming lower electrode 3a and upper electrode 6a enable a capacitor to be implemented that has a less dependency on voltage with a high precision compared with a semiconductor device employing a semiconductor such as polysilicon as a capacitor electrode. In this way, a capacitor required for a high-precision filter circuit can readily be achieved. In particular, the ASIC requires such a capacitor with a high-precision and a less voltage-dependency. Therefore, the present invention can be applied to the ASIC for enhancement of the performance as well as reduction of the size of the ASIC.

Referring to FIGS. 2–7, a method of manufacturing the semiconductor device according to the invention shown in FIG. 1 is described.

Figure 2:
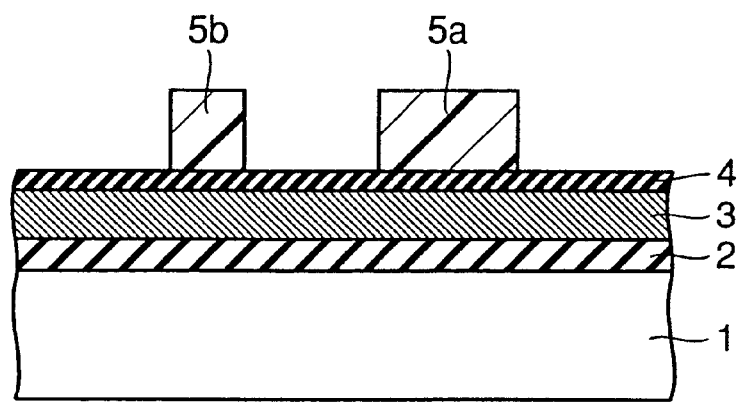
FIGS. 2–7 are schematic cross sections respectively illustrating first to sixth steps of manufacturing the semiconductor device shown in FIG. 1.

As shown in FIG. 2, insulating film 2 is formed on the upper surface of semiconductor substrate 1. A lower-level metal film 3 is formed on insulating film 2. As lower-level metal film 3, an aluminum alloy film is deposited by means of sputtering. The lower-level metal film 3 formed of the aluminum alloy film has a thickness of approximately 0.4 μm. A dielectric film 4 is formed on lower-level metal film 3 to form the capacitor dielectric film. As dielectric film 4, a silicon oxide film can be employed that is formed by means of plasma CVD (Chemical Vapor Deposition). The thickness of dielectric film 4 is approximately 30 nm. Resist films 5a and 5b are formed on dielectric film 4. Although the aluminum alloy film is used as lower-level metal film 3, a tungsten film for example may be used instead of the aluminum alloy. Although the thickness of lower-level metal film 3 is 0.4 μm here, the thickness of lower-level metal film 3 may be changed appropriately. Instead of the silicon oxide film employed as dielectric film 4, a silicon nitride film for example may be used. In addition, the thickness of dielectric film 4, which is 30 nm here, may be changed.

Figure 3:
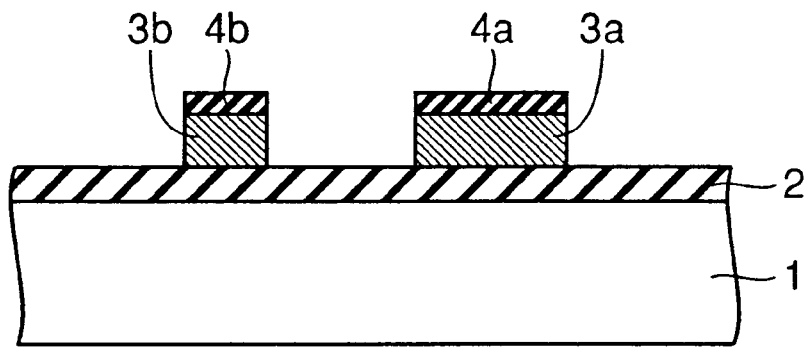

Resist films 5a and 5b are used as a mask to partially remove dielectric film 4 and lower-level metal film 3 by means of anisotropic etching. After this, resist films 5a and 5b are removed by plasma ashing or the like. In this way, lower electrode 3a of the capacitor, capacitor dielectric film 4a and the first-level interconnection 3b as shown in FIG. 3 are formed. Dielectric film 4b remains on the upper surface of the first-level interconnection 3b.

Figure 4:
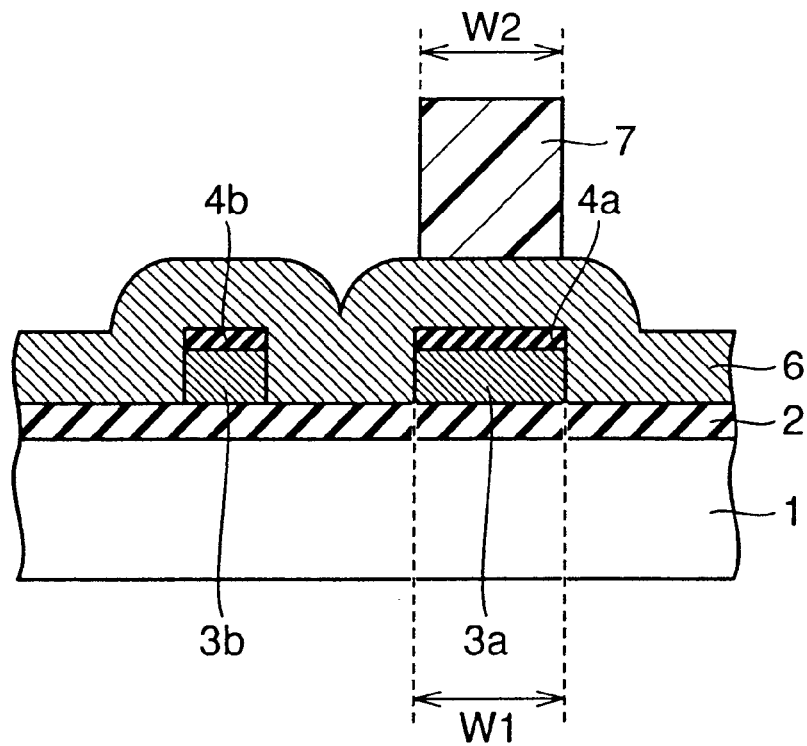

Referring to FIG. 4, a metal film 6 is formed on capacitor dielectric film 4a and dielectric film 4b in order to form the upper electrode. As metal film 6, an aluminum alloy film can be deposited by means of sputtering. Metal film 6 has a thickness of approximately 0.4 μm. A resist film 7 is formed by photolithography technique on metal film 6. Resist film 7 is employed for fabricating upper electrode 6a (see FIG. 1), therefore, resist film 7 has its width W2 corresponding to the width of upper electrode 6a. Then, width W2 of resist film 7 is set smaller than width W1 of lower electrode 3a. Instead of the aluminum alloy film, any metal film for example tungsten film can be used as metal film 6. The thickness of metal film 6 can be changed appropriately.

Accordingly, width W2 of resist film 7 which is made smaller than width W1 of lower electrode 3a can increase an alignment margin in the photolithography process for fabricating resist film 7. Consequently, prevention is surely possible of occurrence of any defect like short-circuit between upper electrode 6a and lower electrode 3a due to residue resultant from a subsequent etching process for metal film 6.

Figure 5:
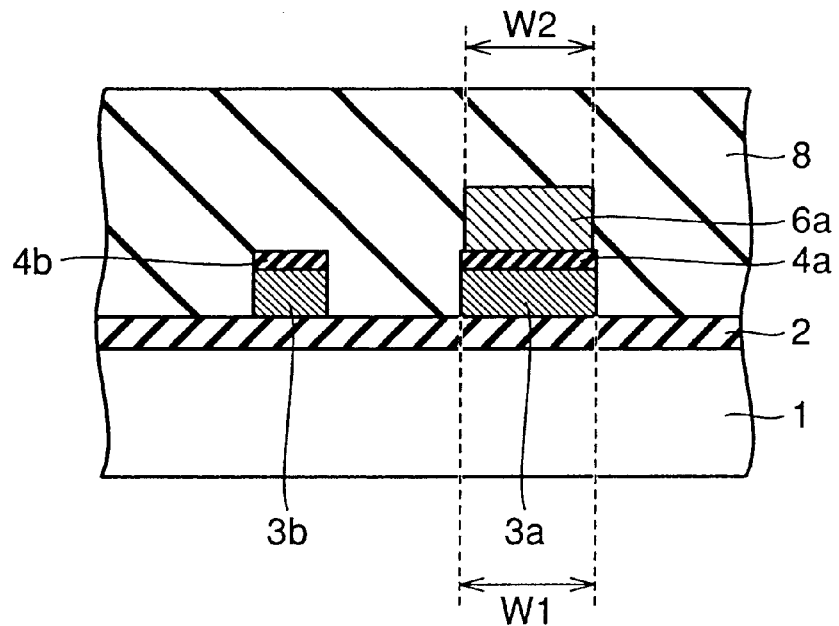

Resist film 7 is then used as a mask, and metal film 6 is partially removed by means of anisotropic etching. After this, plasma ashing is conducted for removing resist film 7. Accordingly, upper electrode 6a of the capacitor (see FIG. 5) can be produced. Interlayer insulating film 8 is thereafter formed on upper electrode 6a and dielectric film 4b. The upper surface of interlayer insulating film 8 is planarized by means of chemical mechanical polishing (CMP). In this way, the structure as shown in FIG. 5 is accomplished.

Figure 6:
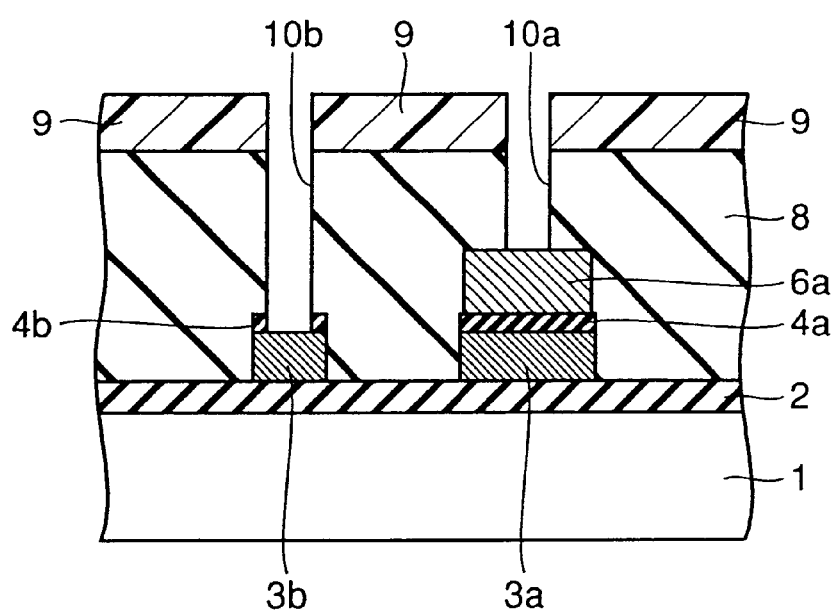

On the upper surface of interlayer insulating film 8, a resist film 9 (see FIG. 6) is formed. This resist film 9 is used as a mask to remove a part of interlayer insulating film 8 and dielectric film 4b by means of anisotropic etching and thus contact holes 10a and 10b are formed. The structure as shown in FIG. 6 is thus accomplished. At the bottom of contact hole 10a, the upper surface of upper electrode 6a is exposed. Further, the upper surface of the first-level interconnection 3b is exposed at the bottom of contact hole 10b.

Resist film 9 is then removed. A barrier metal film (not shown) and a tungsten film (not shown) are formed from the inside of contact holes 10a and 10b onto the upper surface of interlayer insulating film 8. The tungsten film and the barrier metal film located on the upper surface of interlayer insulating film 8 are removed by means of dry etching, chemical mechanical polishing or the like. Accordingly, tungsten plugs 11a and 11b and a barrier metal film (not shown) are formed to fill the inside of contact holes 10a and 10b.

A third-level metal film (not shown) is formed on the upper surface of interlayer insulating film 8. An aluminum alloy film formed by means of sputtering can be employed as this metal film. The third-level metal film has a thickness of approximately 0.4 μm. A resist film (not shown) is formed on the metal film. This resist film is used as a mask to partially remove the metal film through anisotropic etching. This resist film is thereafter removed. Upper-level interconnections 12a and 12b are accordingly formed respectively on tungsten plugs 11a and 11b. The semiconductor device as shown in FIG. 1 is thus accomplished. Instead of the aluminum alloy film, a metal film, for example, a tungsten film can be used as the third-level metal film that constitutes upper-level interconnections 12a and 12b. The thickness of the third-level metal film can appropriately be changed.

Second Embodiment

Figure 8:
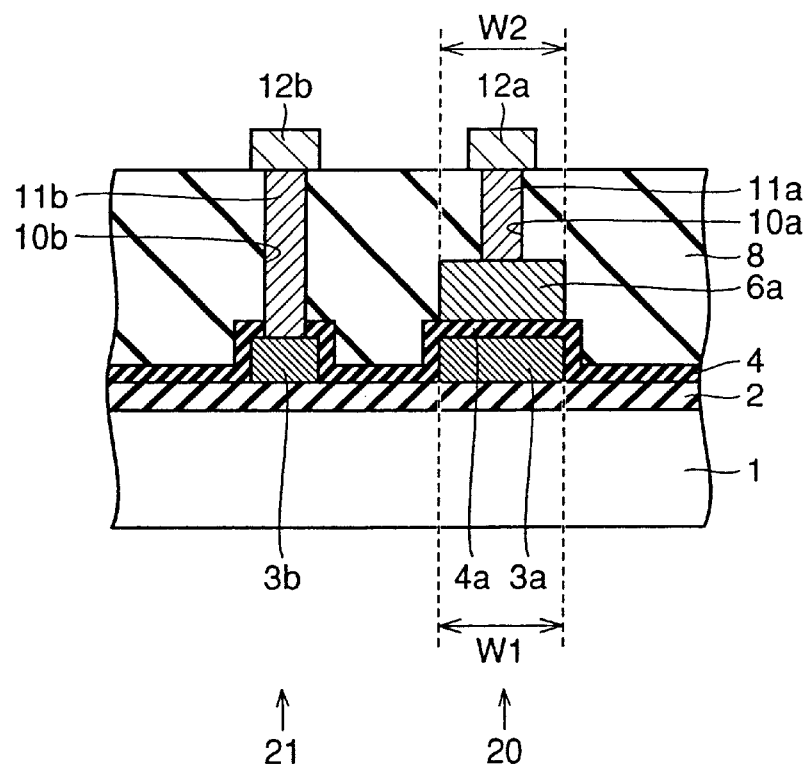
FIG. 8 is a schematic cross section showing a second embodiment of a semiconductor device according to the invention.

Referring to FIG. 8, a second embodiment of a semiconductor device according to the invention is described.

Referring to FIG. 8, the semiconductor device has a structure basically similar to that of the semiconductor device shown in FIG. 1. The semiconductor device shown in FIG. 8 is different from that in FIG. 1 in that a dielectric film 4 including a capacitor dielectric film 4a is formed on a lower electrode 3a to extend from the upper surface of lower electrode 3a to the sidewall thereof.

Further, regarding the semiconductor device shown in FIG. 8, lower electrode 3a of the capacitor has its width W1 substantially equal to width W2 of an upper electrode 6a.

In this case, the capacitor in the vertical direction can be formed by depositing lower electrode 4a as a capacitor lower electrode, capacitor dielectric film 4a and upper electrode 6a as a capacitor upper electrode in a similar manner to that of the first embodiment. Then, even if the thickness of capacitor dielectric film 4a is made smaller than the conventional one to reduce the surface area of upper electrode 6a and lower electrode 3a, a certain capacitance can be secured. Accordingly, the capacitor can be reduced in size compared with the conventional capacitor.

In addition, dielectric film 4 including capacitor dielectric film 4a extends from the part on the upper surface of lower electrode 3a to the part on the sidewall thereof. Therefore, when the position of upper electrode 6a changes and accordingly upper electrode 6a extends onto the sidewall of lower electrode 3a, dielectric film 4 is present between upper electrode 6a and lower electrode 3a. Prevention is thus possible of short-circuit between lower electrode 3a and upper electrode 6a.

As lower electrode 3a and upper electrode 6a are formed of metal films, a capacitor with a higher precision and a less voltage-dependency can be implemented compared with the capacitor implemented by using semiconductor such as polysilicon as a capacitor electrode.

Referring to FIGS. 9–13, a method of manufacturing the semiconductor device shown in FIG. 8 is described.

Figure 9:
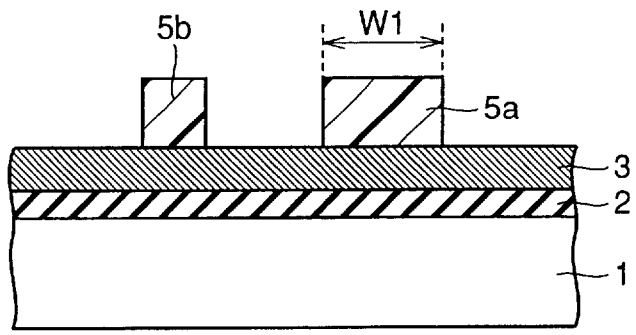
FIGS. 9–13 are schematic cross sections respectively illustrating first to fifth steps of manufacturing the semiconductor device shown in FIG. 8.

In a similar manner to that of the manufacturing method of the semiconductor device employed in the first embodiment, an insulating film 2 is formed on the upper surface of a semiconductor substrate 1. A lower-level metal film 3 is formed on insulating film 2. As this lower-level metal film 3, an aluminum alloy film produced by means of sputtering can be used. Lower-level metal film 3 has a thickness of approximately 0.4 μm. Instead of the aluminum alloy, tungsten for example can be used as a material for forming lower-level metal film 3. The thickness of lower-level metal film 3 defined as 0.4 μm here may be changed appropriately. On the upper surface of lower-level metal film 3, resist films 5a and 5b are formed by means of photolithography. Accordingly, the structure as shown in FIG. 9 is accomplished.

Figure 10:
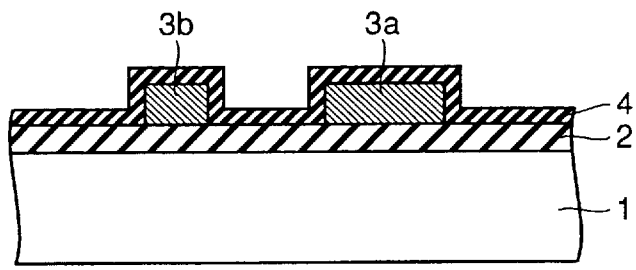

Resist films 5a and 5b are used as a mask, and lower-level metal film 3 is partially removed through anisotropic etching. After this, resist films 5a and 5b are removed by means of plasma ashing or the like. Consequently, lower electrode 3a (see FIG. 10) and a first-level interconnection 3b (see FIG. 10) are fabricated. Dielectric film 4 is formed on lower electrode 3a and the first-level interconnection 3b. In this way, the structure shown in FIG. 10 is obtained.

As dielectric film 4, a silicon oxide film formed by means of plasma CVD can be employed. The thickness of dielectric film 4 is approximately 30 nm here. This thickness of dielectric film 4 may be changed appropriately. Instead of the silicon oxide film as a material for dielectric film 4, another dielectric film such as silicon nitride film may be employed.

Figure 11:
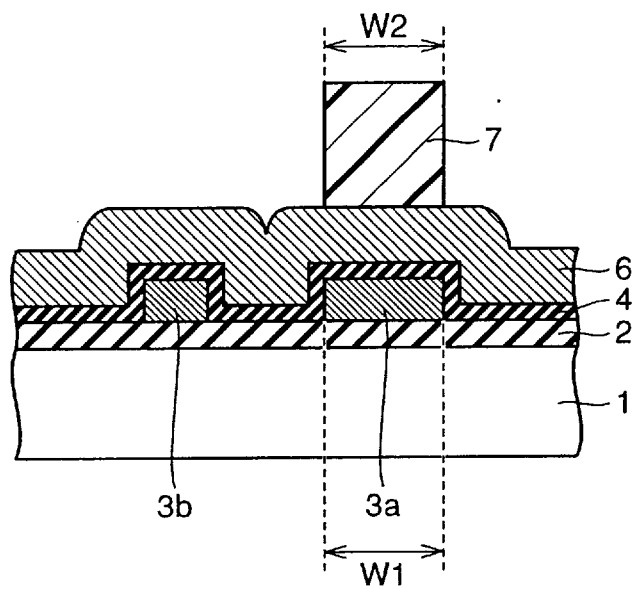

A metal film 6 (see FIG. 11) is formed on dielectric film 4 to constitute upper electrode 6a (see FIG. 8). As metal film 6, an aluminum alloy film formed by means of sputtering is applicable. Metal film 6 has a thickness of approximately 0.4 μm. As a material for metal film 6, a metal film except for the aluminum alloy film, for example, a tungsten film can be used. On metal film 6, a resist film 7 (see FIG. 11) is formed by means of photolithography. Accordingly, the structure as shown in FIG. 11 is accomplished. It is noted that width WI of lower electrode 3a and width W2 of resist film 7 are substantially identical to each other.

Figure 12:
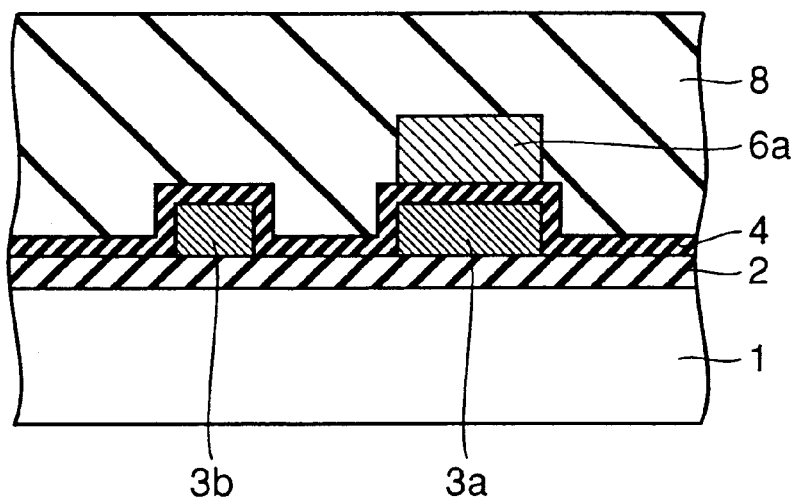

Resist film 7 is used as a mask, and metal film 6 is partially removed by means of anisotropic etching to form upper electrode 6a (see FIG. 12). Resist film 7 is thereafter removed by plasma ashing or the like. Then, an interlayer insulating film 8 is formed on upper electrode 6a and dielectric film 4 as shown in FIG. 12. The upper surface of interlayer insulating film 8 is planarized by means of chemical mechanical polishing or the like.

In this way, dielectric film 4 is formed to extend from the part on the upper surface of lower electrode 3a to the part on the sidewall thereof. Then, even if the location of resist film 7 changes and consequently upper electrode 6a extends onto the sidewall of lower electrode 3a, there still remains dielectric film 4 between upper electrode 6a and lower electrode 3a. Short-circuit between lower electrode 3a and upper electrode 6a can thus be prevented.

Figure 7:
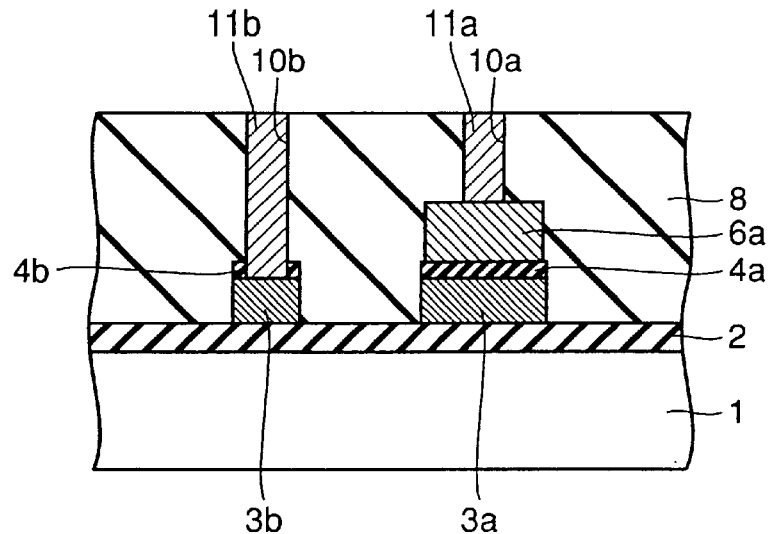
Figure 13:
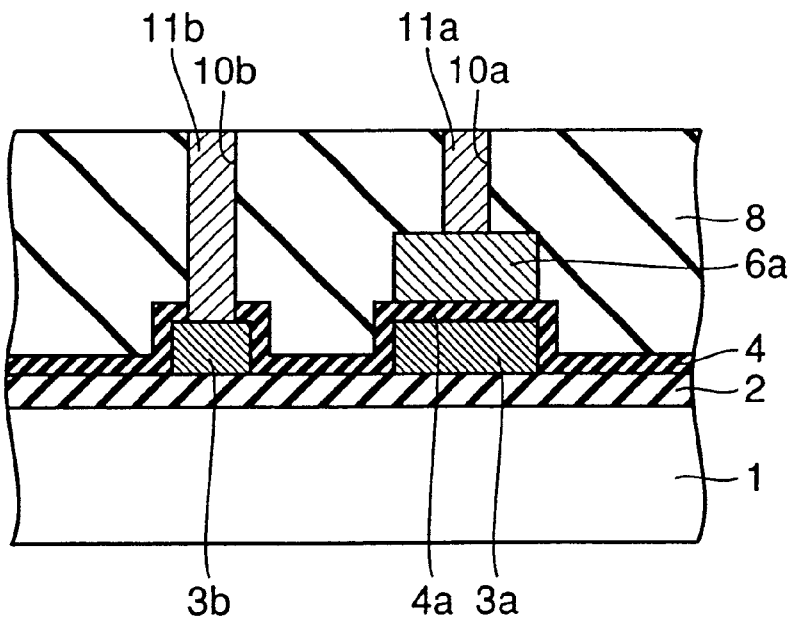

By process steps similar to those shown in FIGS. 6 and 7 employed in the first embodiment of the invention, contact holes 10a and 10b (see FIG. 13) are formed in interlayer insulating film 8 and a barrier metal film (not shown) is formed inside contact holes 10a and 10b. Tungsten plugs 11a and 11b are further formed to fill the inside of contact holes 10a and 10b. The structure as shown in FIG. 13 is accordingly obtained.

Upper-level interconnections 12a and 12b are formed respectively on tungsten plugs 11a and 11b as done in the first embodiment. The semiconductor device as shown in FIG. 8 is accordingly achieved.

Figure 14:
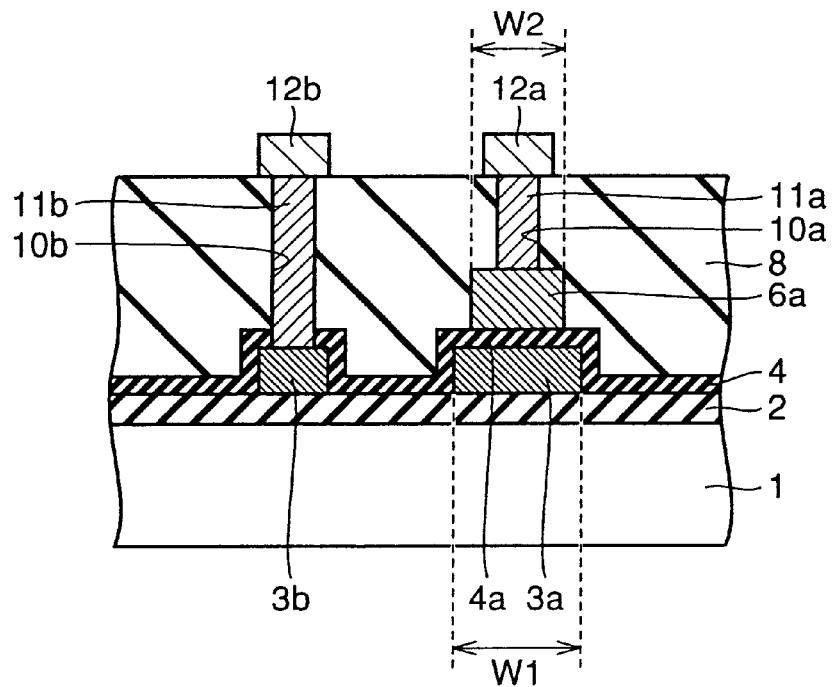
FIG. 14 is a schematic cross section showing a first modification of the second embodiment of the semiconductor device shown in FIG. 8.

A first modification of the second embodiment of the semiconductor device is described in conjunction with FIG. 14.

Referring to FIG. 14, the semiconductor device has a structure basically similar to that of the semiconductor device shown in FIG. 8. Different from the semiconductor device shown in FIG. 8, width W2 of upper electrode 6a is smaller than width WI of lower electrode 3a as shown in FIG. 14.

In this case, as accomplished by the first embodiment of the semiconductor device, a greater alignment margin can be obtained with respect to upper electrode 6a and lower electrode 3a in photolithography for fabricating upper electrode 6a. Consequently, it is possible to prevent defect, i.e., of short-circuit between upper electrode 6a and the sidewall for example of lower electrode 3a from occurring.

Figure 15:
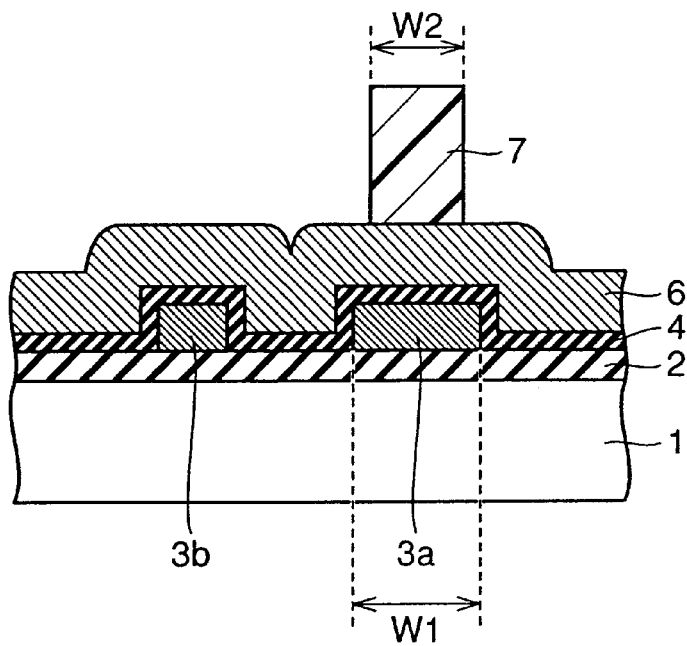
FIG. 15 is a schematic cross section illustrating a method of manufacturing the semiconductor device shown in FIG. 14.

A method of manufacturing the semiconductor device shown in FIG. 14 is described in conjunction with FIG. 15.

After the steps shown in FIGS. 9 and 10, a metal film 6 and a resist film 7 are formed as shown in FIG. 15. The step shown in FIG. 15 corresponds to the step shown in FIG. 11. As shown in FIG. 15, width W2 of resist film 7 is smaller than width W1 of lower electrode 3a. Then, alignment margin of resist film 7 and lower electrode 3a can be increased in photolithography for forming resist film 7.

Process steps as shown in FIGS. 12 and 13 are thereafter performed to obtain the semiconductor device shown in FIG. 14.

Figure 16:
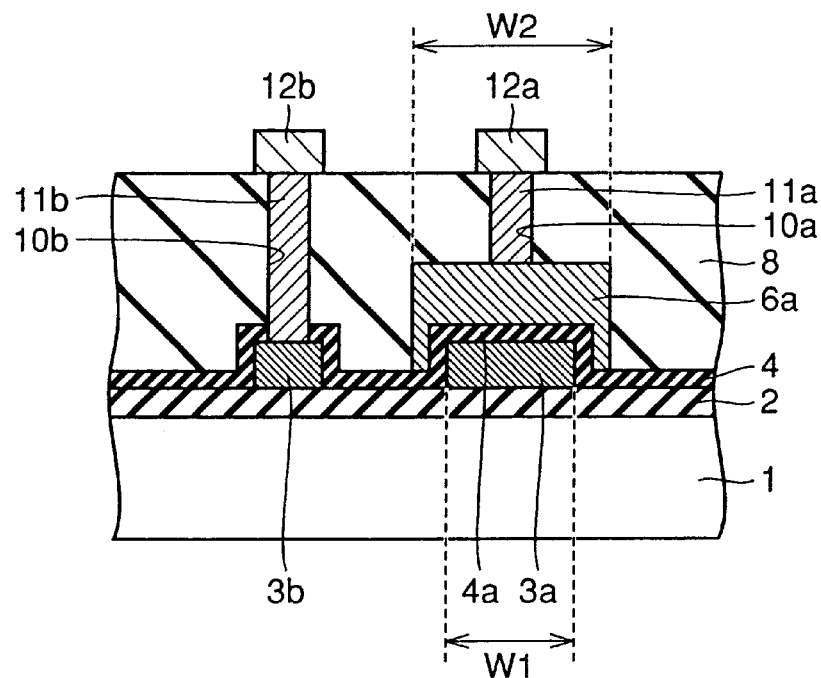
FIG. 16 is a schematic cross section showing a second modification of the second embodiment of the semiconductor device shown in FIG. 8.

A second modification of the second embodiment of the semiconductor device is described in conjunction with FIG. 16.

Referring to FIG. 16, the semiconductor device has a structure basically similar to that of the semiconductor device shown in FIG. 8. The former semiconductor device includes an upper electrode 6a having its width W2 greater than width W1 of a lower electrode 3a.

In this case, upper electrode 6a is located on the sidewall of lower electrode 3a via a dielectric film 4. Then, the sidewall of lower electrode 3a can also be utilized as a capacitor electrode and accordingly the capacitance of the capacitor can be increased.

Figure 17:
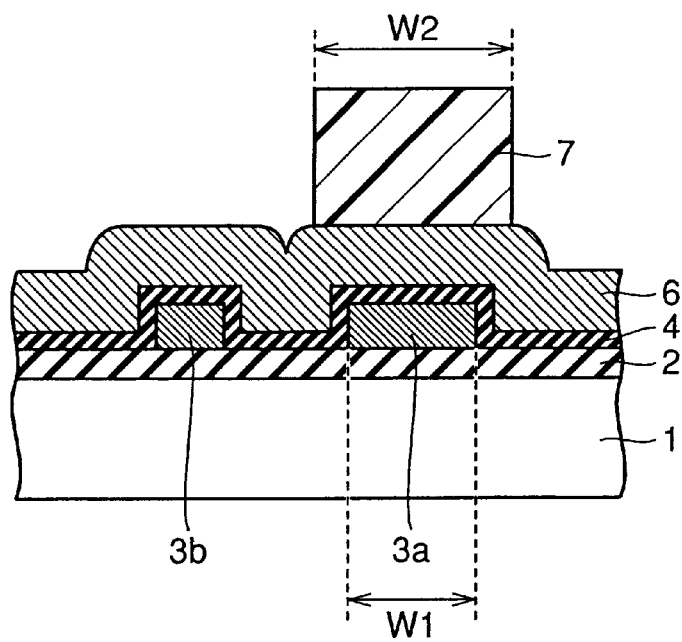
FIG. 17 is a schematic cross section illustrating a method of manufacturing the semiconductor device shown in FIG. 16.

Referring to FIG. 17, a method of manufacturing the semiconductor device shown in FIG. 16 is described.

After the process steps shown in FIGS. 9 and 10, a metal film 6 and a resist film 7 are formed on dielectric film 4. Width W2 of resist film 7 is set greater than width W1 of lower electrode 3a. The step shown in FIG. 17 corresponds to that shown in FIG. 11. In this way, resist film 7 is used as a mask to partially remove metal film 6 through anisotropic etching. Then, upper electrode 6a formed on lower electrode 3a extends from the upper surface of lower electrode 3a onto the sidewall thereof with dielectric film 4 therebetween.

Through the steps shown in FIGS. 12 and 13, the semiconductor device shown in FIG. 16 is obtained.

Third Embodiment

Figure 18:
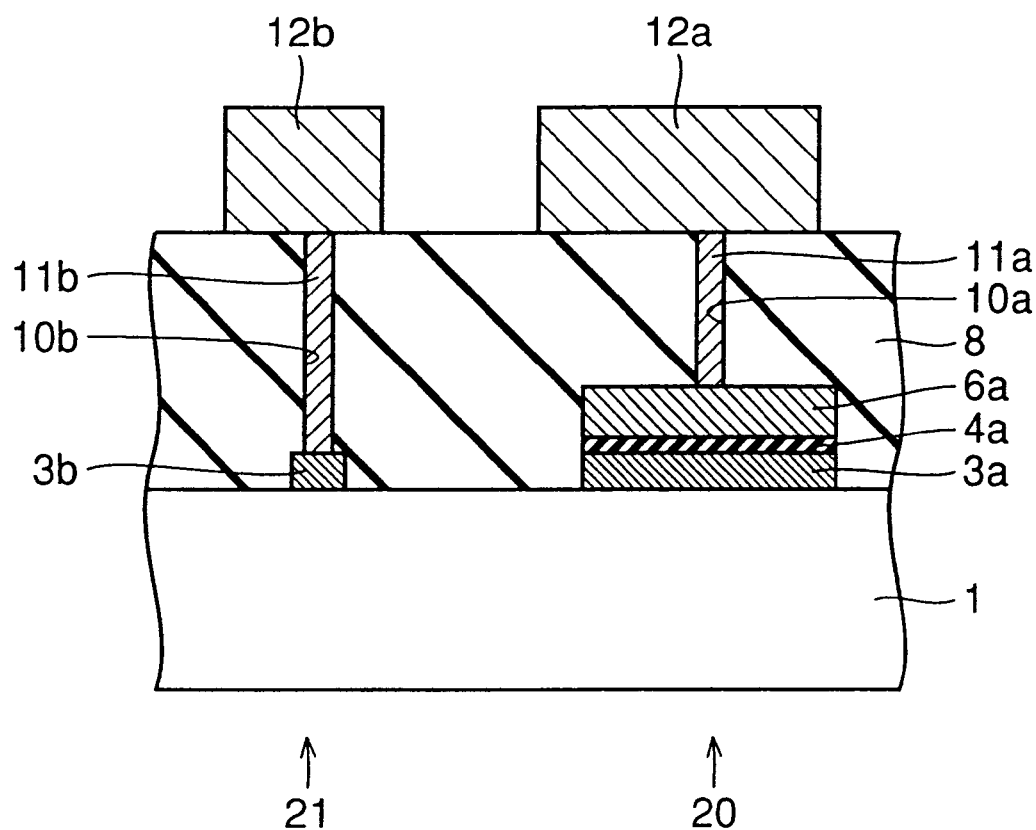
FIG. 18 is a schematic cross section showing a third embodiment of a semiconductor device according to the invention.

A third embodiment of a semiconductor device according to the invention is described in conjunction FIG. 18.

Referring to FIG. 18, the semiconductor device has a structure basically similar to that of the semiconductor device shown in FIG. 1. The semiconductor device shown in FIG. 18 includes an upper electrode 6a, a lower electrode 3a and a capacitor dielectric film 4a constituting a capacitor and respective positions of respective sidewalls substantially match. Upper electrode 6a may be formed of a tungsten film and lower electrode 3a may be a metal film containing aluminum such as an aluminum alloy film.

In this case, as accomplished by the first embodiment of the semiconductor device according to the invention, reduction is possible of the size of the capacitor by forming a capacitor in the vertical direction. In addition, upper electrode 6a and lower electrode 3a formed of metal films can be employed to implement a capacitor with a less voltage-dependency and a high precision. If different materials are used for structuring lower electrode 3a and upper electrode 6a respectively, as illustrated with respect to a manufacturing process below, upper electrode 6a can surely be utilized as a mask in an etching process for generating lower electrode 3a.

A method of manufacturing the semiconductor device shown in FIG. 18 is described below in conjunction with FIGS. 19–26.

Figure 19:
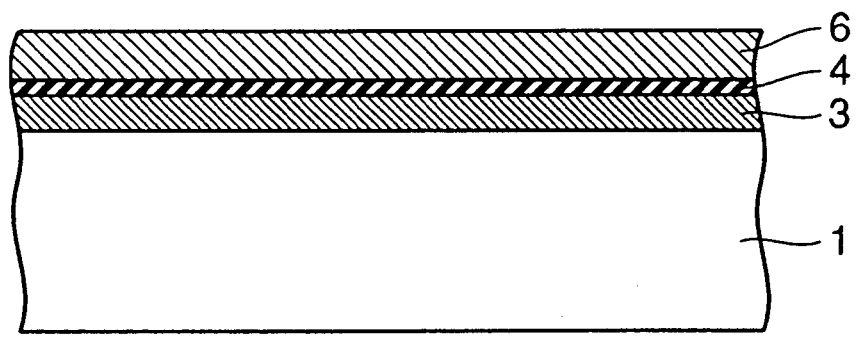
FIGS. 19–26 are schematic cross sections respectively illustrating first to eighth steps of manufacturing the semiconductor device shown in FIG. 18.

Referring to FIG. 19, an insulating film (not shown) is formed on the upper surface of a semiconductor substrate 1. A lower-level metal film 3 is formed on the insulating film to form the lower electrode. Dielectric film 4 is formed on lower-level metal film 3 in order to constitute the capacitor dielectric film. A metal film 6 is formed on dielectric film 4 to constitute the upper electrode.

Figure 20:
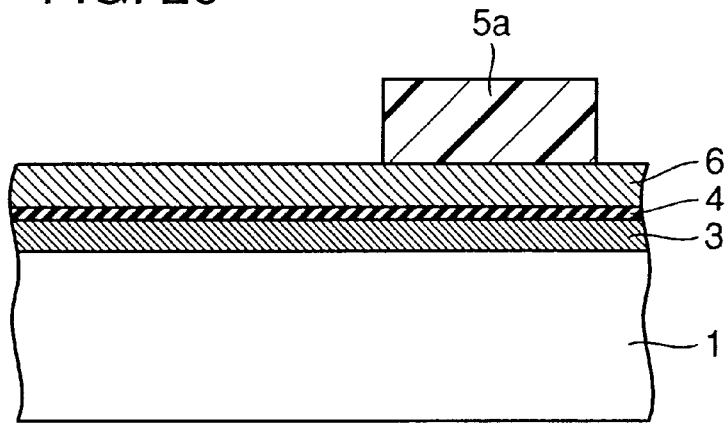

Referring to FIG. 20, a resist film 5a is formed on metal film 6 by means of photolithography.

Figure 21:
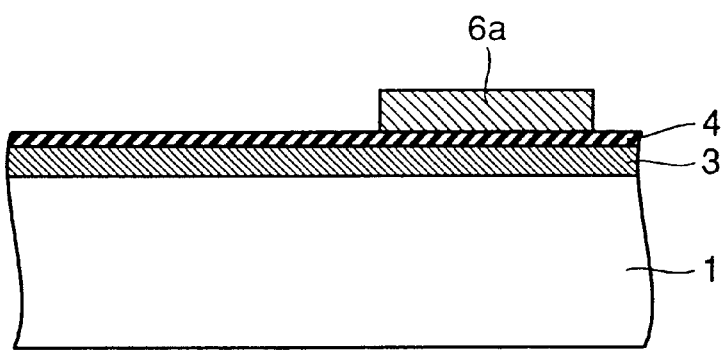

This resist film 5a is used as a mask to partially remove metal film 6 by anisotropic etching. After this, resist film 5a is removed by means of plasma ashing or the like. Consequently, upper electrode 6a is formed as shown in FIG. 21.

Figure 22:
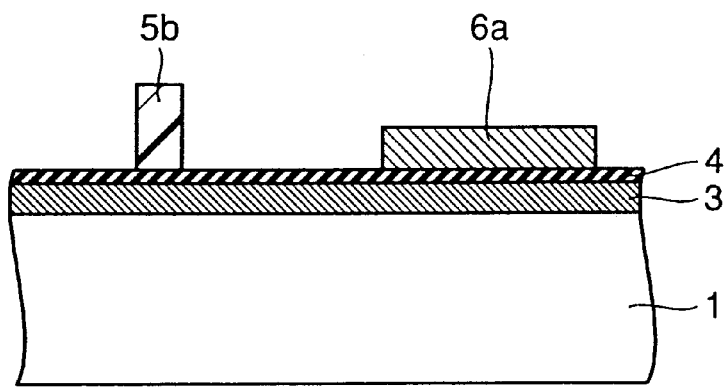
Figure 23:
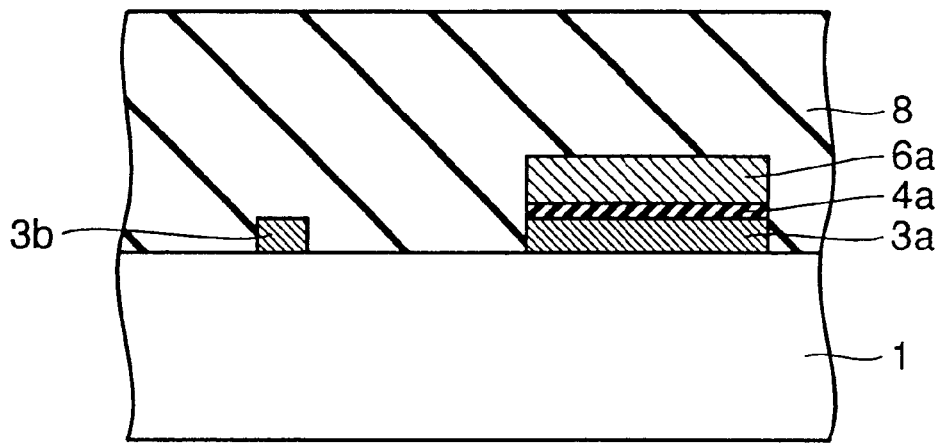

Referring to FIG. 22, photolithography is conducted to form a resist film 5b on dielectric film 4 for generating a first-level interconnection 3b. As dielectric film 4, a silicon oxynitride film (SiON film) is used. Then, this dielectric film 4 can be employed as ARC (Anti Reflection Coat) in formation of resist film 5b. Consequently, no ARC is necessary on dielectric film 4 when resist film 5b is formed. A simplified process can thus be accomplished.

Upper electrode 6a and resist film 5b are used as a mask to partially remove dielectric film 4 and lower-level metal film 3 by means of isotropic etching and accordingly, capacitor dielectric film 4a (see FIG. 23), lower electrode 3a (see FIG. 23) and the first-level interconnection 3b (see FIG. 23) are formed.

In this way, upper electrode 6a is used as a mask to fabricate lower electrode 3a. Therefore, positional displacement of upper electrode 6a and lower electrode 3a with respect to each other can surely be prevented.

After this, resist film 5b and the dielectric film located on the first-level interconnection 3b is removed. On the first-level interconnection 3b and upper electrode 6a, interlayer insulating film 8 (see FIG. 23) is formed. The upper surface of interlayer insulating film 8 is planarized by means of chemical mechanical polishing (CMP).

Figure 24:
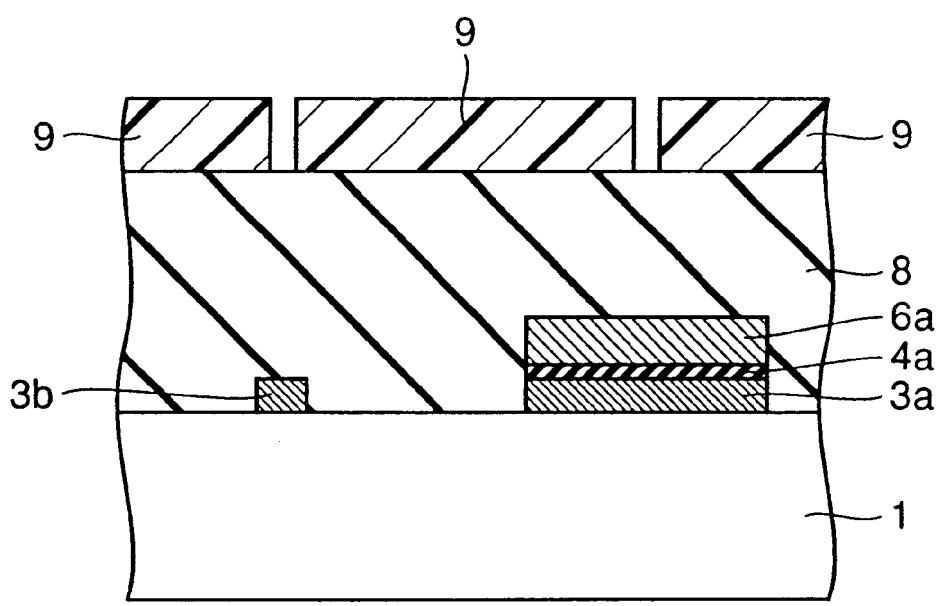

Referring to FIG. 24, a resist film 9 is formed on the upper surface of interlayer insulating film 8 by means of photolithography.

Figure 25:
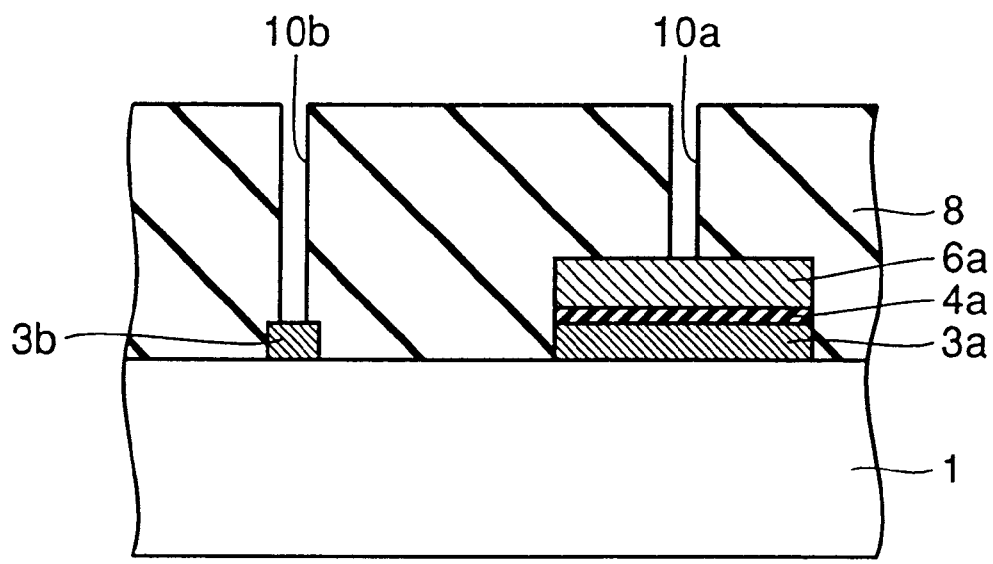

Resist film 9 is used as a mask to partially remove interlayer insulating film 8 through anisotropic etching. Consequently, contact holes 10a and 10b (see FIG. 25) are formed. After this, resist film 9 is removed by plasma ashing or the like. Accordingly, the structure as shown in FIG. 25 is achieved.

Figure 26:
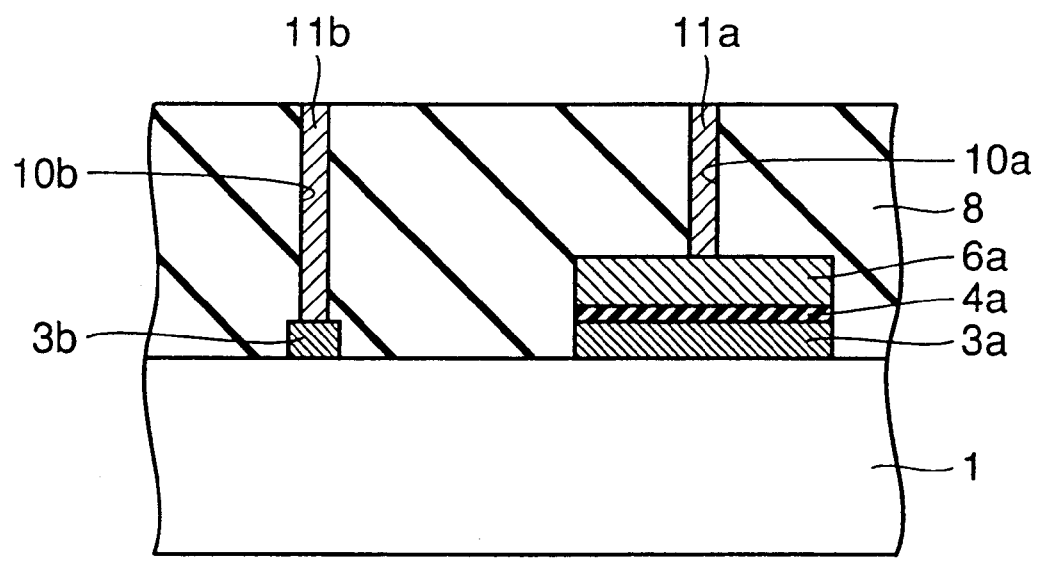

A barrier metal film (not shown) is thereafter formed to extend from the inside of contact holes 10a and 10b onto the upper surface of interlayer insulating film 8. A tungsten film (not shown) is formed on the barrier metal film. The barrier metal film and the tungsten film located on the upper surface of interlayer insulating film 8 are then removed by means of CMP or the like. Consequently, as shown in FIG. 26, the barrier metal film located inside contact holes 10a and 10b as well as tungsten plugs 11a and 11b formed on the barrier metal film to fill the inside of contact holes 10a and 10b can be obtained.

After this, upper-level interconnections 12a and 12b are formed respectively on tungsten plugs 11a and 11b as done in the first and second embodiments of the invention to achieve the semiconductor device shown in FIG. 18.

Fourth Embodiment

Figure 27:
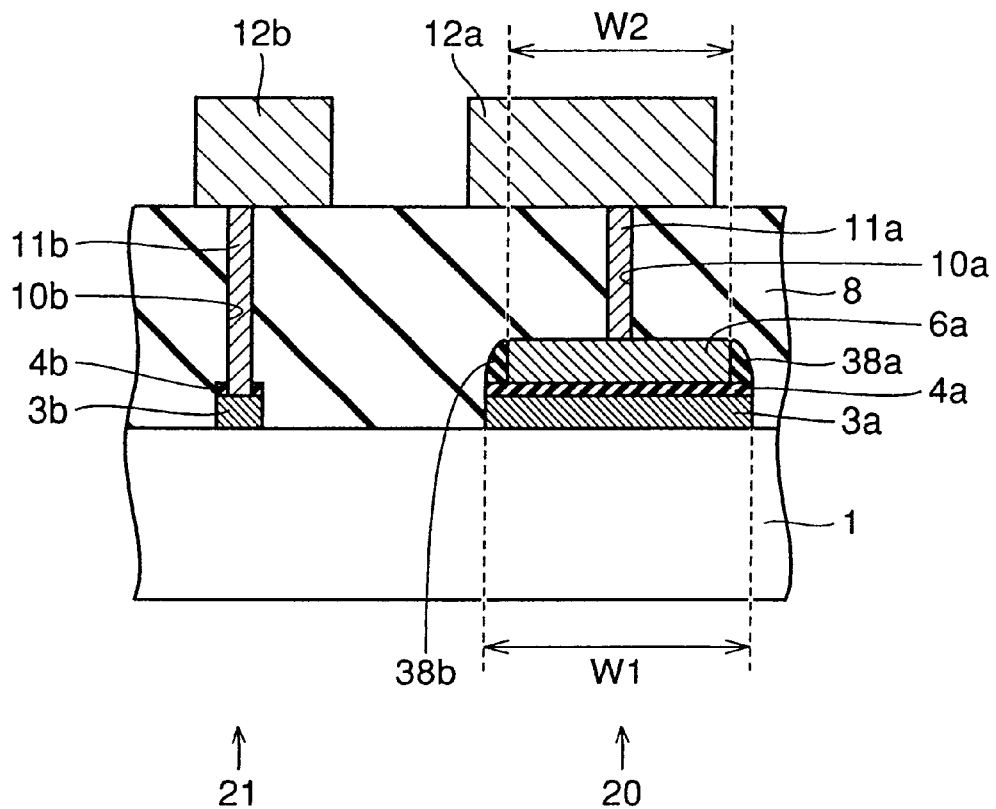
FIG. 27 is a schematic cross section showing a fourth embodiment of a semiconductor device according to the invention.

A fourth embodiment of a semiconductor device according to the invention is described in conjunction with FIG. 27.

Referring to FIG. 27, the semiconductor device has a structure basically similar to that of the semiconductor device shown in FIG. 1. A difference therebetween is that the semiconductor device shown in FIG. 27 includes sidewall films 38a and 38b formed of a dielectric film that are deposited on the sidewall of an upper electrode 6a of a capacitor. The sum of respective widths of upper electrode 6a and sidewall films 38a and 38b is substantially identical to width W1 of a lower electrode 3a. In other words, upper electrode 6a has its width W2 smaller than width W1 of lower electrode 3a. In this way, the semiconductor device shown in FIG. 27 achieves the same effect as that of the semiconductor device of the first embodiment.

Further, sidewall films 38a and 38b serving as sidewall insulating films provided between the sidewall of upper electrode 6a and the upper surface of lower electrode 3a make it possible to surely prevent short-circuit between upper electrode 6a and lower electrode 3a.

Upper electrode 6a and sidewall films 38a and 38b can be used as a mask for generating lower electrode 3a by anisotropic etching as illustrated in conjunction with the manufacturing process described later, so as to ensure formation of lower electrode 3a located below upper electrode 6a and having a width greater than that of upper electrode 6a.

It is noted that different materials may be employed for fabricating upper electrode 6a and lower electrode 3a respectively. For example, a tungsten film and an aluminum alloy film may be used as respective materials for upper electrode 6a and lower electrode 3a. Then, upper electrode 6a can be utilized as a mask for fabricating lower electrode 3a in an etching process.

A method of manufacturing the semiconductor device shown in FIG. 27 is discussed below in conjunction with FIGS. 28–34.

Figure 28:
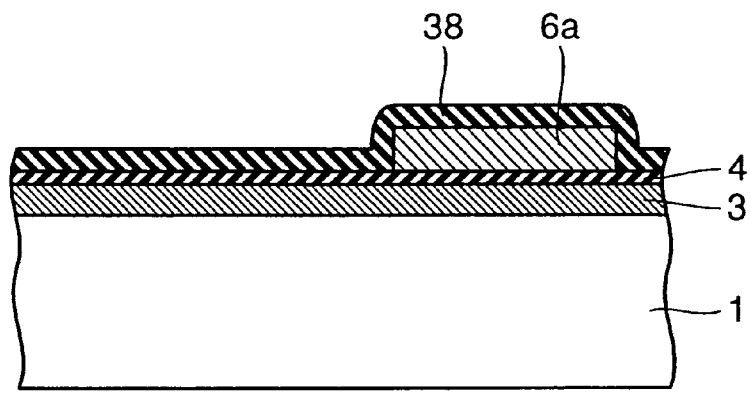
FIGS. 28–34 are schematic cross sections respectively illustrating first to seventh steps of manufacturing the semiconductor device shown in FIG. 27.

After the manufacturing process steps shown in FIGS. 19–21, an insulating film 38 which constitutes sidewall films 38a and 38b (see FIG. 27) is formed on upper electrode 6a and dielectric film 4 as shown in FIG. 28.

Figure 29:
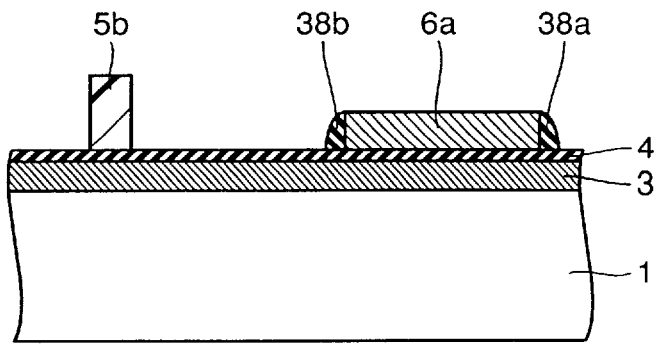

Insulating film 38 is then partially removed by means of anisotropic etching to form sidewall films 38a and 38b on the sidewall of upper electrode 6a (see FIG. 29). A resist film 5b is formed on dielectric film 4 on a region where a first-level interconnection 3b (see FIG. 27) should be formed. The structure shown in FIG. 29 is thus accomplished.

Upper electrode 6a and sidewall films 38a and 38b are thus employed as a mask used by etching for fabricating lower electrode 3a. Accordingly, lower electrode 3a can surely be formed that is located below upper electrode 6a and having a width greater than that of upper electrode 6a.

Figure 30:
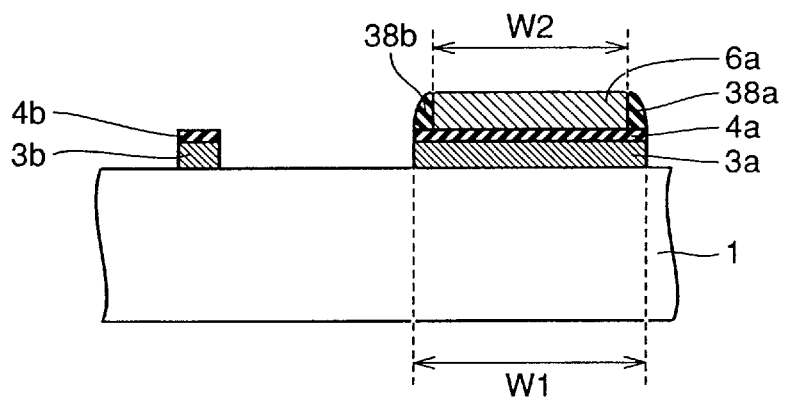

Upper electrode 6a, sidewall films 38a and 38b and resist film 5b are used as a mask to partially remove dielectric film 4 and lower-level metal film 3 by means of anisotropic etching. Resist film 5b is thereafter removed. Consequently, lower electrode 3a, capacitor dielectric film 4a and the first-level interconnection 3b are produced as shown in FIG. 30. It is noted that there remains dielectric film 4b on the first-level interconnection 3b. In this way, upper electrode 6a, and sidewall films 38a and 38b are employed as a mask for forming lower electrode 3a to make width W1 of lower electrode 3a greater than width W2 of upper electrode 6a.

Different materials are employed as respective materials for metal films constituting upper electrode 6a and lower electrode 3a respectively. As a condition of etching lower-level metal film 3, preferably an etching condition is employed such that the etching rate for the material constituting lower-level metal film 3 is sufficiently high while this etching removes substantially no material constituting upper electrode 6a.

Figure 31:
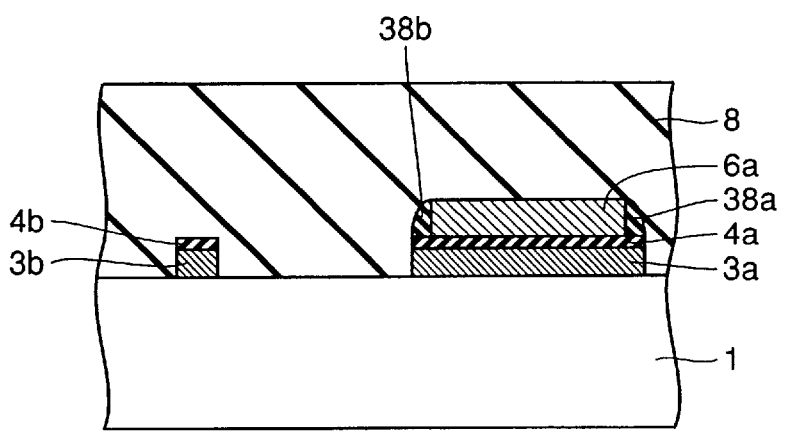

As shown in FIG. 31, an interlayer insulating film 8 is deposited on upper electrode 6a, sidewall films 38a and 38b and dielectric film 4b. The upper surface of interlayer insulating film 8 is planarized by means of CMP or the like.

Figure 32:
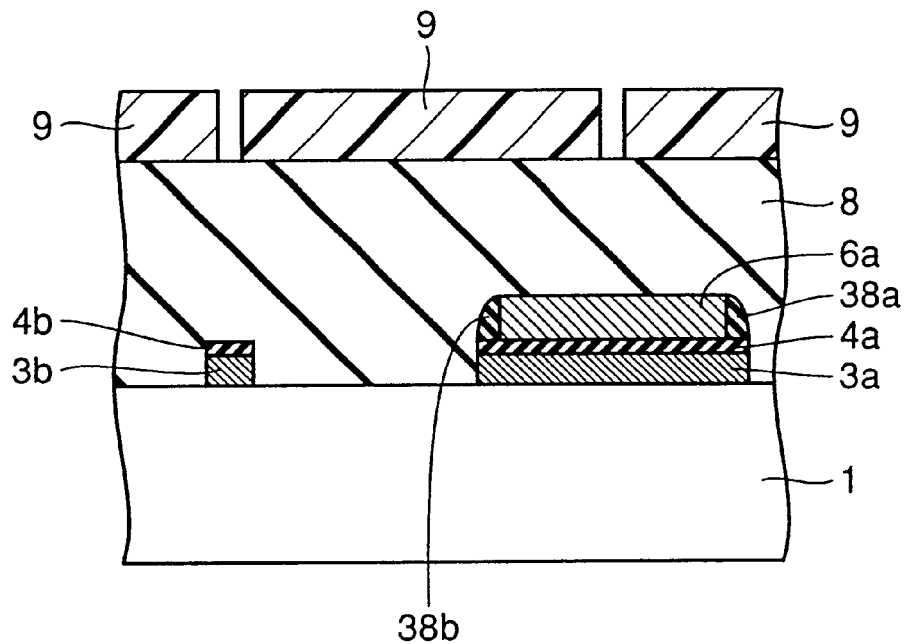

A resist film 9 is thereafter formed on the upper surface of interlayer insulating film 8 as shown in FIG. 32.

Figure 33:
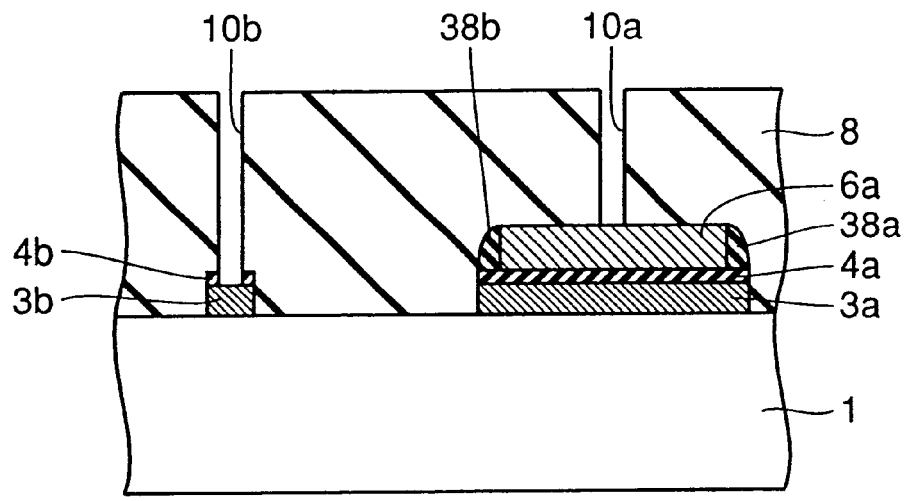

Resist film 9 is used as a mask to partially remove interlayer insulating film 8 and dielectric film 4b by anisotropic etching and accordingly contact holes 10a and 10b (see FIG. 33) are formed. Resist film 9 is thereafter removed. The structure as shown in FIG. 33 is accordingly obtained.

Figure 34:
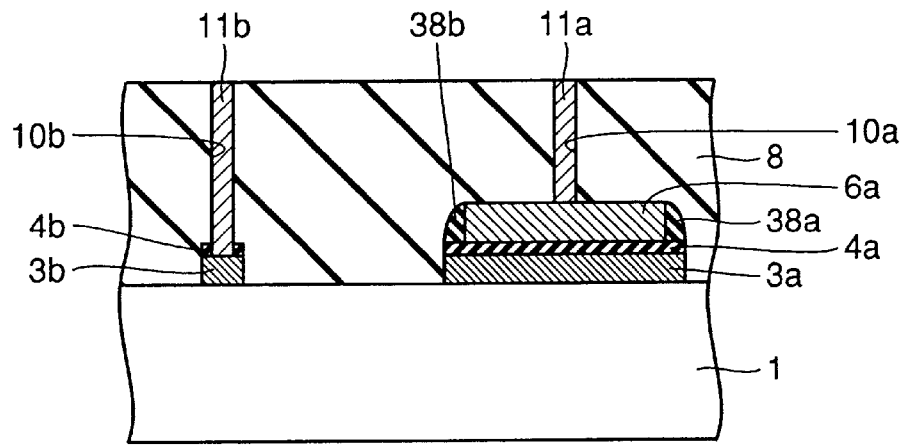

As the process shown in FIG. 26, a barrier metal film (not shown) located inside contact holes 10a and 10b and tungsten plugs 11a and 11b filling respective inner portions of contact holes 10a and 10b are formed. As a result, the structure as shown in FIG. 34 is achieved.

The semiconductor device shown in FIG. 27 can be obtained by depositing upper-level interconnections 12a and 12b (FIG. 27) on tungsten plugs 11a and 11b respectively in a similar manner to that of the third embodiment.

Fifth Embodiment

A fifth embodiment of a semiconductor device according to the invention is described below in conjunction with FIG. 35.

Figure 35:
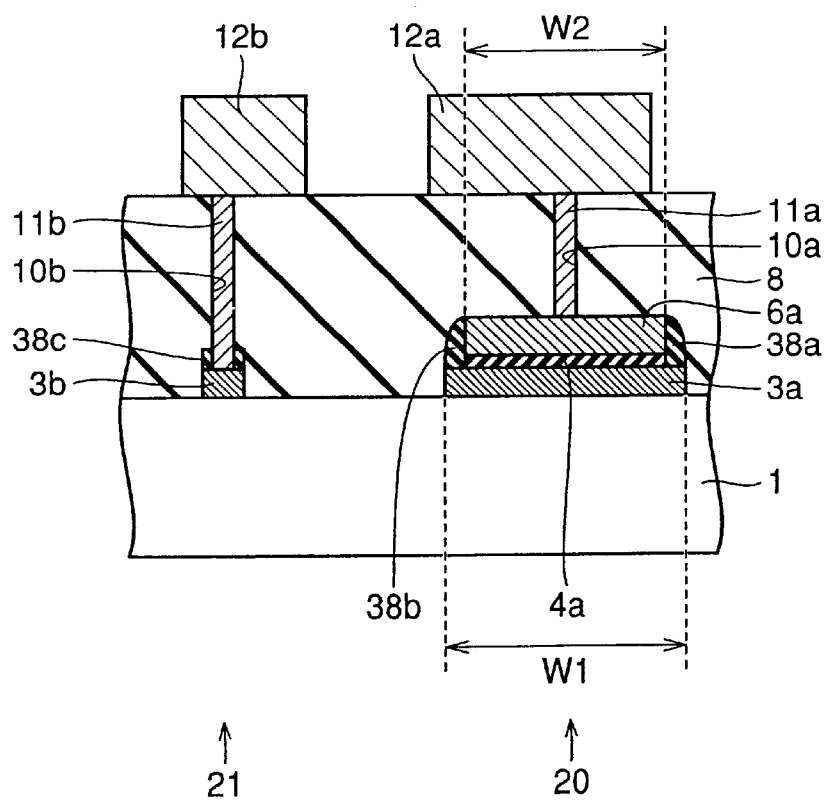
FIG. 35 is a schematic cross section showing a fifth embodiment of a semiconductor device according to the invention.

Referring to FIG. 35, the semiconductor device shown has its structure basically similar to that of the semiconductor device shown in FIG. 27. The semiconductor device in FIG. 35 is different from that in FIG. 27 in that sidewall films 38a and 38b are formed on the sidewalls of an upper electrode 6a and a capacitor dielectric film 4a. Further, an insulating film 38c remains on a first-level interconnection 3b that is formed of a layer at the same level as that of sidewall films 38a and 38b. Sidewall films 38a and 38b and insulating film 38c are formed of a silicon oxynitride film. These films are formed of a layer of the same level, which means that sidewall films 38a and 38b and insulating films 38c are obtained by processing a single insulating film 38 (see FIG. 37).

The semiconductor device shown in FIG. 35 also provides an effect similar to that of the fourth embodiment of the semiconductor device according to the invention.

The silicon oxynitride film constituting sidewall films 38a and 38b and insulating film 38c functions as ARC (Anti Reflection Coat). Then, the silicon oxynitride film constituting sidewall films 38a and 38b and insulating film 38c can be employed as ARC for a resist film used for producing the first-level interconnection 3b.

A method of manufacturing the semiconductor device shown in FIG. 35 is discussed below in conjunction with FIGS. 36–43.

Figure 36:
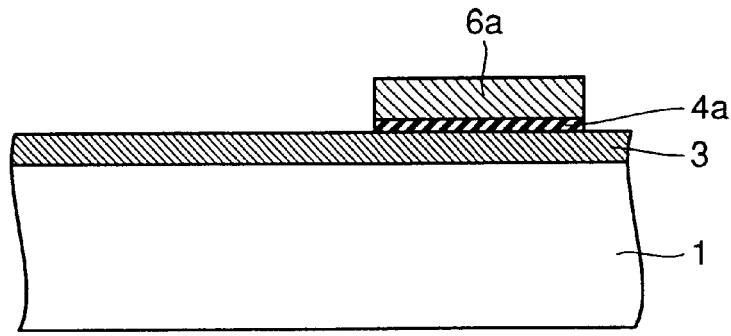
FIGS. 36–43 are schematic cross sections respectively illustrating first to eighth steps of manufacturing the semiconductor device shown in FIG. 35.

Process steps are performed that are similar to those of the manufacturing method of the semiconductor device according to the third embodiment shown in FIGS. 19 and 20. A resist film 5a (see FIG. 20) is used as a mask to partially remove a metal film 6 and a dielectric film 4 (see FIG. 20) thereby produce an upper electrode 6a and a capacitor dielectric film 4a (see FIG. 36). Resist film 5a is thereafter removed. The structure as shown in FIG. 36 is thus obtained.

Figure 37:
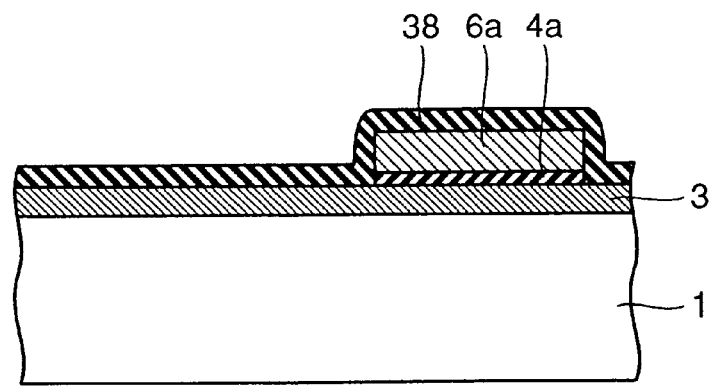

As shown in FIG. 37, an insulating film 38 is formed on upper electrode 6a and the upper surface of lower-level metal film 3. A silicon oxynitride film is employed as insulating film 38.

Figure 38:
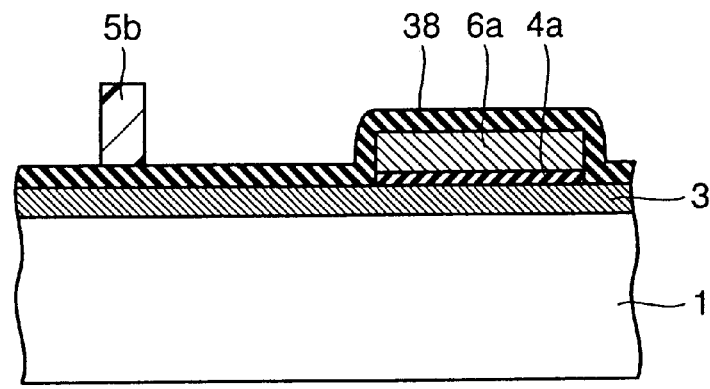

As shown in FIG. 38, a resist film 5b is formed on insulating film 38 on a region where the first-level interconnection 3b (see FIG. 35) should be formed.

Here, the silicon oxynitride film serves as ARC as discussed above. Therefore, a separately prepared ARC for resist film 5b can be made unnecessary by forming insulating film 38 made of the silicon oxynitride film that extends from the portion on upper electrode 6a to the region where the first-level interconnection 3b should be formed so as to form sidewall films 38a and 38b and depositing resist film 5b on the silicon oxynitride film. The manufacturing process can thus be simplified.

Figure 39:
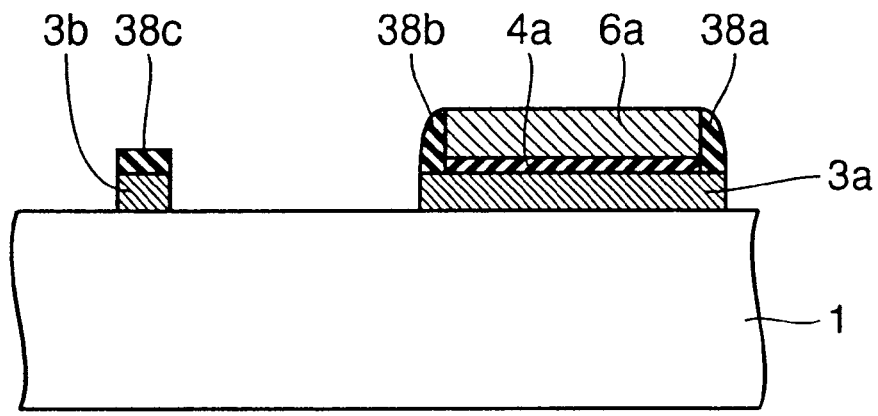

Resist film 5b is used as a mask to partially remove insulating film 38 by anisotropic etching and accordingly an insulating film 38c is formed. At this time, sidewall films 38a and 38b (see FIG. 39) are also formed on the sidewalls of upper electrode 6a and capacitor dielectric film 4a. Resist film 5b is thereafter removed. Upper electrode 6a, sidewall films 38a and 38b and insulating film 38c are used as a mask to partially remove lower-level metal film 3 by anisotropic etching. In this way, the structure as shown in FIG. 39 is obtained. This anisotropic etching produces lower electrode 3a and the first-level interconnection 3b.

Figure 40:
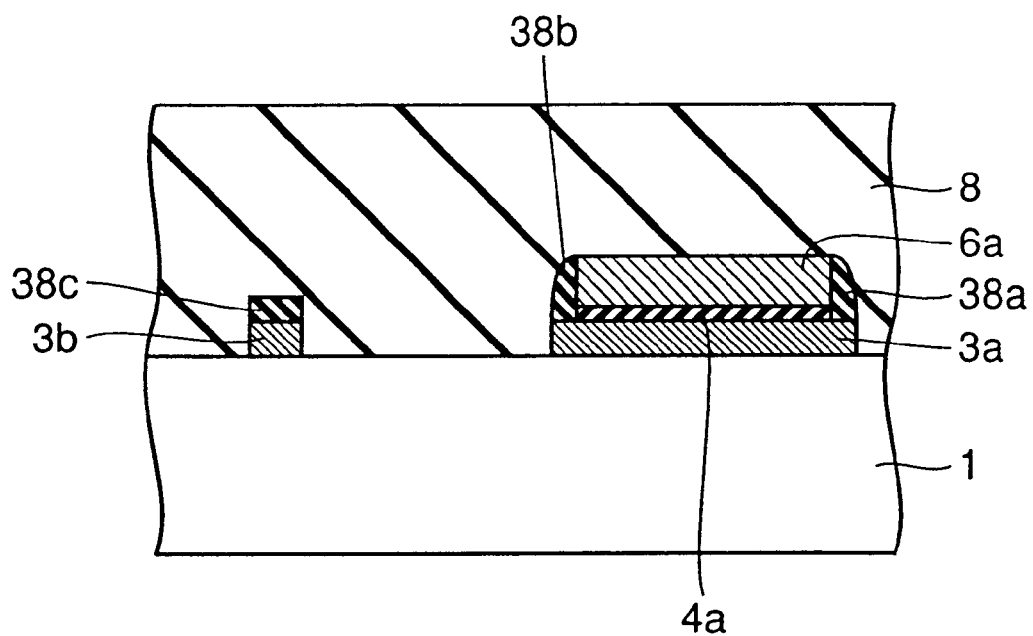

Referring to FIG. 40, an interlayer insulating film 8 is formed on upper electrode 6a, sidewall films 38a and 38b and insulating film 38c. The upper surface of interlayer insulating film 8 is planarized by means of CMP or the like.

Figure 41:
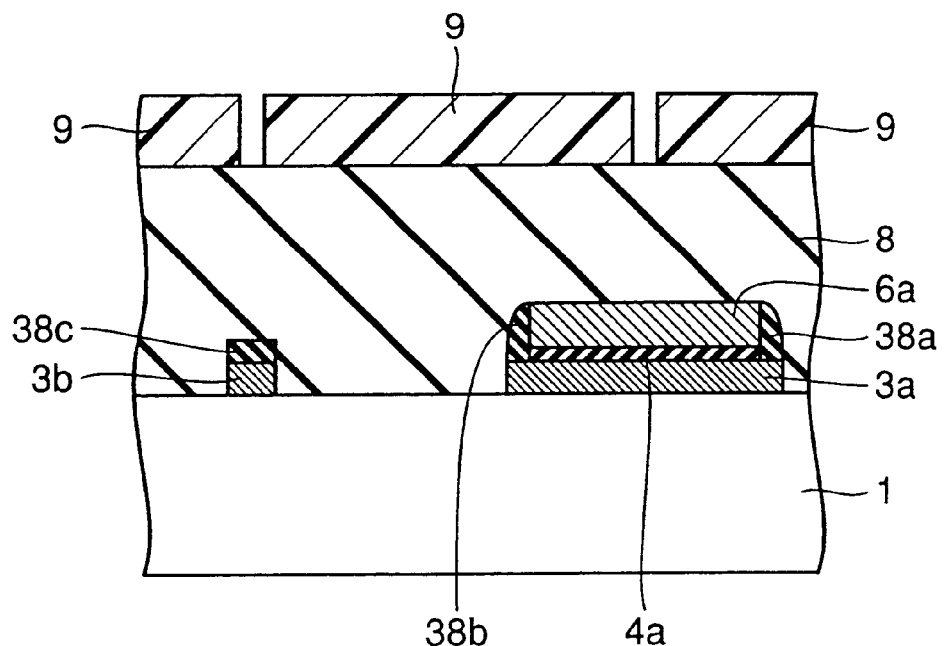

As shown in FIG. 41, a resist film 9 is formed on the upper surface of interlayer insulating film 8 as done in the step shown in FIG. 32.

Figure 42:
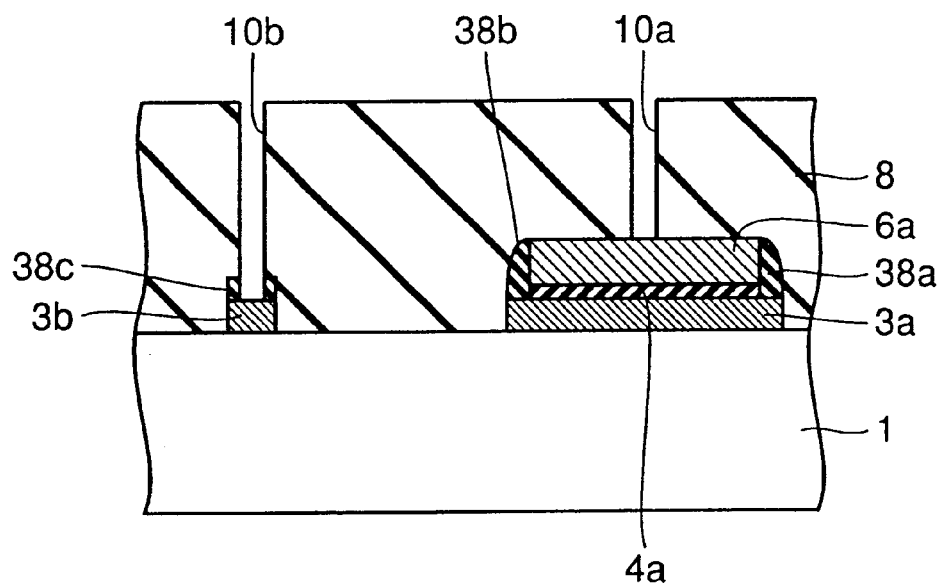

Resist film 9 is used as a mask to partially remove interlayer insulating film 8 and insulating film 38c through anisotropic etching thereby form contact holes 10a and 10b (see FIG. 42). Resist film 9 is thereafter removed. In this way, the structure as shown in FIG. 42 is achieved.

Figure 43:
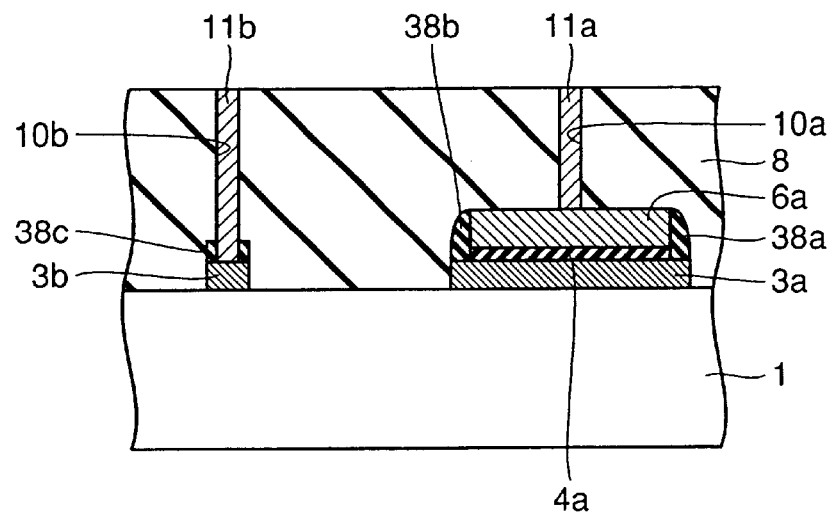

Referring to FIG. 43, a barrier metal film (not shown) located inside contact holes 10a and 10b as well as tungsten plugs 11a and 11b located to fill respective inner portions of contact holes 10a and 10b are formed in a manner similar to that of the manufacturing method of the semiconductor device according to the fourth embodiment of the invention shown in FIG. 34.

Upper-level interconnections 12a and 12b (see FIG. 35) are formed on tungsten plugs 11a and 11b respectively so that the semiconductor device as shown in FIG. 35 is produced.

Sixth Embodiment

Figure 44:
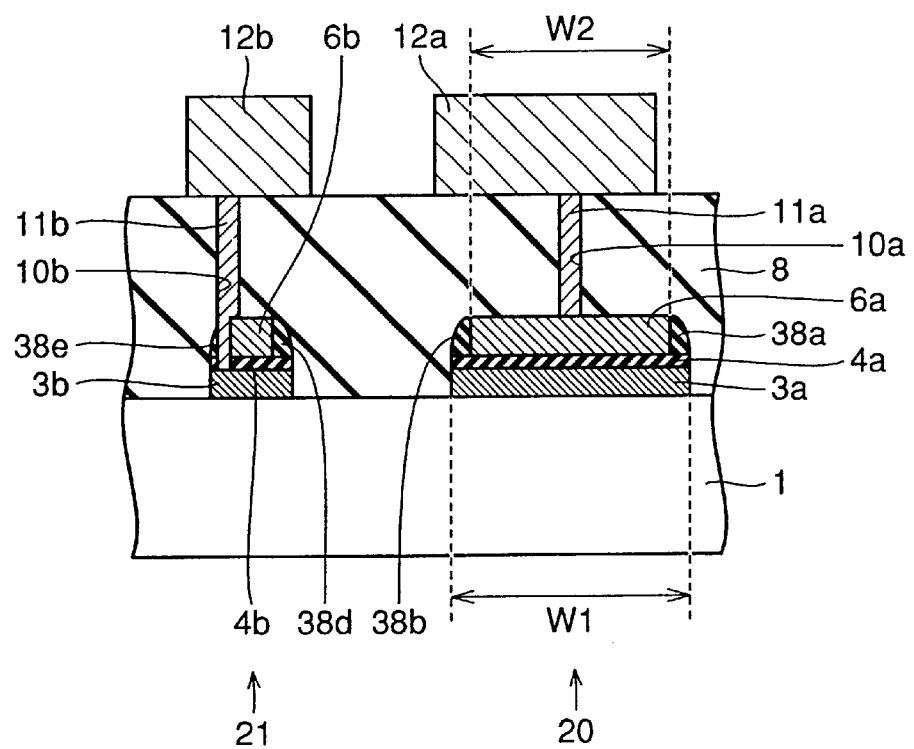
FIG. 44 is a schematic cross section showing a sixth embodiment of a semiconductor device according to the invention.
Figure 45:
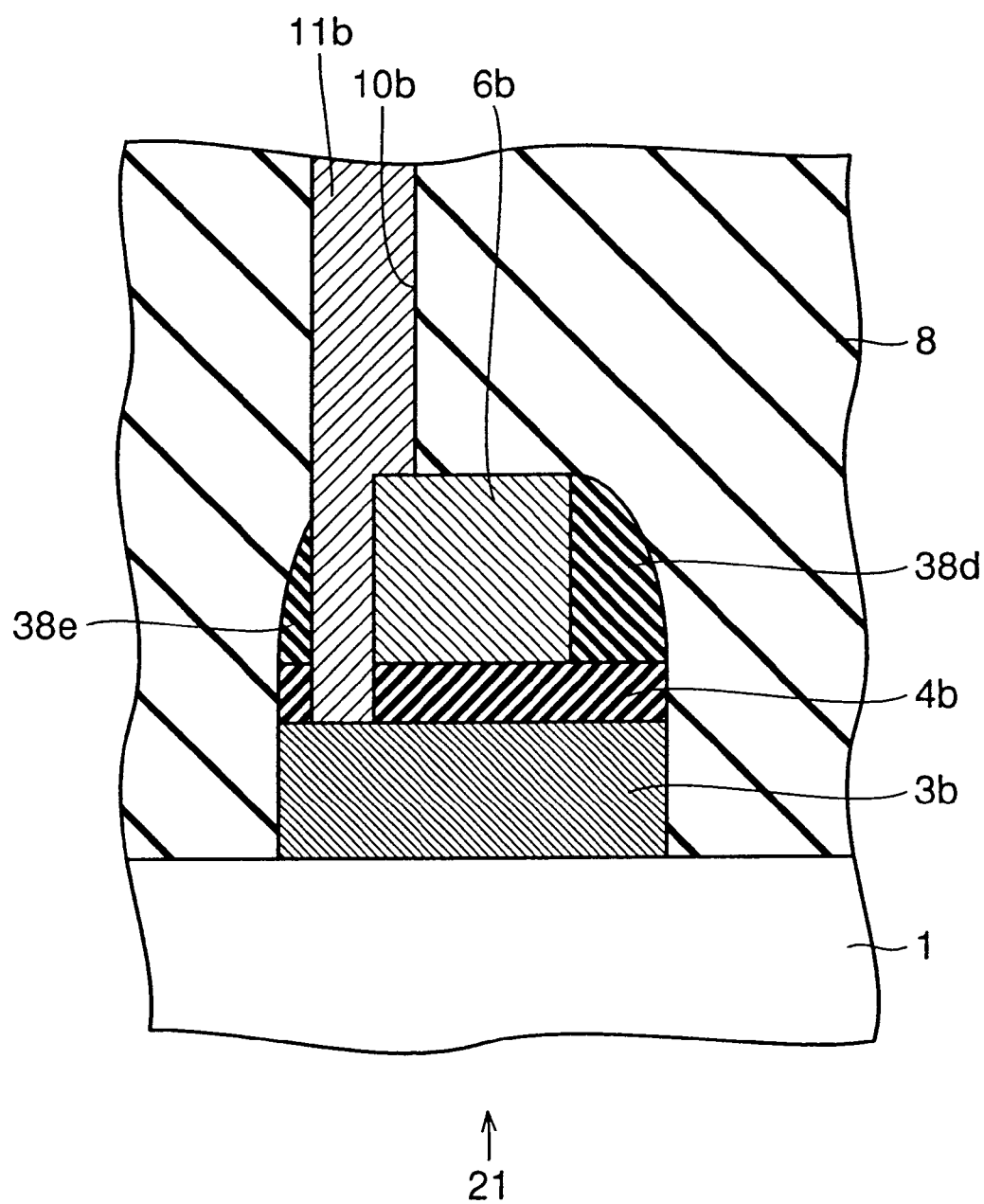
FIG. 45 is a partially enlarged cross section showing an interconnection portion 21 in FIG. 44.

A sixth embodiment of a semiconductor device according to the invention is described in conjunction with FIGS. 44 and 45.

Referring to FIGS. 44 and 45, the semiconductor device has its structure basically similar to that of the semiconductor device shown in FIG. 27. The semiconductor device shown in FIGS. 44 and 45 is different in the structure of interconnection portion 21 from that of the semiconductor device shown in FIG. 27. Specifically, the semiconductor device shown in FIGS. 44 and 45 includes an interconnection portion 21 including a dielectric film 4b provided on a first-level interconnection 3b. An upper interconnection 6b formed of a layer of the same level as that of upper electrode 6a is provided on dielectric film 4b. Sidewall films 38d and 38e are formed on the sidewalls of upper interconnection 6b. The first-level interconnection 3b and upper interconnection 6b are electrically connected by a barrier metal film (not shown) and tungsten plug 11b filling the inside of contact hole 10b so as to function as one interconnection. More specifically, contact hole 10b has its sidewall having its part where the upper surface and the sidewall surface of upper interconnection 6b are exposed and its bottom wall where the upper surface of the first-level interconnection 3b is partially exposed. The barrier metal film and tungsten plug 11b are electrically connected respectively to the upper surface of the first-level interconnection 3b and the upper surface and the sidewall surface of upper interconnection 6b. As shown in FIG. 45, contact hole 10b extends through sidewall film 38e and dielectric film 4b to reach the upper surface of the first level interconnection 3b.

The semiconductor device shown in FIGS. 44 and 45 can thus achieve an effect similar to that of the first embodiment of the semiconductor device according to the invention.

In the process step of forming a capacitor in the vertical direction that is formed of lower electrode 3a, capacitor dielectric film 4a and upper electrode 6a, an interconnection can be formed simultaneously with formation of the capacitor, the interconnection being constructed of upper interconnection 6b as an upper interconnection part and the first-level interconnection 3b as a lower interconnection part. Tungsten plug 11b as a conductive film can be used to electrically connect upper interconnection 6b and the first-level interconnection 3b thereby utilize upper interconnection 6b and the first-level interconnection 3b as one interconnection.

A method of manufacturing the semiconductor device shown in FIGS. 44 and 45 is described in conjunction with FIGS. 46–54.

Figure 46:
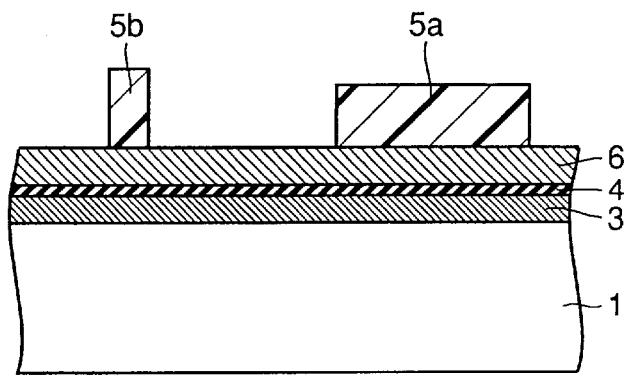
FIGS. 46–54 are schematic cross sections respectively illustrating first to ninth steps of manufacturing the semiconductor device shown in FIGS. 44 and 45.

After the process steps shown in FIG. 19, resist films 5a and 5b are formed on metal film 6 as shown in FIG. 46.

Figure 47:
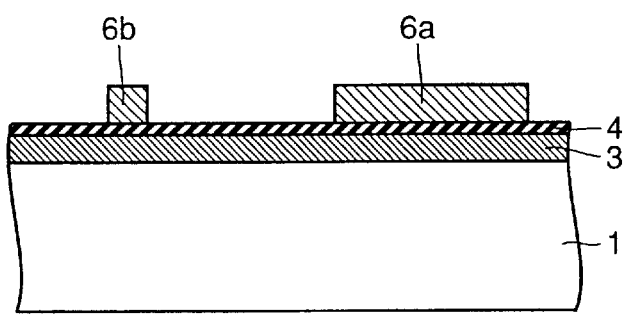

Resist films 5a and 5b are used as a mask to partially remove metal film 6 by anisotropic etching. Resist films 5a and 5b are thereafter removed. As shown in FIG. 47, upper electrode 6a and upper interconnection 6b are fabricated.

Figure 48:
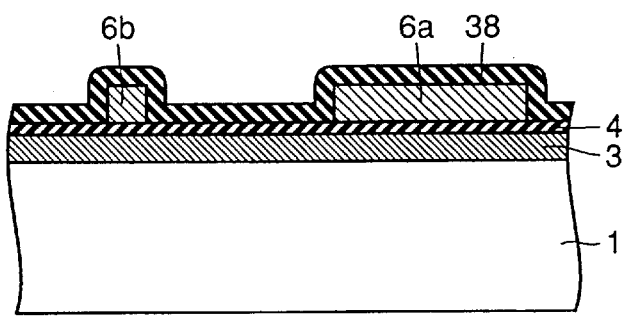
Figure 49:
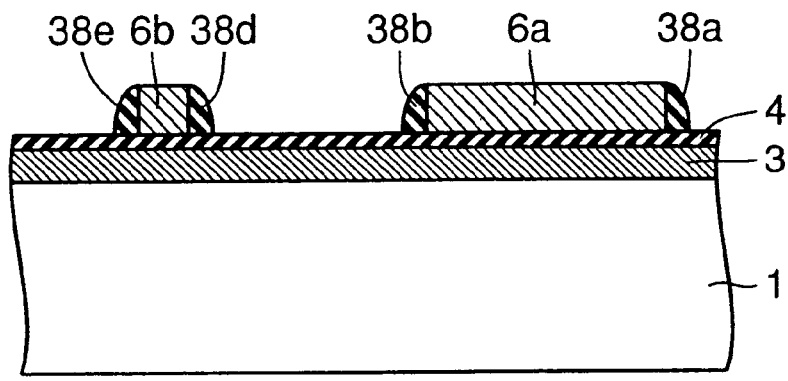

As shown in FIG. 48, insulating film 38 is formed on upper electrode 6a, upper interconnection 6b and dielectric film 4.

Insulating film 38 is partially removed by anisotropic etching to form sidewall films 38a and 38b located on the sidewalls of upper electrode 6a and sidewall films 38d and 38e located on the sidewalls of upper interconnection 6b.

Figure 50:
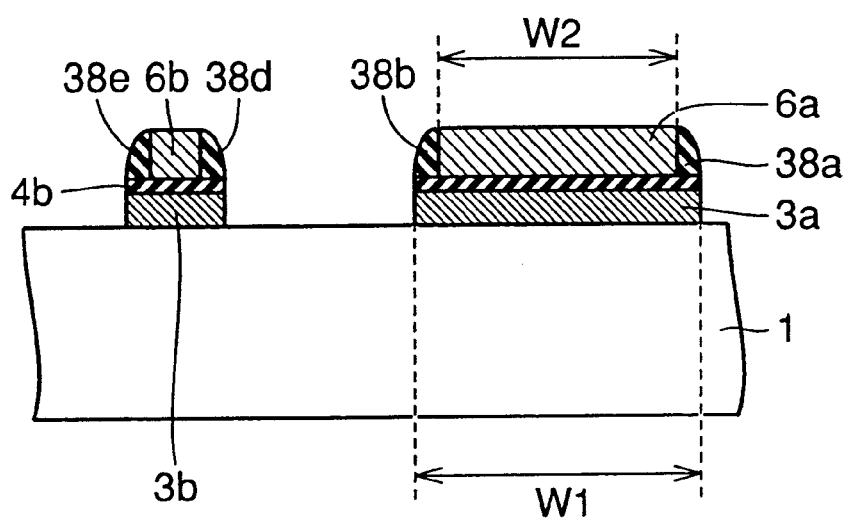

Upper electrode 6a, upper interconnection 6b and sidewall films 38a, 38b, 38d and 38e are used as a mask to partially remove dielectric film 4 and lower-level metal film 3 by means of anisotropic etching. Consequently, lower electrode 3a, capacitor dielectric film 4a, the first-level interconnection 3b and dielectric film 4b are formed as shown in FIG. 50. The presence of sidewall films 38a and 38b allows width W1 of lower electrode 3a to be greater than width W2 of upper electrode 6a. Further, the first-level interconnection 3b has its width greater than that of upper interconnection 6b.

Figure 51:
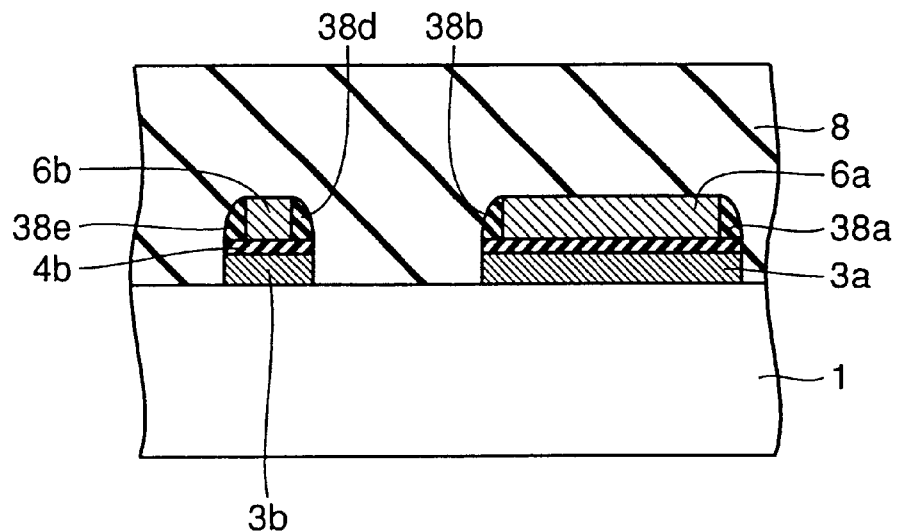

As shown in FIG. 51, interlayer insulating film 8 is formed on upper electrode 6a and upper interconnection 6b. Interlayer insulating film 8 has its upper surface planarized by means of CMP or the like.

Figure 52:
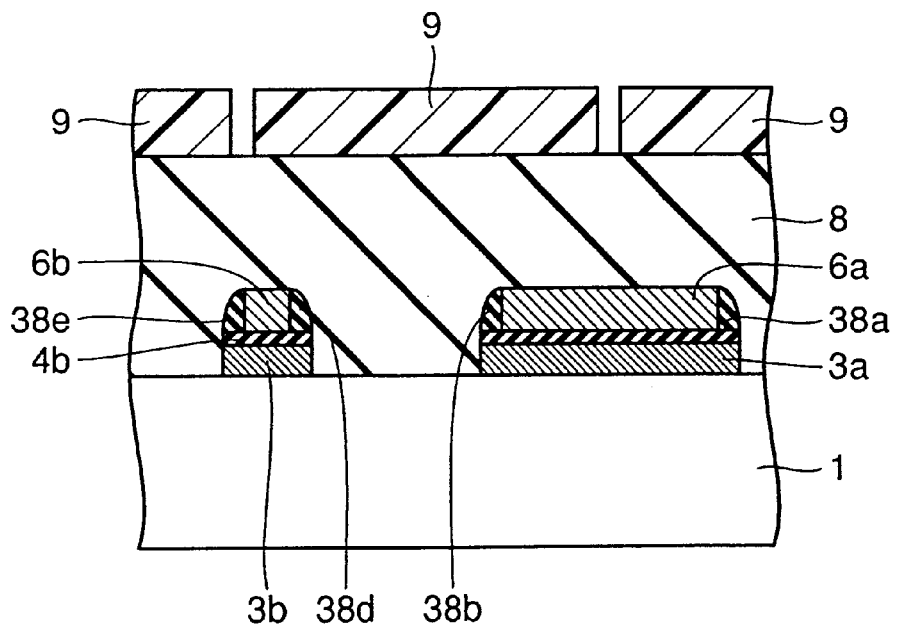
Figure 53:
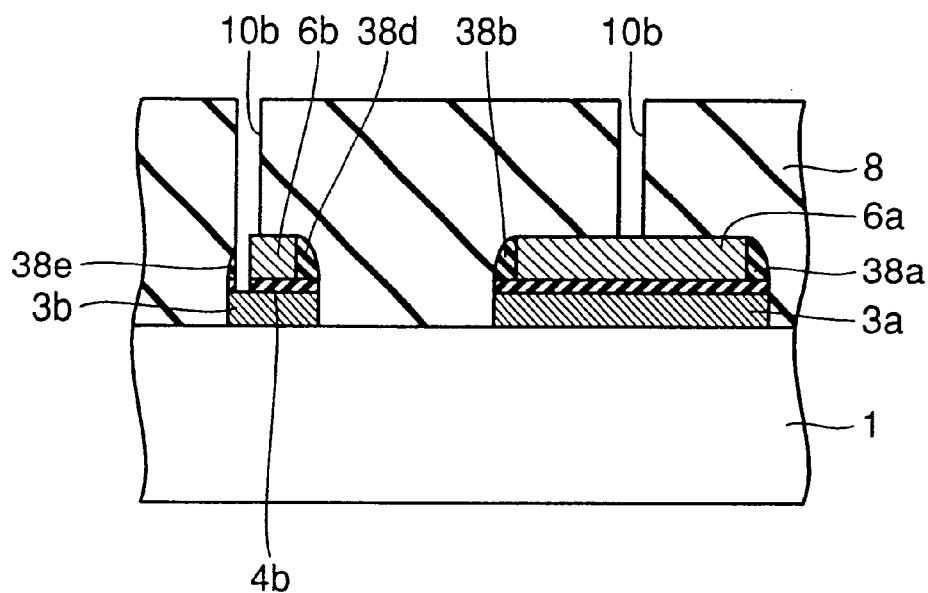

As shown in FIG. 52, a resist film 9 is formed on the upper surface of interlayer insulating film 8. Resist film 9 is used as a mask to partially remove interlayer insulating film 8, sidewall film 38e and dielectric film 4b by anisotropic etching and accordingly contact holes 10a and 10b (see FIG. 53) are formed. Resist film 9 is thereafter removed. Accordingly, the structure as shown in FIG. 53 is achieved.

At this time, contact hole 10b has its sidewall where a part of the upper surface as well as the sidewall surface of upper interconnection 6b are exposed. Simultaneously, the upper surface of the first-level interconnection 3b is partially exposed on the bottom of contact hole 10b.

Figure 54:
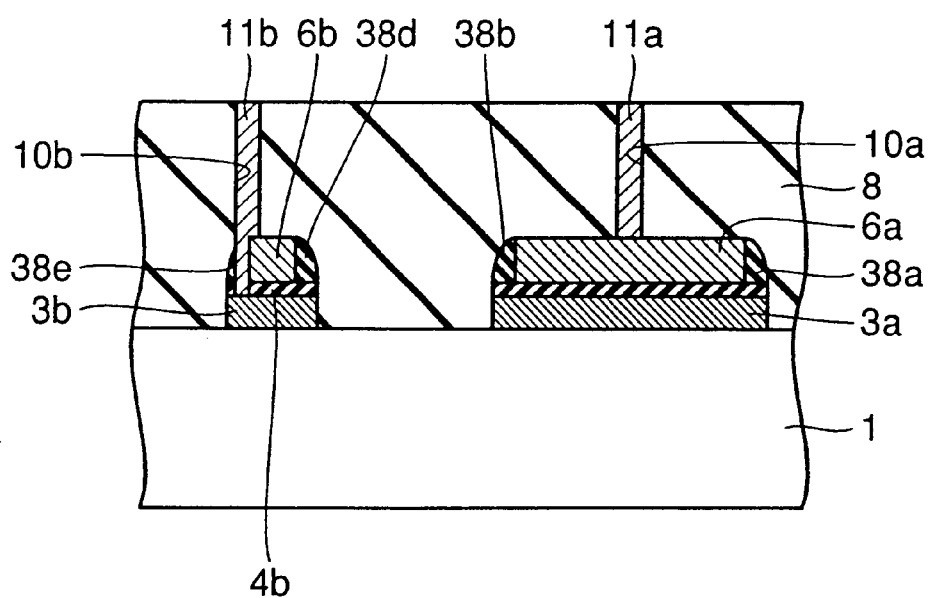

Referring to FIG. 54, a barrier metal film (not shown) and tungsten plugs 11a and 11b filling respectively the inside of contact holes 10a and 10b are formed in a manner similar to the step shown in FIG. 43.

As discussed above, in the step of forming a capacitor of vertical type that is constituted of lower electrode 3a, capacitor dielectric film 4a and upper electrode 6a, an interconnection can be produced simultaneously with the formation of the capacitor, the interconnection including upper interconnection 6b and the first-level interconnection 3b connected electrically by tungsten plug 11b as a conductor.

Upper-level interconnections 12a and 12b (see FIG. 44) are thereafter formed to achieve the semiconductor device as shown in FIGS. 44 and 45.

Seventh Embodiment

Figure 55:
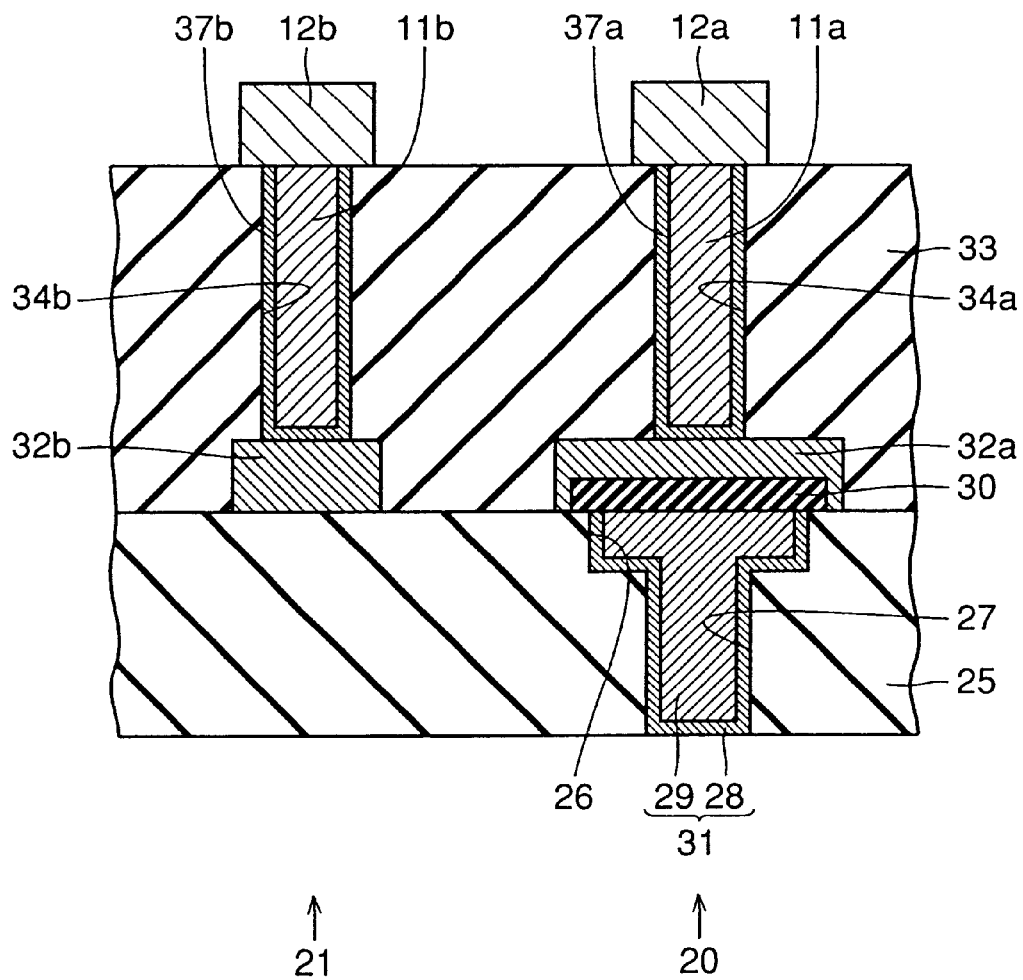
FIG. 55 is a schematic cross section showing a seventh embodiment of a semiconductor device according to the invention.

A seventh embodiment of a semiconductor device according to the present invention is described in conjunction with FIG. 55.

Referring to FIG. 55, the semiconductor device includes a capacitor portion 20 and an interconnection portion 21. Capacitor portion 20 includes a via hole 27 and a trench 26 connected to the upper part of via hole 27 that are formed in an interlayer insulating film 25 deposited on a semiconductor substrate (not shown). A barrier metal film 28 is deposited on the walls of trench 26 and via hole 27. On barrier metal film 28, a metal film 29 is formed to fill trench 26 and via hole 27. As a material for barrier metal film 28, titanium nitride (TiN) can be employed. As a material for metal film 29, tungsten may be used for example. Barrier metal film 28 and the metal film 29 serve as a lower electrode 31 of the capacitor. The position of the upper surface of barrier metal film 28 and metal film 29 is almost identical to that of interlayer insulating film 25. Lower electrode 31 is fabricated by means of so-called dual damascene process.

A capacitor dielectric film 30 is deposited on lower electrode 31. An upper electrode 32a formed of a metal film is deposited to cover capacitor dielectric film 30. On upper electrode 32a formed of the metal film, an interlayer insulating film 33 is formed. A contact hole 34a is formed in interlayer insulating film 33 in the region located on upper electrode 32a. A barrier metal film 37a is formed on the wall of contact hole 34a. On barrier metal film 37a, a tungsten plug 11a is formed to fill contact hole 34a. An upper-level interconnection 12a is formed on tungsten plug 11a.

Interconnection portion 21 includes an interconnection 32b formed of a metal film and of a layer at the same level as that of upper electrode 32a on interlayer insulating film 25. On interconnection 32b, interlayer insulating film 33 is formed. A contact hole 34b is formed in interlayer insulating film 33 in the region located on interconnection 32b. A barrier metal film 37b is formed on the wall of contact hole 34b. A tungsten plug 11b is formed on barrier metal film 37b to fill the inside of contact hole 34b. An upper-level interconnection 12b is formed on tungsten plug 11b.

A capacitor in the vertical direction can thus be produced by depositing in the vertical direction lower electrode 31 as a capacitor lower electrode, capacitor dielectric film 30, and upper electrode 32a as a capacitor upper electrode. Then, as the semiconductor device according to the first embodiment, a certain capacitance can be secured while the surface area of upper electrode 32a and lower electrode 31 can further be reduced by providing a smaller thickness of the dielectric film and accordingly the capacitor can be reduced in size compared with the conventional capacitor.

In addition, the lower electrode has a so-called damascene structure where the electrode fills the inside of the trench of the interlayer insulating film. Therefore, for a semiconductor device employing a damascene interconnection as its interconnection, such an interconnection can partially be used as lower electrode 31. For this type of semiconductor device employing the damascene interconnection, a capacitor of vertical type can readily be implemented.

Since lower electrode 31 and upper electrode 32a contain metal films, a capacitor with a high precision and a less voltage-dependency can be achieved compared with the semiconductor device using semiconductor such as polysilicon as the capacitor electrode.

A method of manufacturing the semiconductor device shown in FIG. 55 is discussed below in conjunction with FIGS. 56–60.

Figure 56:
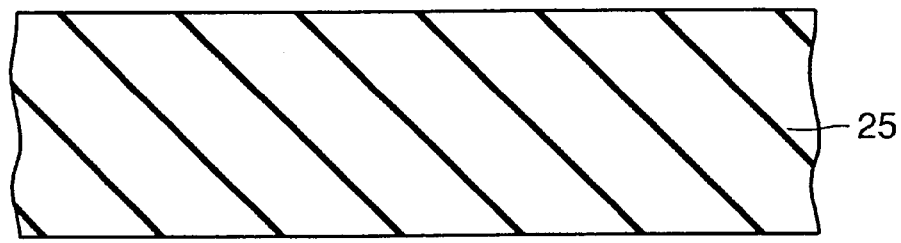
FIGS. 56–60 are schematic cross sections respectively illustrating first to fifth steps of manufacturing the semiconductor device shown in FIG. 55.

Referring to FIG. 56, interlayer insulating film 25 is formed on the semiconductor substrate (not shown).

Figure 57:
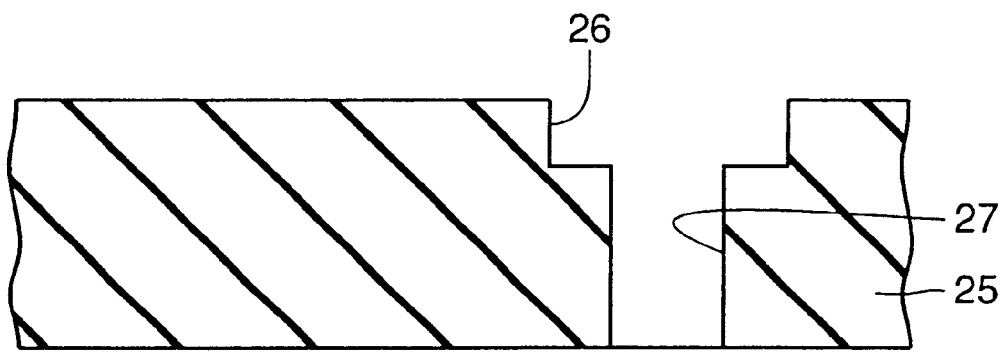

Referring to FIG. 57, trench 26 and via hole 27 connected to trench 26 are formed in interlayer insulating film 25 for conducting dual damascene method.

A barrier metal film (not shown) is deposited by means of sputtering, CVD or the like to extend from the portion on the wall of trench 26 and via hole 27 to the portion on the upper surface of interlayer insulating film 25.

Figure 58:
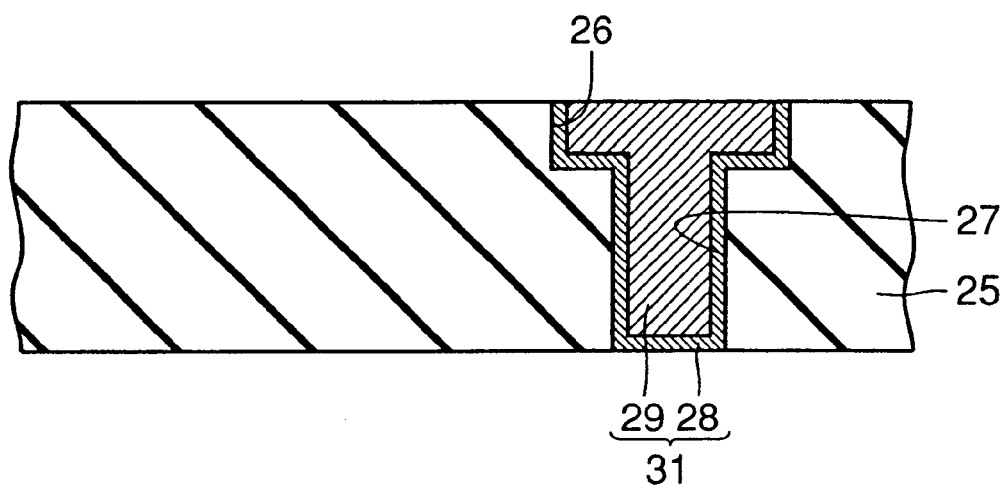

On this barrier metal film, a metal film (not shown) such as tungsten is deposited by means of sputtering, CVD or the like that fills the inside of trench 26 and via hole 27 and extends to the part on the upper surface of interlayer insulating film 25. After this, by means of CMP, the metal film and the barrier metal film located on the upper surface of interlayer insulating film 25 are removed. In this way, as shown in FIG. 58, barrier metal film 28 and metal film 29 are formed. Barrier metal film 28 and metal film 29 constitute lower electrode 31 of the capacitor.

Figure 59:
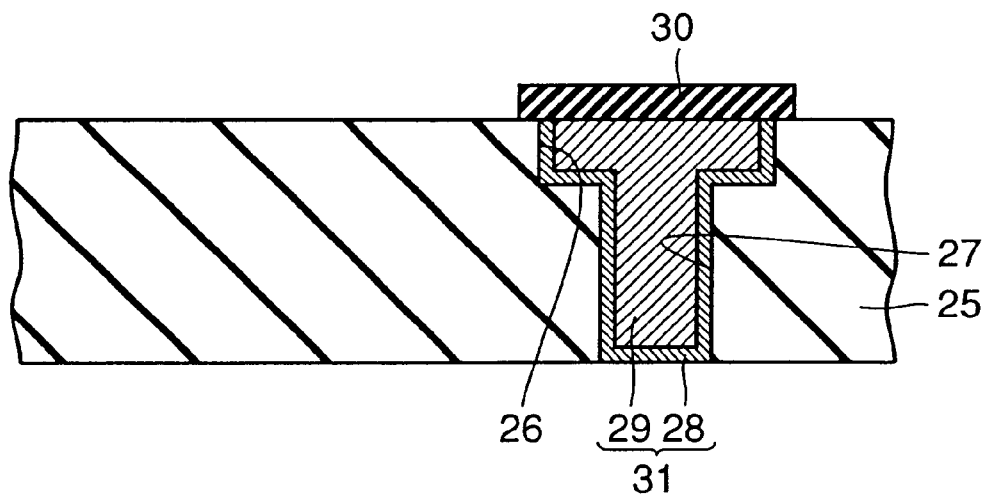
Figure 60:
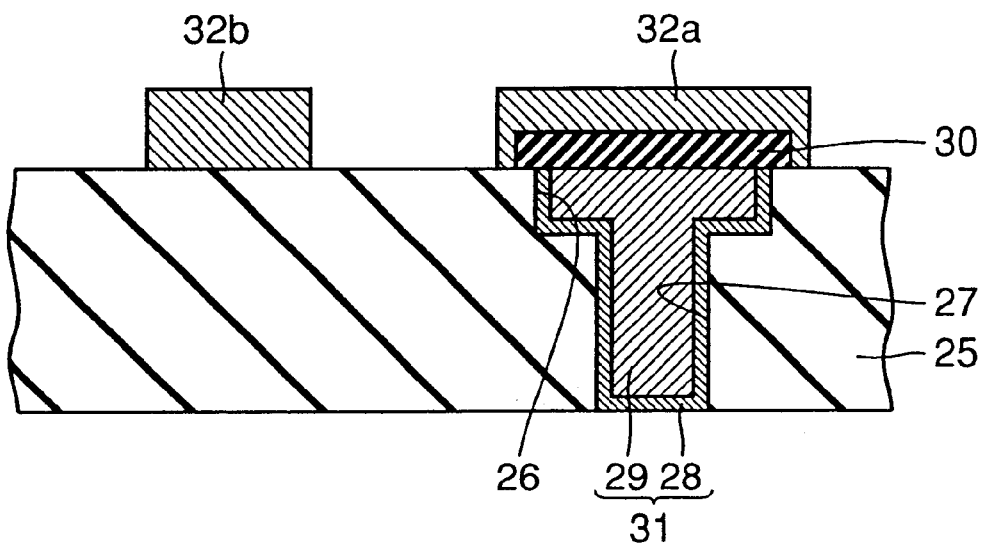

A dielectric film (not shown) is deposited to extend from the part on metal film 29 to the part on the upper surface of interlayer insulating film 25. As this dielectric film, a silicon oxide film may be employed that is deposited by means of CVD or the like. The silicon oxide film functioning as a dielectric film has a thickness of approximately 30 nm. A resist film (not shown) is thereafter deposited on the dielectric film by means of photolithography. This resist film is used as a mask to partially remove the dielectric film. The resist film is then removed. Consequently, capacitor dielectric film 30 is formed that is located on lower electrode 31 as shown in FIG. 59.

A metal film (not shown) is thereafter formed that extends from the part on capacitor dielectric film 30 to the part on the upper surface of interlayer insulating film 25. As this metal film, an aluminum film may be employed that is deposited by means of sputtering. On the metal film such as the aluminum film, a resist film (not shown) is formed by means of photolithography. This resist film is used as a mask to partially remove the metal film through anisotropic etching. The resist film is then removed. Accordingly, interconnection 32b and upper electrode 32a formed of the metal film are formed. Here, capacitor dielectric film 30 has its width greater than that of lower electrode 31. Further, upper electrode 32a has its width greater than that of capacitor dielectric film 30.

Interlayer insulating film 33 (see FIG. 55) is thereafter deposited on upper electrode 32a and interconnection 32b. A resist film (not shown) is formed on interlayer insulating film 33. This resist film is used as a mask to partially remove interlayer insulating film 33 by anisotropic etching thereby form contact holes 34a and 34b (see FIG. 55). A barrier metal film (not shown) is formed that extends from the inside of contact holes 34a and 34b onto the upper surface of interlayer insulating film 33. A titanium nitride film for example may be employed as the barrier metal film that is deposited by means of sputtering, CVD or the like. On the barrier metal film, a tungsten film (not shown) is formed that fills the inside of contact holes 34a and 34e and extends onto the upper surface of interlayer insulating film 33. The tungsten film and the barrier metal film located on the upper surface of interlayer insulating film 33 are removed by means of CMP or the like. Accordingly, barrier metal films 37a and 37b and tungsten plugs 11a and 11b are formed in contact holes 34a and 34b. Upper-level interconnections 12a and 12b (see FIG. 55) are thereafter formed respectively on tungsten plugs 11a and 11b. The semiconductor device as shown in FIG. 55 having the capacitor in the vertical direction can thus be achieved.

Eighth Embodiment

Figure 61:
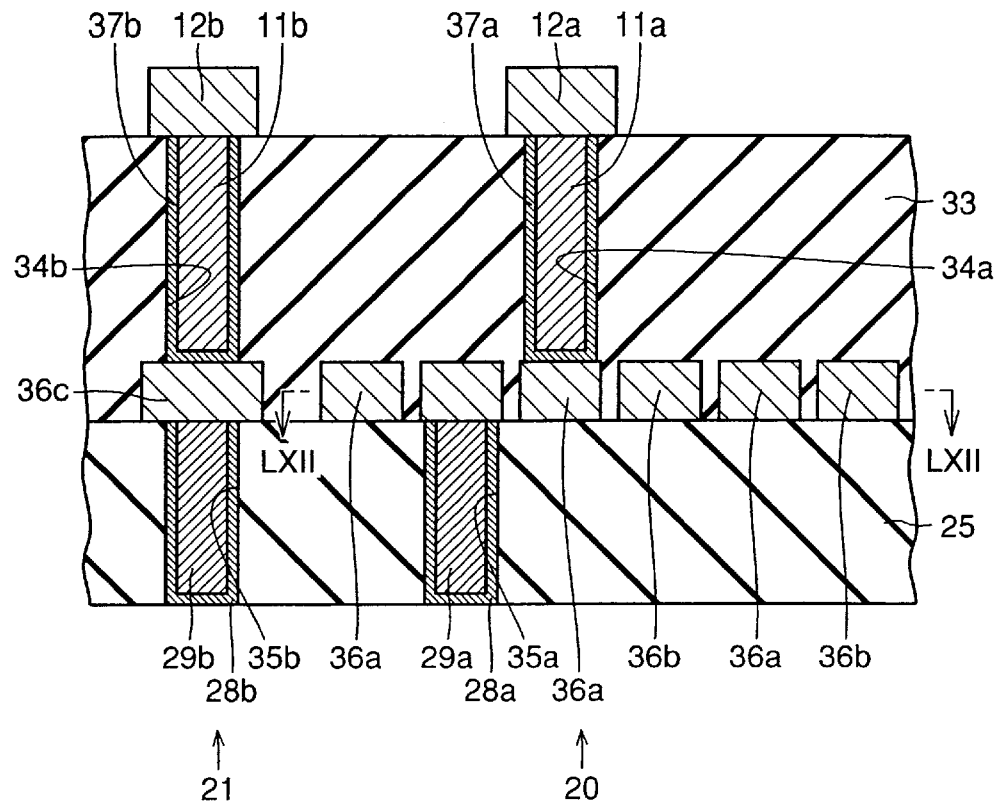
FIG. 61 is a schematic cross section showing an eighth embodiment of a semiconductor device according to the invention.
Figure 62:
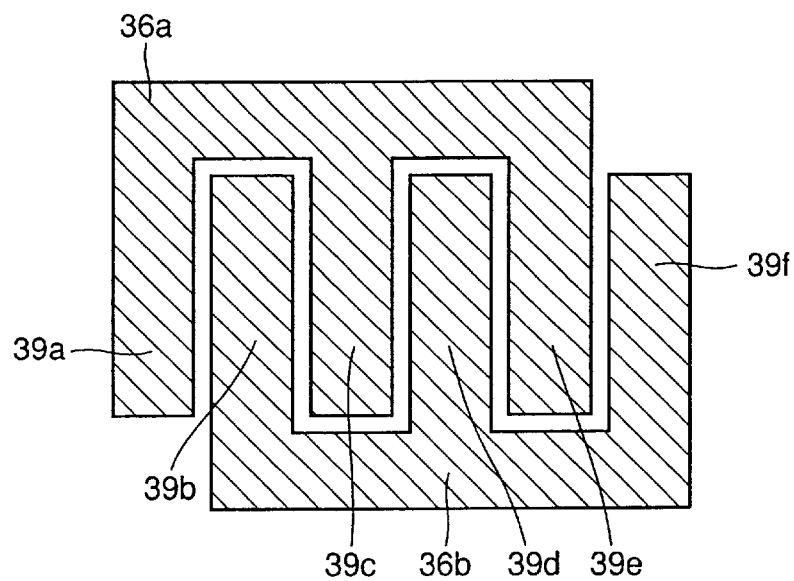
FIG. 62 is a plan view showing a horizontal cross section along line LXII—LXII in FIG. 61.

An eighth embodiment of a semiconductor device according to the invention is explained in conjunction with FIGS. 61 and 62.

Referring to FIGS. 61 and 62, the semiconductor device includes a capacitor portion 20 and an interconnection portion 21. Capacitor portion 20 includes one electrode 36a and the other electrode 36b formed on an interlayer insulating film 25. As seen from FIG. 62, one electrode 36a includes extensions 39a, 39c and 39e. The other electrode 36b includes extensions 39b, 39d and 39f. These extensions 39a–39f are arranged opposite to each other with a part of an interlayer insulating film 33 therebetween, which serves as a capacitor dielectric film. In the region located under the other electrode 36b, a contact hole 35a is formed in interlayer insulating film 25. A barrier metal film 28a and a metal film 29a are formed inside contact hole 35a. Metal film 29a is electrically connected to the other electrode 36b. A contact hole 34a is further formed in interlayer insulating film 33 in the region located on one electrode 36a. In contact hole 34a, a barrier metal film 37a and a tungsten plug 11a are formed. In the region located on tungsten plug 11a, an upper-level interconnection 12a is formed. Upper-level interconnection 12a and one electrode 36a are electrically connected via barrier metal film 37a and the tungsten plug 11.

Interconnection portion 21 includes a contact hole 35b formed in interlayer insulating film 25. A barrier metal film 28b and a metal film 29b are formed inside contact hole 35b. An interconnection 36c is formed in the region located on metal film 29b. Interconnection 36c is constituted of the layer at the same level as that of one electrode 36a and the other electrode 36b as understood from the manufacturing method discussed below. On interconnection 36c, a contact hole 34b is formed in interlayer insulating film 33. A barrier metal film 37b and a tungsten plug 11b are formed inside contact hole 34b. An upper-level interconnection 12b is formed on tungsten plug 1b.

Figure 89:
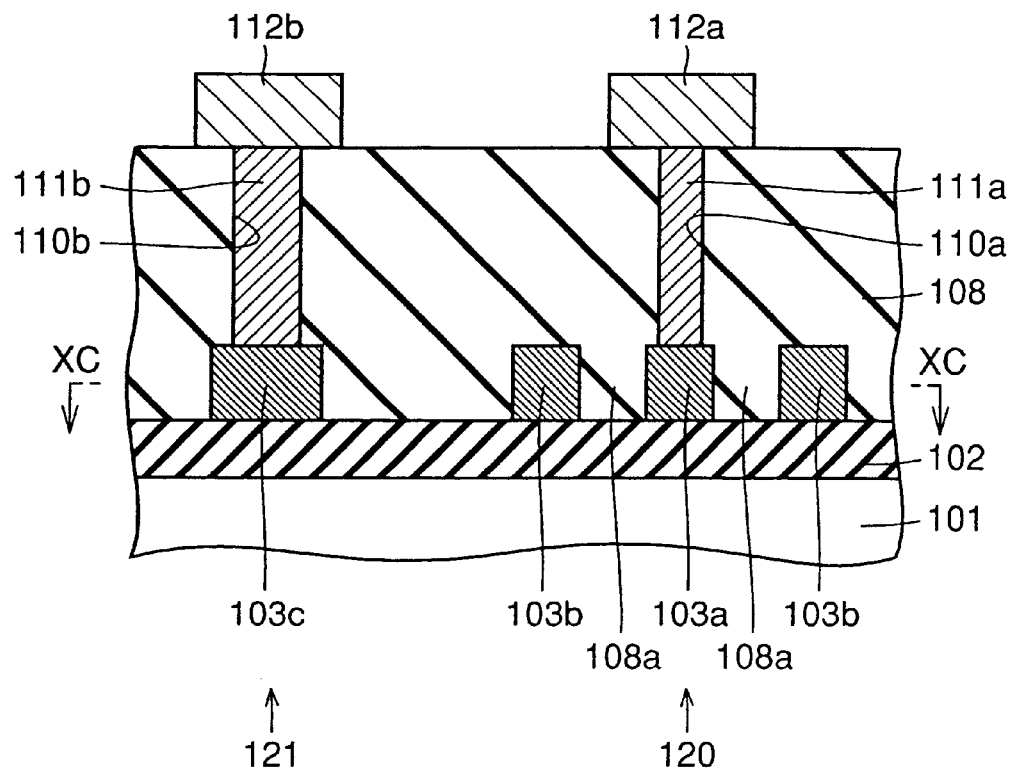
FIG. 89 is a schematic cross section showing a semiconductor device such as a conventional analog·digital LSI and the like including a capacitor portion where a capacitor is formed and an interconnection portion where an interconnection is formed.
Figure 90:
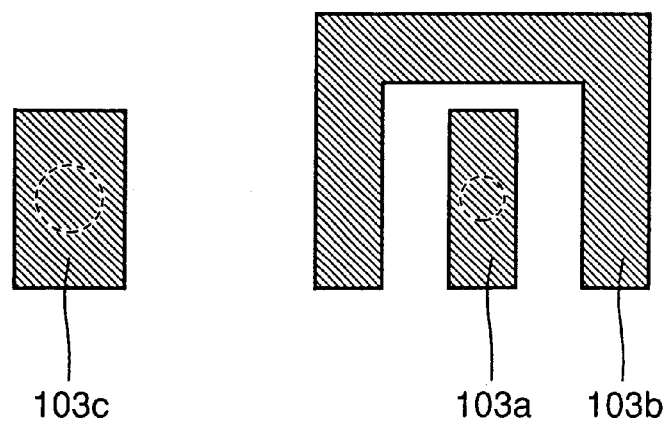
FIG. 90 is a schematic cross section along line XC—XC in FIG. 89.

In this way, extensions 39a, 39c and 39e as first and second extended portions and extensions 39b, 39d and 39f as third and fourth extended portions are interleaved. Therefore, sidewalls opposite to each other of extensions 39a–39f of one electrode 36a as one capacitor electrode and the other electrode 36b as the other capacitor electrode can be utilized as electrode surfaces of the capacitor. Specifically, almost all the sidewall surfaces of extensions 39b–39e can be employed as capacitor electrode surfaces. The volume of the region occupied by the capacitor can thus be decreased compared with the semiconductor device as shown in FIGS. 89 and 90 having a plurality of conventional capacitors arranged for ensuring a certain capacitance.

A method of manufacturing the semiconductor device shown in FIGS. 61 and 62 is described in conjunction with FIGS. 63–67.

Figure 63:
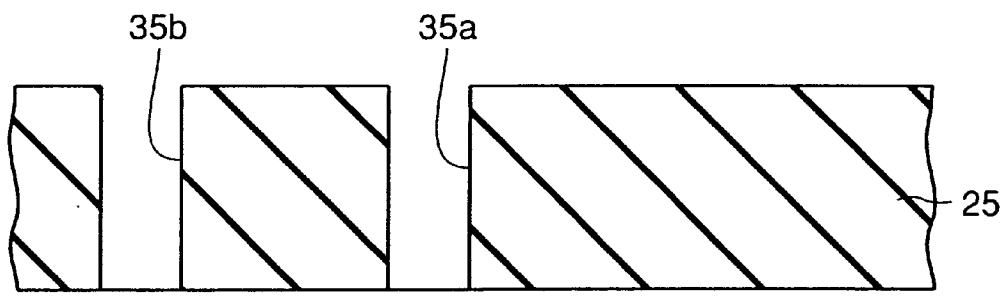
FIGS. 63–67 are schematic cross sections respectively illustrating first to fifth steps of manufacturing the semiconductor device shown in FIGS. 61 and 62.

Interlayer insulating film 25 (see FIG. 63) is formed on a semiconductor substrate (not shown). Interlayer insulating film 25 is deposited by means of CVD or the like. A resist film (not shown) is formed on interlayer insulating film 25 by photolithography. This resist film is used as a mask to remove a part of interlayer insulating film 25 by anisotropic etching to produce contact holes 35a and 35b (see FIG. 63). The resist film is thereafter removed. The structure as shown in FIG. 63 is thus obtained.

Figure 64:
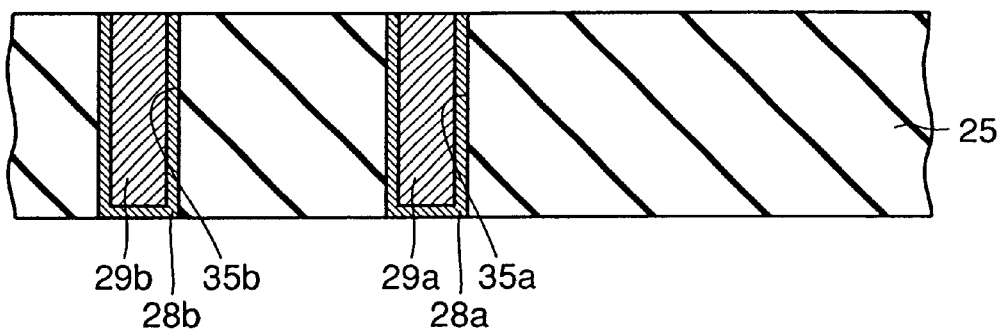

A barrier metal film (not shown) is formed that extends from the inside of contact holes 35a and 35b onto the upper surface of interlayer insulating film 25. A titanium nitride film deposited by means of sputtering, CVD or the like can be applicable to this barrier metal film. A metal film (not shown) is formed on the barrier metal film. The metal film is formed to fill the inside of contact holes 35a and 35b. Tungsten or the like can be used as a material for the metal film. The metal film and the barrier metal film located on the upper surface of interlayer insulating film 25 are removed by means of CMP or the like. In this way, barrier metal films 28a and 28b and metal films 29a and 29b are formed within contact holes 35a and 35b as shown in FIG. 64.

Figure 65:
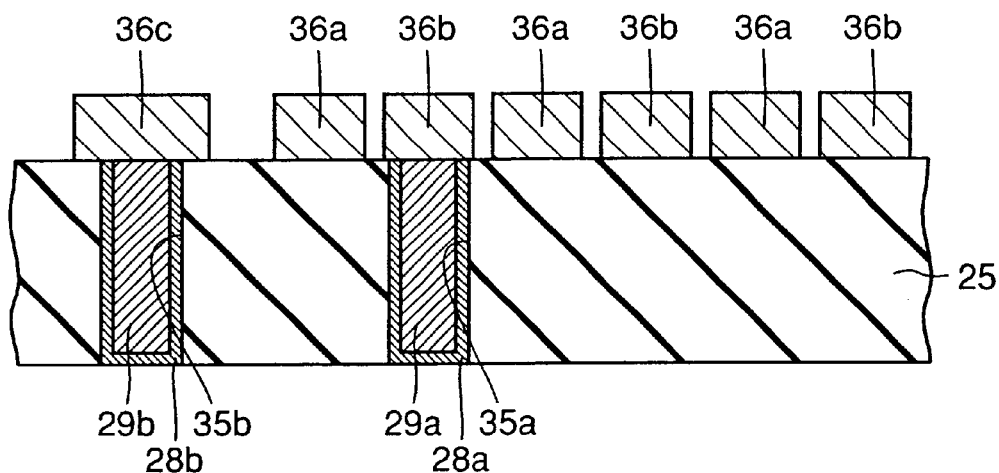

A metal film (not shown) is deposited on interlayer insulating film 25 by sputtering or the like. On the metal film, a resist film (not shown) is formed through photolithography. This resist film is used as a mask to partially remove the metal film through anisotropic etching. The resist film is then removed. In this way, as shown in FIG. 65, one electrode 36a, the other electrode 36b and interconnection 36c formed of a metal film are formed to constitute a capacitor in the lateral direction. The other electrode 36b is located to contact metal film 29a formed in contact hole 35a.

Figure 66:
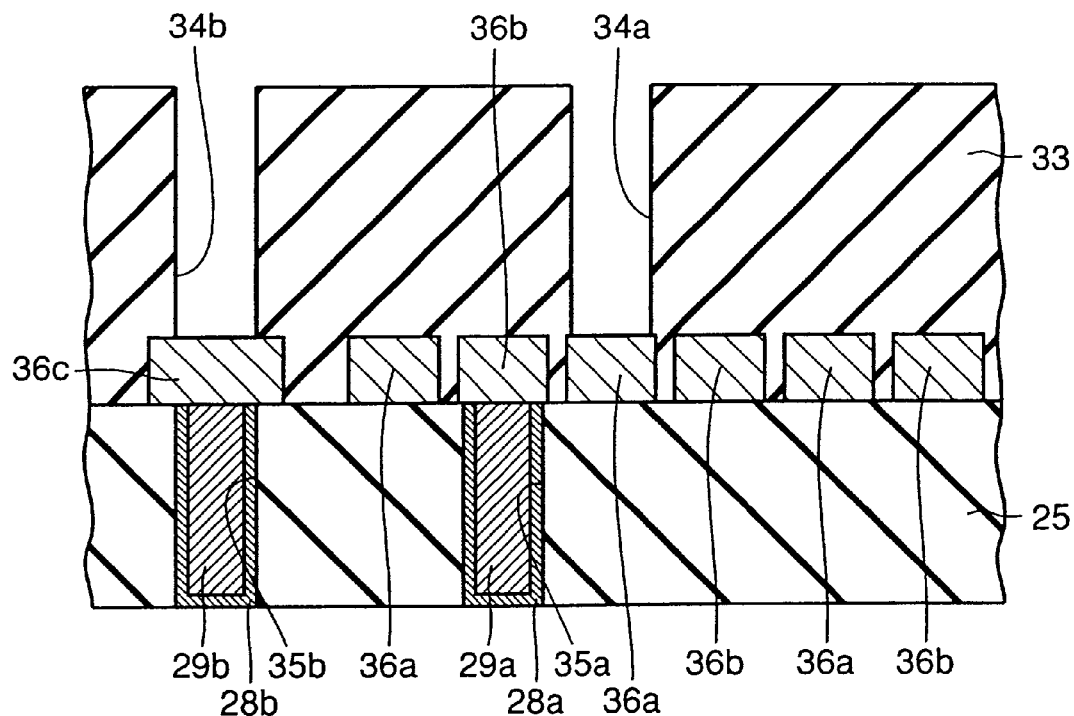

Interlayer insulating film 33 (see FIG. 66) is formed on one electrode 36a, the other electrode 36b and interconnection 36c. CVD or the like may be used for generating interlayer insulating film 33. A resist film (not shown) is formed on interlayer insulating film 33 by photolithography. The resist film is used as a mask to partially remove interlayer insulating film 33 by anisotropic etching thereby form contact holes 34a and 34b (see FIG. 66). The resist film is then removed. The structure as shown in FIG. 66 is thus achieved.

Contact hole 34a has its bottom where the upper surface of one electrode 36a is partially exposed. Further, contact hole 34b has its bottom where the upper surface of interconnection 36c is exposed.

Figure 67:
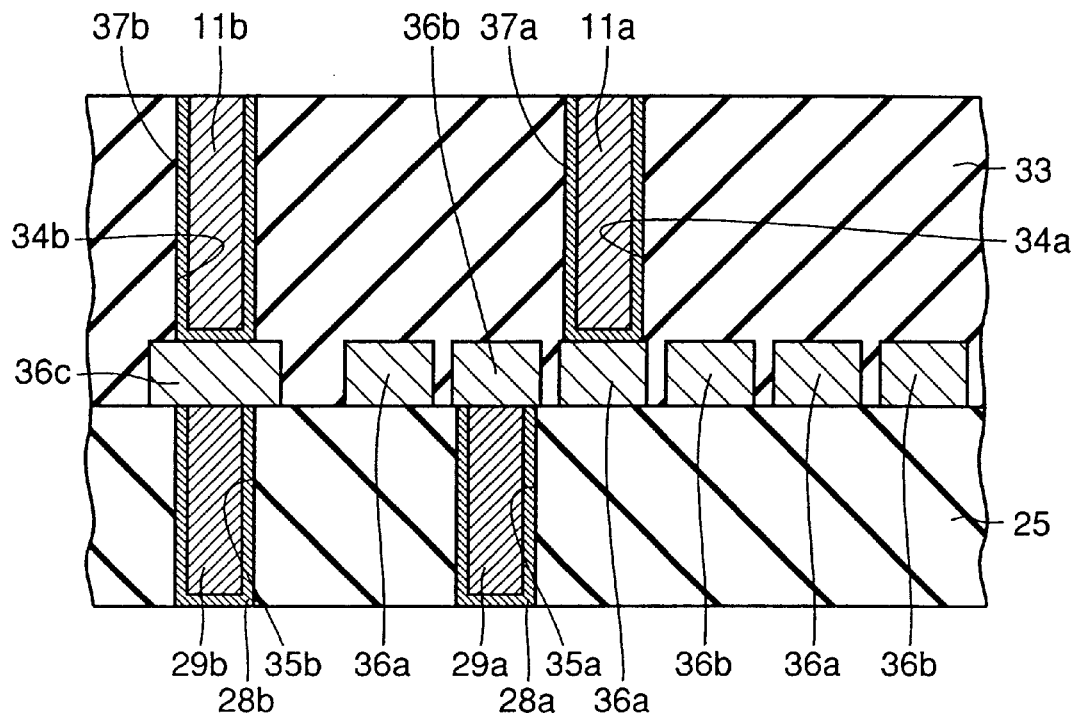

By a method similar to that employed for producing barrier metal film 28b and metal films 29a and 29b, barrier metal films 37a, 37b and tungsten plugs 11a and 11b are formed in contact holes 34a and 34b. The structure as shown in FIG. 67 is thus accomplished.

Upper-level interconnections 12a and 12b (see FIG. 61) are thereafter deposited on tungsten plugs 11a and 11b to fabricate the semiconductor device as shown in FIGS. 61 and 62.

Figure 68:
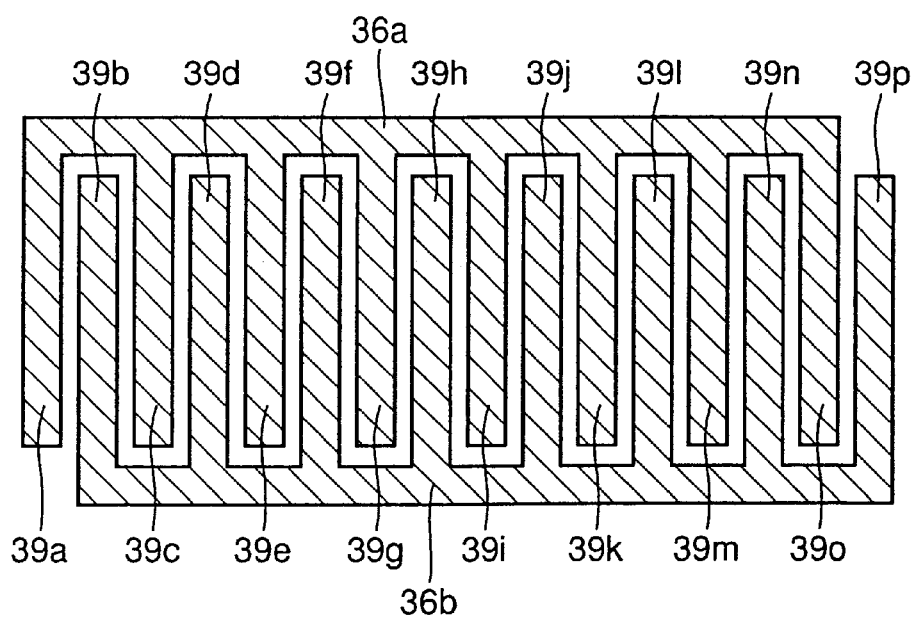
FIG. 68 is a plan view showing a modification of the eighth embodiment of the semiconductor device shown in FIGS. 61 and 62.

The capacitance of the capacitor in the lateral direction included in the capacitor portion can be changed as shown in FIG. 68 for example by changing the number of extensions 39a–39p and accordingly changing the area of the region functioning as a capacitor electrode. In this way, the capacitance of the capacitor can readily be changed. FIG. 68 is a plan view showing a modification of the eighth embodiment of the semiconductor device that corresponds to FIG. 62.

Ninth Embodiment

A ninth embodiment of a semiconductor device according to the invention is explained below in conjunction with FIG. 69.

Figure 69:
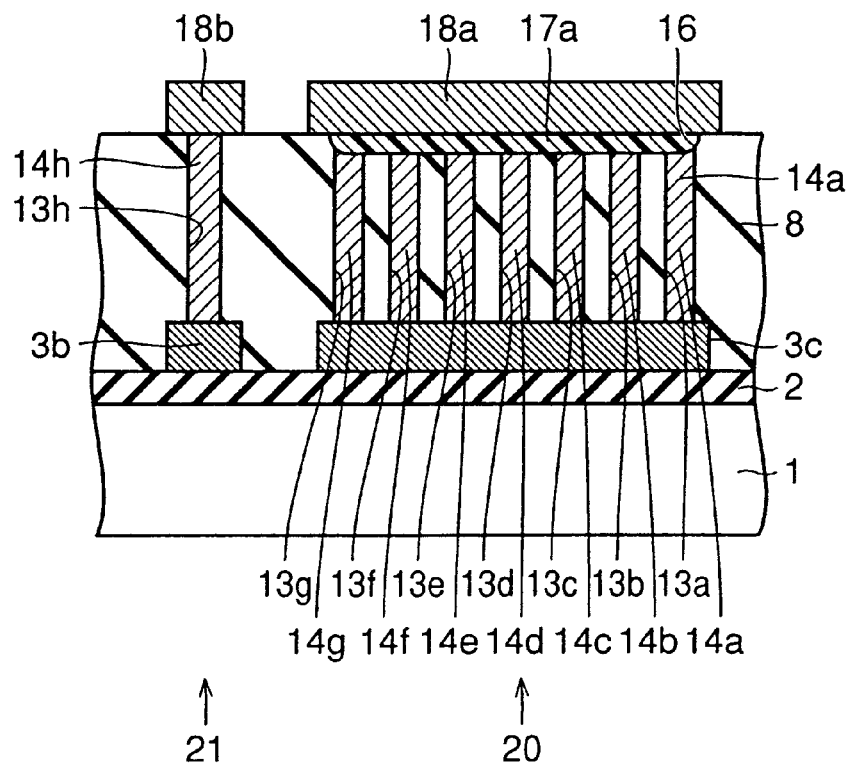
FIG. 69 is a schematic cross section showing a ninth embodiment of a semiconductor device according to the invention.

Referring to FIG. 69, the semiconductor device includes a capacitor portion 20 and an interconnection portion 21. In capacitor portion 20, an insulating film 2 is deposited on a semiconductor substrate 1. On insulating film 2, a lower-level interconnection 3c for capacitor is formed. An interlayer insulating film 8 is deposited on capacitor lower-level interconnection 3c. Contact holes 13a–13g are formed in interlayer insulating film 8 in the region located on capacitor lower-level interconnection 3c. Tungsten films 14a–14g are formed to fill the inside of contact holes 13a–13g. A depression portion 16 with its upper surface lower than the upper surface of interlayer insulating film 8 is formed in the region located on contact holes 13a–13g. In depression portion 16, a silicon oxide film 17a (hereinafter referred to as SOG film) formed by means of spin-on-glass method is deposited as a capacitor dielectric film. An upper electrode 18a formed of a metal film is formed on the SOG film 17a.

In interconnection portion 21, a first-level interconnection 3b is formed on insulating film 2. In the region on interconnection 3b, a contact hole 13h is formed in interlayer insulating film 8. A tungsten film 14h is formed to fill the inside of contact hole 13h. An upper-level interconnection 18b is deposited on tungsten film 14h. Preferably, a barrier metal film (not shown) is formed on the walls of contact holes 13a–13h.

In this way, a capacitor in the vertical direction can be produced by arranging in the vertical direction tungsten films 14a–14g serving as a capacitor lower electrode, SOG film 17a serving as a dielectric film and upper electrode 18a serving as a capacitor upper electrode. As the first embodiment of the semiconductor device according to the invention, with a certain capacitance ensured, the thickness of SOG film 17a can be made smaller than the conventional one to reduce the area of the region of tungsten films 14a–14g, opposite to SOG film 17a, that corresponds to the surface area of the capacitor lower electrode, as well as the surface area of upper electrode 18a. Accordingly, the capacitor can be reduced in size compared with the conventional capacitor.

The number of contact holes 13a–13g that are holes formed in interlayer insulating film 8 or the cross sectional area thereof can be changed to vary the area of the portion, opposing SOG film 17a, of tungsten films 14a–14g in an easy manner. It is then possible to readily change the capacitance of the capacitor.

Further, tungsten films 14a–14g serving as a capacitor lower electrode and upper electrode 18a contain a metal film. Then, compared with the semiconductor device employing semiconductor such as polysilicon as a capacitor electrode, a capacitor with a high precision and a less voltage-dependency can be achieved.

A method of manufacturing the semiconductor device shown in FIG. 69 is described in conjunction with FIGS. 70–76.

Figure 70:
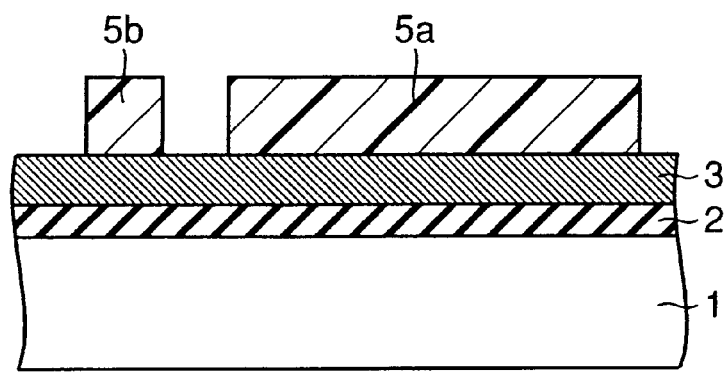
FIGS. 70–76 are schematic cross sections respectively illustrating first to seventh steps of manufacturing the semiconductor device shown in FIG. 69.

Referring to FIG. 70, insulating film 2 is deposited on semiconductor substrate 1. Metal film 3 is formed on insulating film 2. An aluminum alloy film can be used that is formed by means of sputtering as this metal film 3. Metal film 3 has a thickness of approximately 0.4 µm. The material and thickness of metal film 3 can arbitrarily be changed. Further, tungsten may be employed as a material for metal film 3.

Resist films 5a and 5b are formed on metal film 3 by photolithography.

Figure 71:
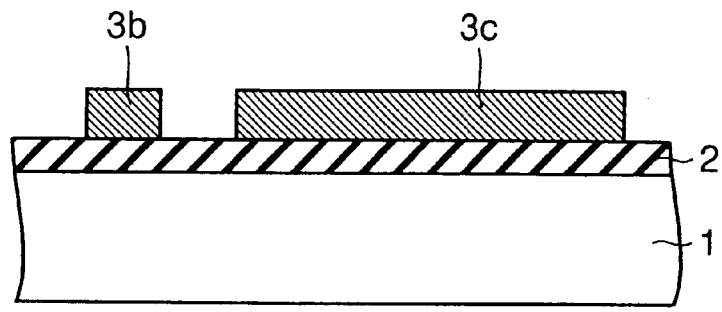

Resist films 5a and 5b are used as a mask to partially remove metal film 3 by anisotropic etching. Resist films 5a and 5b are thereafter removed. In this way, lower-level interconnection 3c and first-level interconnection 3b for the capacitor are formed as shown in FIG. 71.

Figure 72:
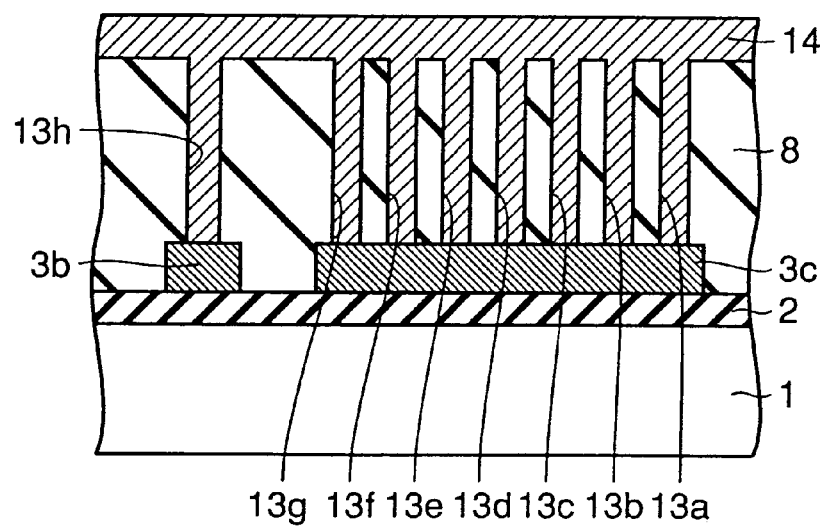

On capacitor lower-level interconnection 3c and first-level interconnection 3b, interlayer insulating film 8 (see FIG. 72) is deposited. The upper surface of interlayer insulating film 8 is planarized by means of CMP or the like. Photolithography is used for generating a resist film (not shown) on interlayer insulating film 8. The resist film is used as a mask to partially remove interlayer insulating film 8 by anisotropic etching thereby produce contact holes 13a–13h (see FIG. 72). Tungsten film 14 (see FIG. 72) is formed by means of sputtering or CVD that extends from the inside of contact holes 13a–13h onto the upper surface of interlayer insulating film 8. The structure as shown in FIG. 72 is thus obtained. Tungsten film 14 has its thickness of approximately 400 nm. The thickness of tungsten film 14 may arbitrarily be changed.

The number of contact holes 13a–13g to be formed as well as the cross sectional area thereof can be varied to easily change the area of the portion of tungsten films 14a–14g (see FIG. 69) that faces the SOG film 17a (see FIG. 69) serving as a dielectric film. In this way, the capacitance of the capacitor can readily be changed.

Figure 73:
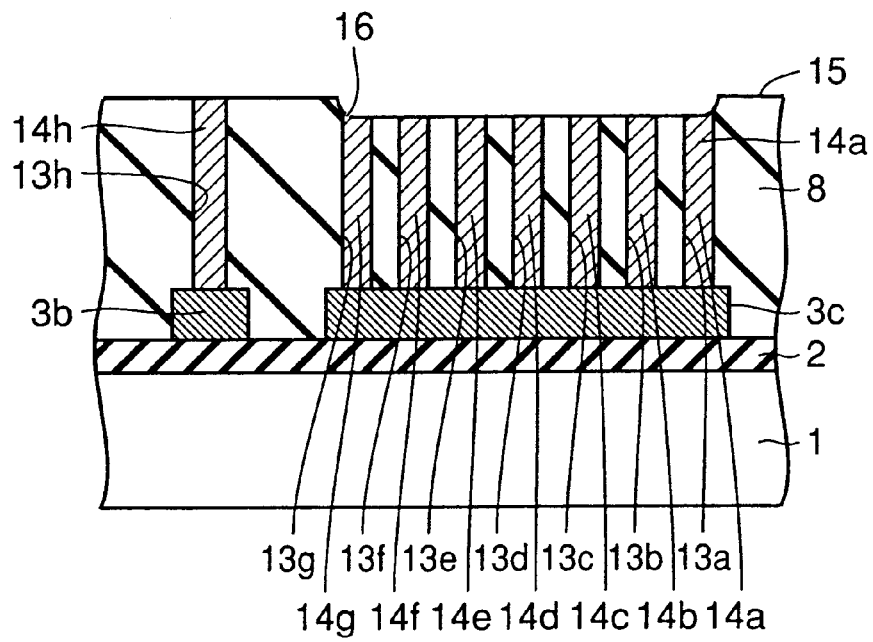

By CMP, tungsten film 14 located on the upper surface of interlayer insulating film 8 is removed. Erosion occurs in the process of CMP in the region where contact holes 13a–13g are formed close to each other. As a result, depression portion 16 is formed in the upper surface of interlayer insulating film 8. Here, the process conditions of the CMP are adjusted to define the depth from the upper surface 15 of interlayer insulating film 8 to the bottom surface of depression portion 16 as 50 nm. It is noted that the process conditions of CMP can be changed to arbitrarily change the depth of depression portion 16. Then, the structure as shown in FIG. 73 is produced.

Figure 74:
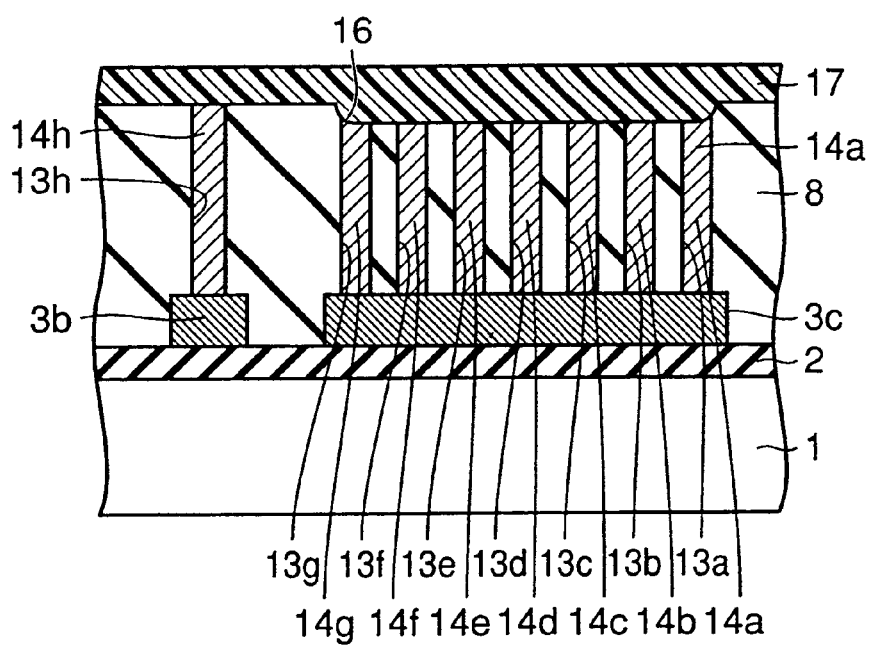

Referring to FIG. 74, an SOG is applied and thereafter a predetermined annealing process is applied to form SOG film 17 that constitutes the capacitor dielectric film. The thickness of the applied SOG is 0.5 µm. The thickness of the applied SOG film 17 may arbitrarily be changed. Here, the SOG film is employed as a capacitor dielectric film. However, another dielectric material may be used that can fill depression portion 16.

Figure 75:
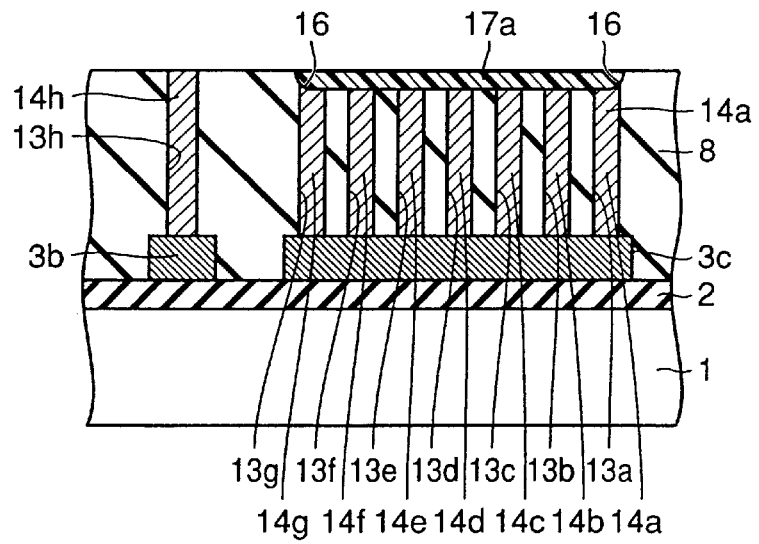

Referring to FIG. 75, SOG film 17 (see FIG. 74) is removed from the region except for depression portion 16 by means of CMP or the like. Then, SOG film 17a remains in depression portion 16 that serves as the capacitor dielectric film.

Figure 76:
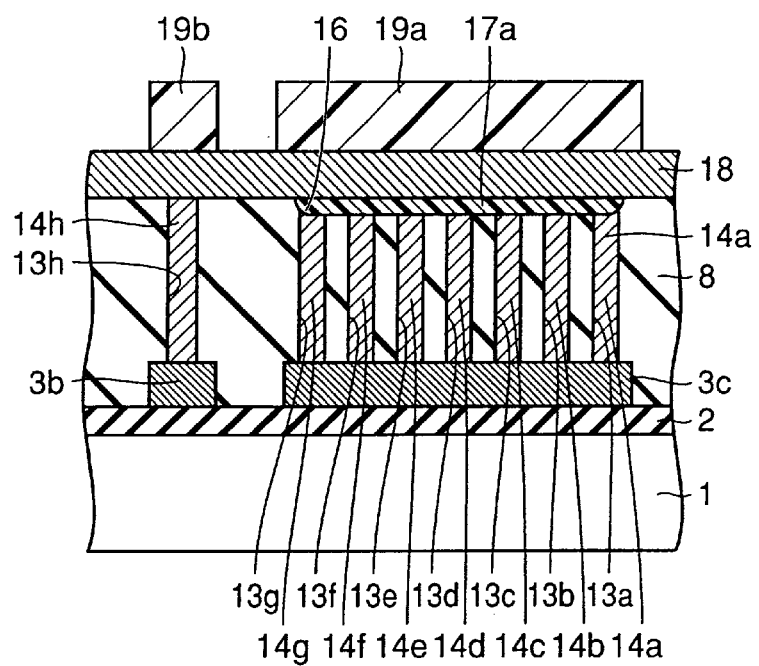

Referring to FIG. 76, metal film 18 is formed on SOG film 17a. As metal film 18, an aluminum alloy film may be employed that is formed by sputtering. Metal film 18 has a thickness of 0.4 µm. The material and thickness of metal film 18 can arbitrarily be changed. Resist films 19a and 19b are formed on metal film 18 by photolithography.

Resist films 19a and 19b are used as a mask to partially remove metal film 18 by anisotropic etching. Resist films 19a and 19b are thereafter removed. Upper electrode 18a and upper-level interconnection 18b (see FIG. 69) are accordingly formed. The semiconductor device shown in FIG. 69 can thus be produced.

Tenth Embodiment

Figure 77:
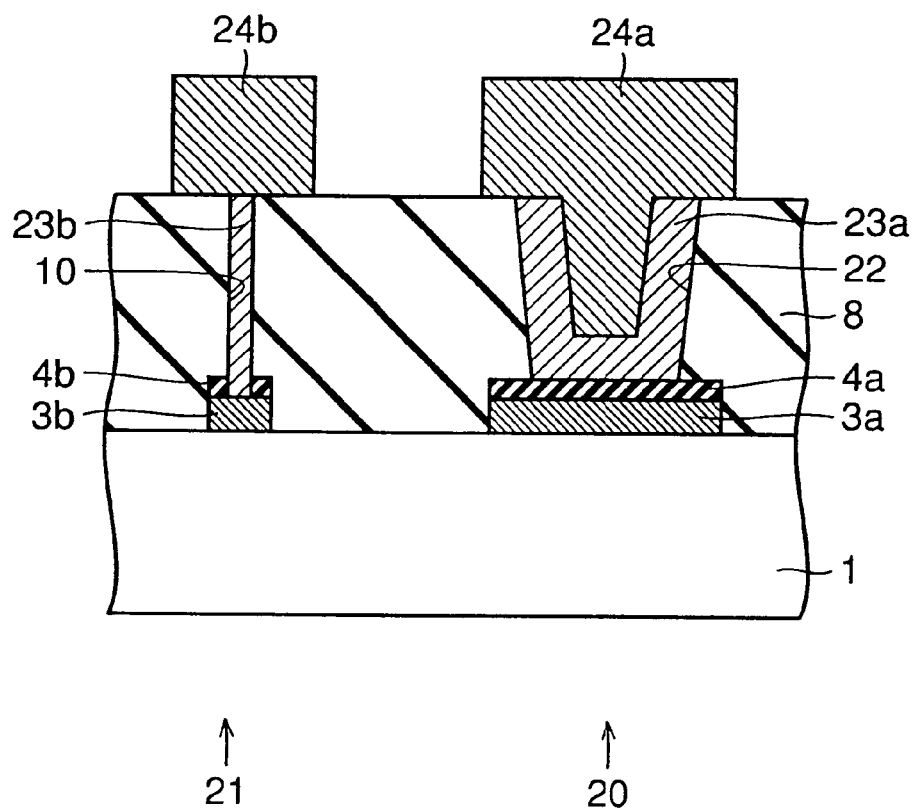
FIG. 77 is a schematic cross section showing a tenth embodiment of a semiconductor device according to the invention.

A tenth embodiment of a semiconductor device according to the invention is discussed in conjunction with FIG. 77.

Referring to FIG. 77, the semiconductor device has its structure basically identical to that of the semiconductor device shown in FIG. 27. A difference therebetween is that the semiconductor device shown in FIG. 77 has a capacitor portion 20 including a contact hole 22 for an upper electrode so as to expose the upper surface of a capacitor dielectric film 4a. A tungsten film 23a is formed inside contact hole 22 for upper electrode. On tungsten film 23a, an upper-level interconnection 24a is formed filling the inside of contact hole 22 for the upper electrode and extending onto the upper surface of interlayer insulating film 8 to serve as an upper electrode of the capacitor.

In interconnection portion 21, a contact hole 10 is formed in interlayer insulating film 8 in the region located on a first-level interconnection 3b. A tungsten film 23b fills the inside of contact hole 10. An upper-level interconnection 24b is formed on tungsten film 23b.

In this way, a capacitor in the vertical direction can be produced as done in the first embodiment of the invention by depositing in the vertical direction lower electrode 3a as a capacitor lower electrode, capacitor dielectric film 4a, tungsten film 23a as a capacitor upper electrode and upper-layer interconnection 24a. Accordingly, with a certain capacitance secured, the area of tungsten film 23a that is opposite to capacitor dielectric film 4a as well as the surface area of lower electrode 3a can be reduced by reducing the thickness of capacitor dielectric film 4a to be smaller than the conventional one. As a result, the capacitor can be reduced in size compared with the conventional capacitor.

Further, tungsten film 23a as a capacitor upper electrode and upper-level interconnection 24a are arranged within upper electrode contact hole 22 serving as an opening portion. Therefore, no process is necessary for forming a contact hole, after forming the capacitor upper electrode, in order to connect the upper electrode and the upper-level interconnection, the process having been required conventionally in the manufacturing process. In this way, the process of manufacturing the semiconductor device can be simplified.

Further, as lower electrode 3a, tungsten film 23a and upper-level interconnection 24a are formed of respective metal films, a capacitor with a higher precision and a less voltage-dependency can be achieved compared with the semiconductor device employing semiconductor such as polysilicon as a capacitor electrode.

A method of manufacturing the semiconductor device is described in conjunction with FIGS. 78–86.

Figure 78:
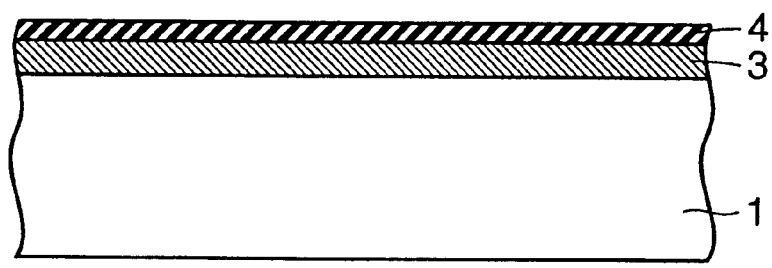
FIGS. 78–86 are schematic cross sections respectively illustrating first to ninth steps of manufacturing the semiconductor device shown in FIG. 77.

Referring to FIG. 78, an insulating film (not shown) is formed on semiconductor substrate 1. Lower-level metal film 3 is formed on the insulating film. Dielectric film 4 is deposited on lower-level metal film 3.

Figure 79:
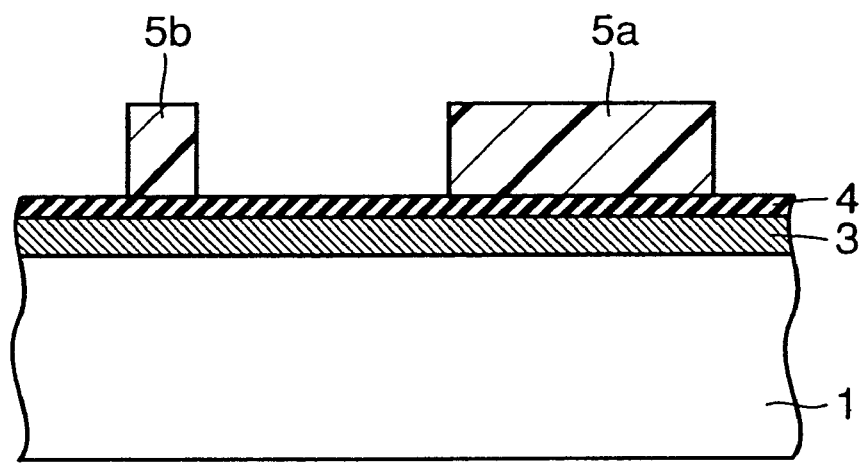

Referring to FIG. 79, resist films 5a and 5b are formed by photolithography on dielectric film 4. As dielectric film 4, a material serving as ARC (Anti Reflection Coat), for example, a silicon oxynitride film can be employed to make it unnecessary to separately form ARC from dielectric film 4 under resist films 5a and 5b.

Figure 80:
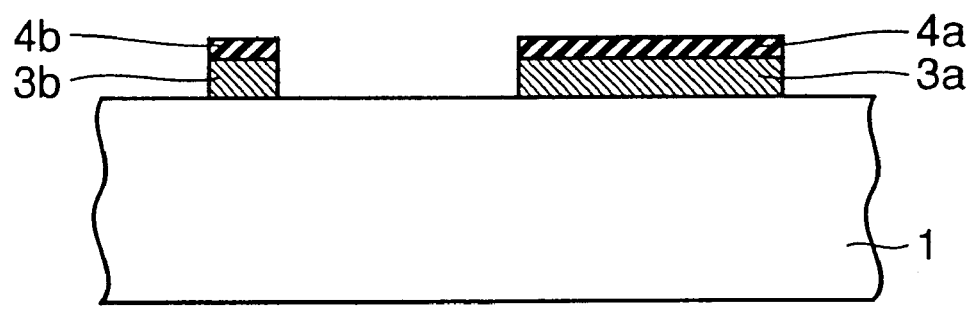

Resist films 5a and 5b are used as a mask to partially remove dielectric film 4 and lower-level metal film 3 by anisotropic etching. Resist films 5a and 5b are then removed. As shown in FIG. 80, lower electrode 3a, capacitor dielectric film 4a, the first-level interconnection 3b and dielectric film 4b are accordingly generated.

Figure 81:
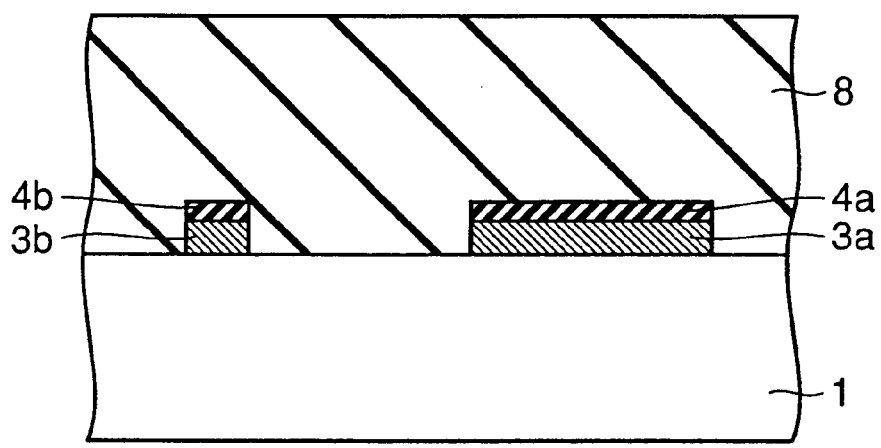

Referring to FIG. 81, interlayer insulating film 8 is deposited on capacitor dielectric film 4a and dielectric film 4b.

Figure 82:
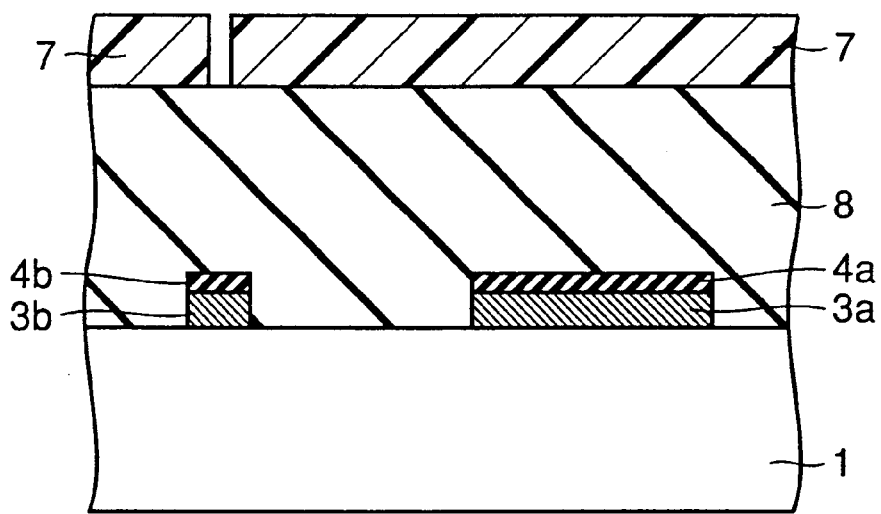

Referring to FIG. 82, a resist film 7 is formed on interlayer insulating film 8 by photolithography.

Figure 83:
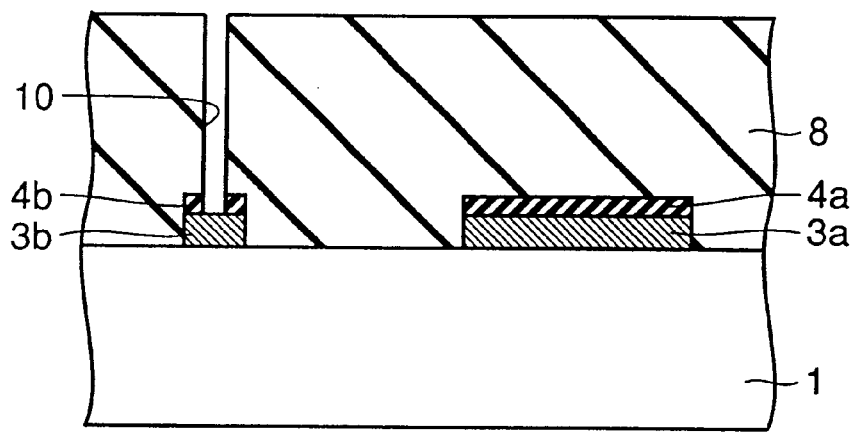

Resist film 7 is used as a mask to partially remove interlayer insulating film 8 and dielectric film 4b by anisotropic etching thereby produce contact hole 10 (see FIG. 83). Resist film 7 is thereafter removed. Accordingly, the structure as shown in FIG. 83 is produced.

Figure 84:
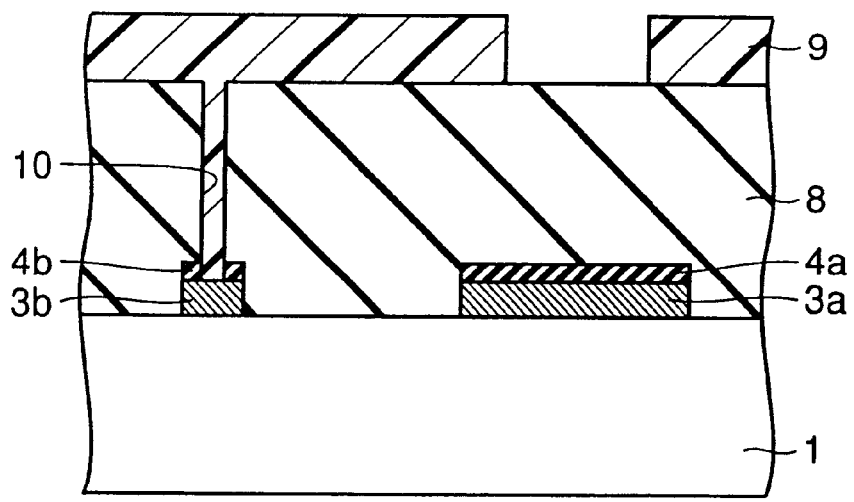

Referring to FIG. 84, a resist film 9 is formed on interlayer insulating film 8 by photolithography.

Figure 85:
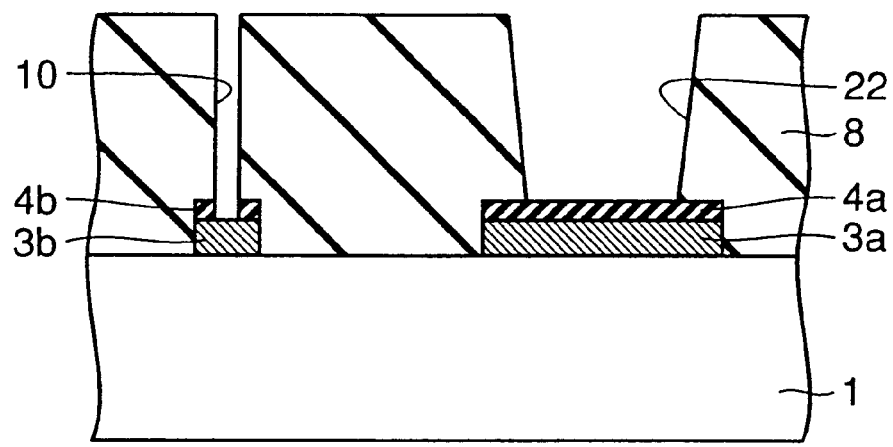

Resist film 9 is used as a mask to partially remove interlayer insulating film 8 by anisotropic etching thereby form contact hole 22 (see FIG. 85) for the upper electrode. Resist film 9 is thereafter removed. The structure as shown in FIG. 85 is then obtained.

Figure 86:
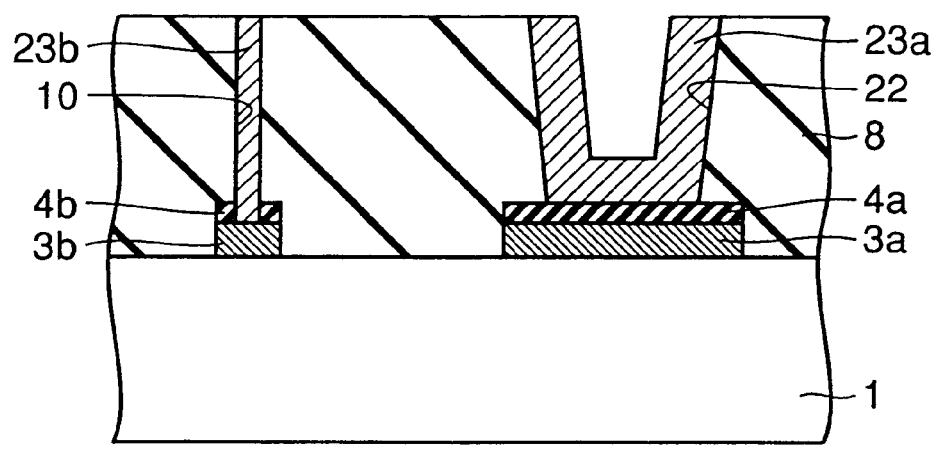

A tungsten film is formed that extends from the inside of upper electrode contact hole 22 and contact hole 10 onto the upper surface of interlayer insulating film 8. The tungsten film located on the upper surface of interlayer insulating film 8 is removed by means of CMP or the like thereby implement the structure as shown in FIG. 86.

A metal film is formed on tungsten films 23a and 23b. A resist film is formed on the metal film by photolithography. The resist film is used as a mask to partially remove the metal film by anisotropic etching. The resist film is then removed. In this way, upper-level interconnections 24a and 24b (see FIG. 27) are formed. The semiconductor device shown in FIG. 77 is produced accordingly.

Tungsten film 23a serving as the capacitor upper electrode is provided in upper electrode contact hole 22. Upper electrode contact hole 22 also functions as a connection hole with upper-level interconnection 24a. The step of forming a contact hole for connecting the capacitor upper electrode and the upper-level interconnection, which has been required as the step following the step of forming the capacitor upper electrode, is unnecessary.

Eleventh Embodiment

An eleventh embodiment of a semiconductor device has its structure basically identical to that of the semiconductor device shown in FIG. 77.

Figure 87:
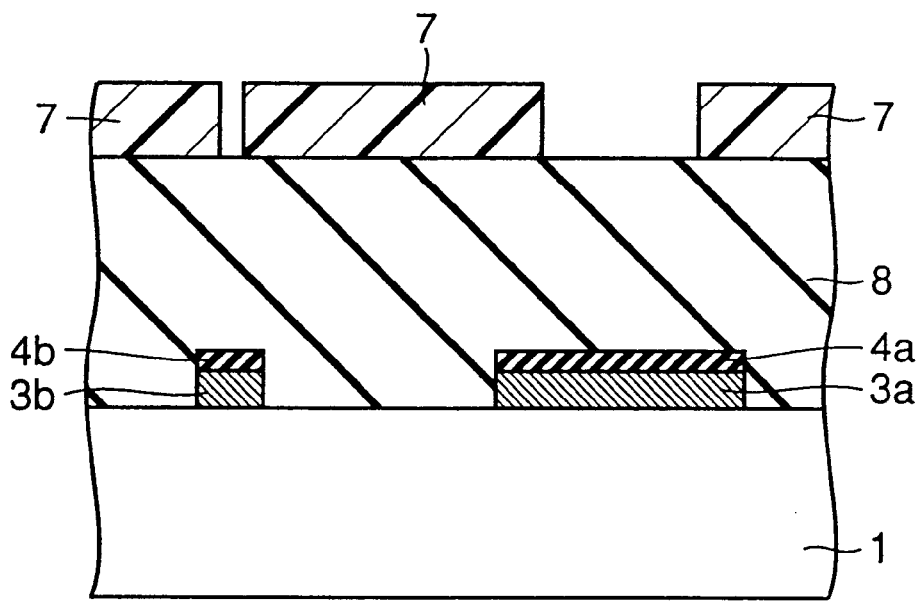
FIGS. 87 and 88 are schematic cross sections respectively illustrating first and second steps of manufacturing a semiconductor device according to an eleventh embodiment of the invention.
Figure 88:
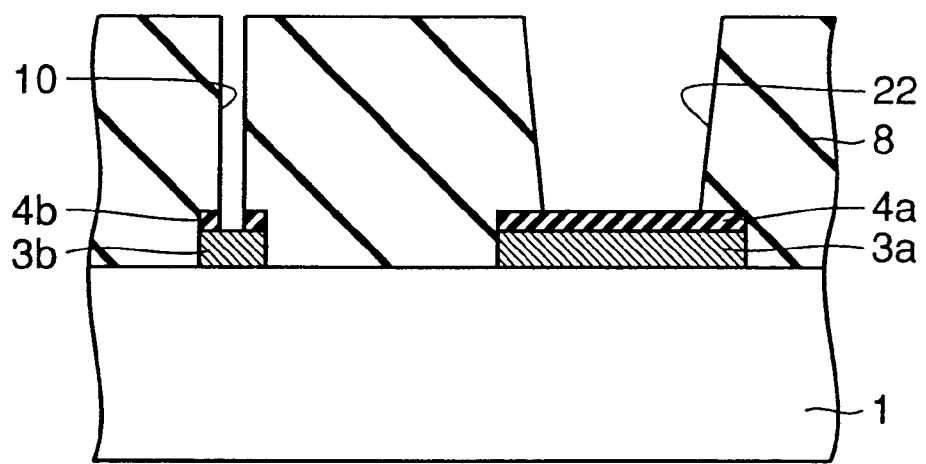

A method of manufacturing the semiconductor device is described in conjunction with FIGS. 87 and 88.

The process steps illustrated in FIGS. 78–81 are performed. After this, as shown in FIG. 87, a resist film 7 is formed on an interlayer insulating film 8 by means of photolithography. A hole pattern is formed in resist film 7 for generating a contact hole 10 and a contact hole 22 for the upper electrode.

Resist film 7 is used as a mask to partially remove interlayer insulating film 8 and a dielectric film 4b by anisotropic etching to produce contact hole 22 (see FIG. 88) for the upper electrode and contact hole 10 (see FIG. 88). At this time, etching conditions are adjusted to allow dielectric film 4b to be etched in the hole having a shorter diameter like contact hole 10 and not to allow dielectric film 4a to be etched in a hole with a relatively large diameter like upper electrode contact hole 22.

For example, it is supposed here that the shape of contact hole 10 in plan view is a circle having a diameter of 0.2 μm and the shape of upper electrode contact hole 22 in plan view is a square of 2 μm×2 μm. In this case, conditions employed are that a two-frequency parallel plate RIE (Reaction Ion Etching) apparatus is used, the pressure within a reaction chamber is 4 Pa, RF power (top/bottom) is 1400 W/1400W, carbon tetrafluoride gas ($CF_4$), trifluromethane gas ($CHF_3$), oxygen gas ($O_2$), and argon gas (Ar) are used as reaction gas, the flow rate of $CF_4$ is 0.01 liter/min (10 sccm), the flow rate of $CHF_3$ is 0.03 liter/min (30 sccm), the flow rate of $O_2$ is 0.009 liter/min (9 sccm) and the flow rate of Ar is 0.4 liter/min (400 sccm). Under these conditions, etching can be performed such that capacitor dielectric film 4a is not etched in contact hole 22 for upper electrode while dielectric film 4b is etched in contact hole 10 as discussed above.

Accordingly, upper electrode contact hole 22 and contact hole 10 can simultaneously be produced and consequently the manufacturing process can be simplified compared with the manufacturing method of the tenth embodiment of the invention.

Resist film 7 is thereafter removed. The structure as shown in FIG. 88 is achieved.

A step similar to that shown in FIG. 86 is performed to produce the semiconductor device shown in FIG. 77 similar to that of the tenth embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a capacitor lower electrode having an upper surface and formed from a metal film layer;
    a dielectric film deposited on the upper surface of said capacitor lower electrode and having its thickness smaller than that of said capacitor lower electrode;
    a capacitor upper electrode deposited on said dielectric film, having its width smaller than that of said capacitor lower electrode and including a metal film, wherein said capacitor upper electrode has a sidewall;

a sidewall insulating film formed on the upper surface of said capacitor lower electrode and on the sidewall of said capacitor upper electrode; and an interconnection layer formed from the same metal film layer as the capacitor lower electrode.

2. The semiconductor device according to claim 1, wherein said sidewall insulating film includes a silicon oxynitride film.

3. The semiconductor device according to claim 1, wherein said capacitor lower electrode includes aluminum, and said capacitor upper electrode includes tungsten.

4. The semiconductor device according to claim 1, wherein said interconnection layer is a lower interconnection portion constituted of a layer at the same level as that of said capacitor lower electrode and further comprising:

another dielectric film deposited on said lower interconnection portion;

an upper interconnection portion deposited on said another dielectric film, having its width smaller than that of said lower interconnection portion, and constituted of a layer at the same level as that of said capacitor upper electrode;

an interlayer insulating film formed on said upper interconnection portion, a connection hole being formed in said interlayer insulating film to expose lower surface of said upper interconnection portion and reach an upper surface of said lower interconnection portion; and a conductive film provided inside and connection hole to electrically connect said upper interconnection and said lower interconnection portion.

* * * * *